(12) United States Patent
Okuno et al.

(10) Patent No.: US 7,355,883 B2
(45) Date of Patent: Apr. 8, 2008

(54) MAGNETORESISTANCE EFFECT ELEMENT, ITS MANUFACTURING METHOD, MAGNETIC REPRODUCING ELEMENT AND MAGNETIC MEMORY

(75) Inventors: Shiho Okuno, Kanagawa-ken (JP); Yuichi Ohsawa, Kanagawa-ken (JP); Shigeru Haneda, Kanagawa-ken (JP); Yuzo Kamiguchi, Kanagawa-ken (JP); Tatsuya Kishi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 518 days.

(21) Appl. No.: 11/006,594

(22) Filed: Dec. 8, 2004

(65) Prior Publication Data
US 2005/0094327 A1    May 5, 2005

Related U.S. Application Data

(62) Division of application No. 10/244,550, filed on Sep. 17, 2002, now Pat. No. 6,937,447.

(30) Foreign Application Priority Data
Sep. 19, 2001    (JP)   ............... 2001-284467

(51) Int. Cl.
     *G11C 11/00*      (2006.01)
(52) U.S. Cl. .................. 365/158; 365/55; 365/66; 365/130; 365/171; 365/173; 365/225.5
(58) Field of Classification Search ................ 365/158, 365/55, 66, 130, 171, 173, 225.5
See application file for complete search history.

(56) References Cited

U.S. PATENT DOCUMENTS 5,936,402 A * 8/1999 Schep et al. ................ 324/252

| | | | |
|---|---|---|---|
| 6,469,926 B1 | 10/2002 | Chen | |
| 6,473,275 B1 | 10/2002 | Gill | |
| 6,538,921 B2 * | 3/2003 | Daughton et al. | 365/171 |
| 6,937,447 B2 * | 8/2005 | Okuno et al. | 360/324.1 |
| 7,116,575 B1 * | 10/2006 | Katti | 365/158 |
| 2001/0009063 A1 | 7/2001 | Saito et al. | |

(Continued)

FOREIGN PATENT DOCUMENTS

JP      2000-293982      10/2000

(Continued)

OTHER PUBLICATIONS

N. Garcia, et al., "Magnetoresistance in Excess of 200% in Ballistic Ni Nanocontacts at Room Temperature and 100 Oe," Physical Review Letters, vol. 82, No. 14, Apr. 5, 1999, pp. 2923-2926.

(Continued)

*Primary Examiner*—Viet Q. Nguyen
(74) *Attorney, Agent, or Firm*—Oblon, Spivak, McClelland, Maier & Neustadt, P.C.

(57) ABSTRACT

A magnetoresistance effect element includes a first ferromagnetic layer (1), insulating layer (3) overlying the first ferromagnetic layer, and second ferromagnetic layer (2) overlying the insulating layer. The insulating layer has formed a through hole (A) having an opening width not larger than 20 nm, and the first and second ferromagnetic layers are connected to each other via the through hole.

12 Claims, 49 Drawing Sheets

U.S. PATENT DOCUMENTS

| | | |
|---|---|---|
| 2002/0051380 A1 | 5/2002 | Kamiguchi et al. |
| 2002/0054461 A1 | 5/2002 | Fujiwara et al. |
| 2002/0135935 A1* | 9/2002 | Covington .................. 360/126 |

FOREIGN PATENT DOCUMENTS

| | | |
|---|---|---|
| JP | 2001-143227 A | 5/2001 |
| WO | WO 97-47982 | 12/1997 |

OTHER PUBLICATIONS

J.J. Versluijs, et al., "Magnetoresistance of Half-Metallic Oxide Nanocontacts," Physical Review Letters, vol. 87, No. 2, Jul. 9, 2001, pp. 026601-1 through 026601-4.

* cited by examiner

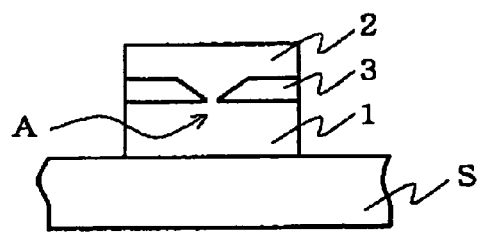
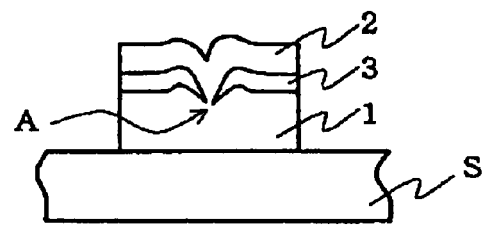
FIG.1A          FIG.1B
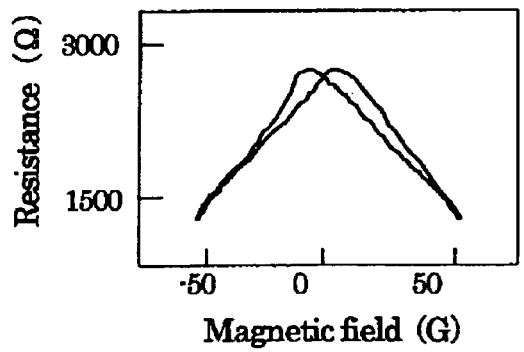
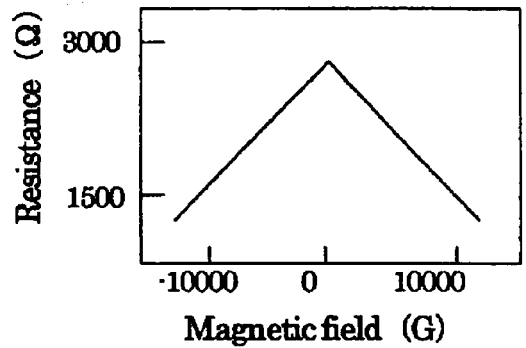
FIG.2A          FIG.2B
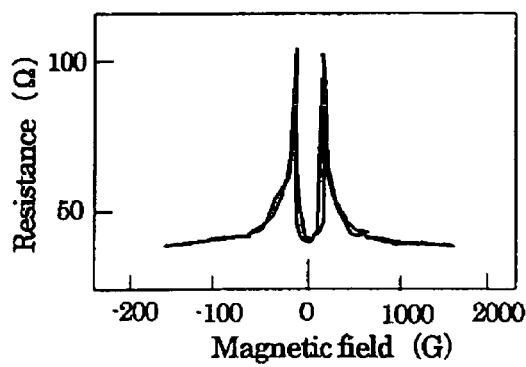
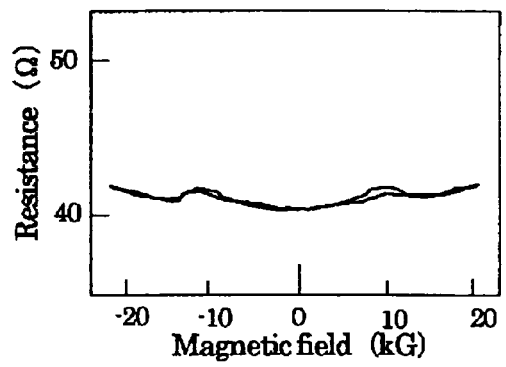
FIG.2C          FIG.2D

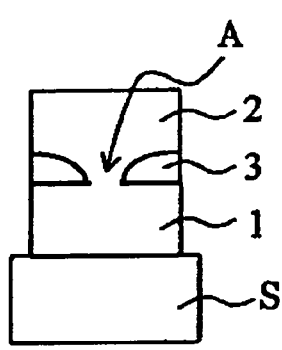 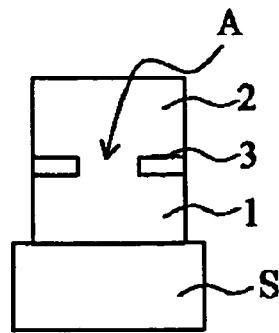 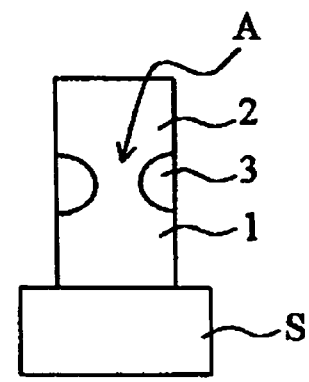
FIG.6A  FIG.6B  FIG.6C
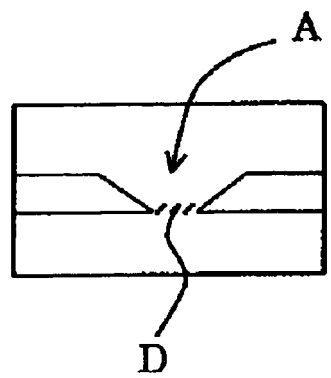 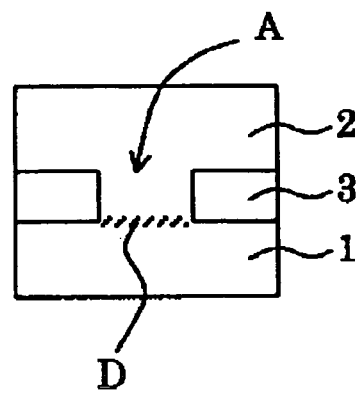
FIG.7A  FIG.7B

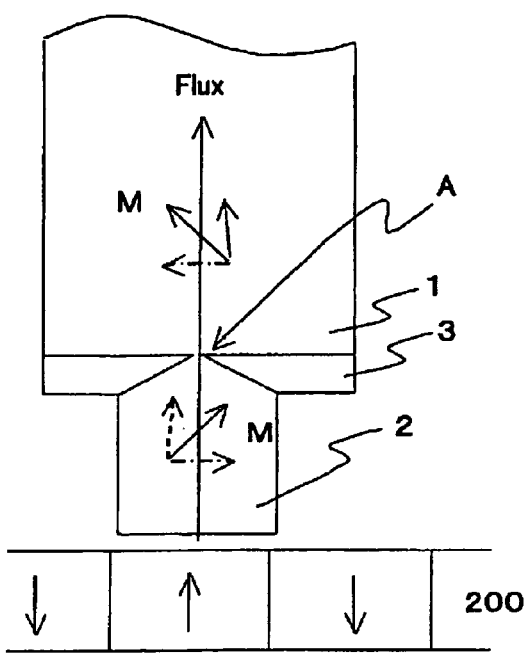
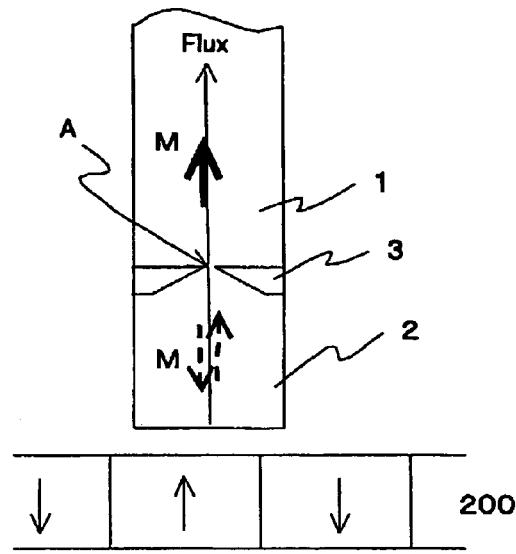
FIG.10A    FIG.10B
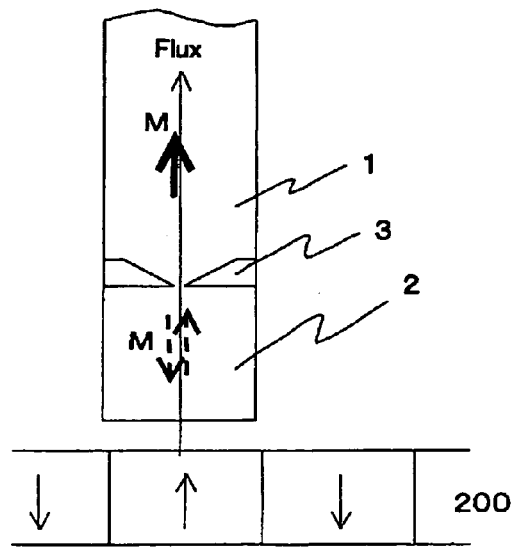
FIG.10C

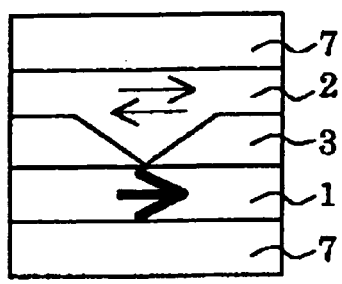 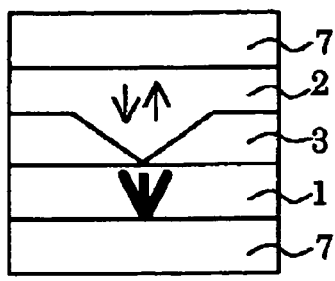 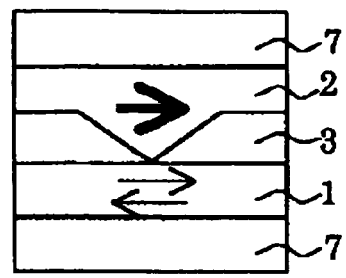
FIG.16A    FIG.16B    FIG.16C
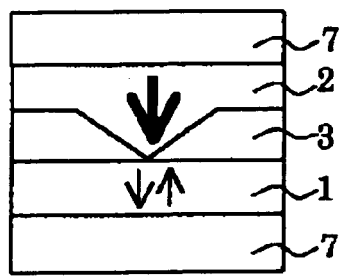 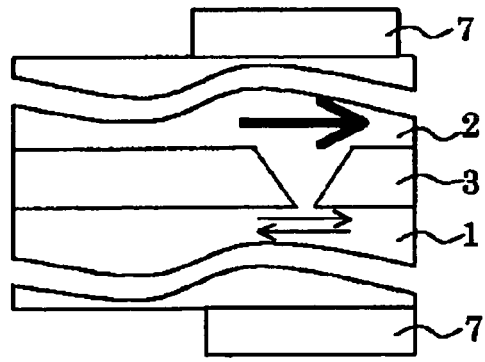
FIG.16D    FIG.16E FIG.17A
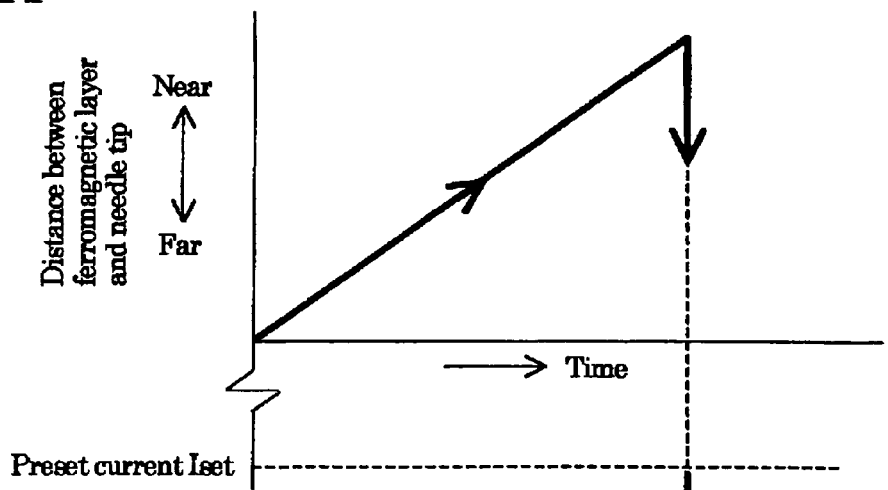
FIG.17B
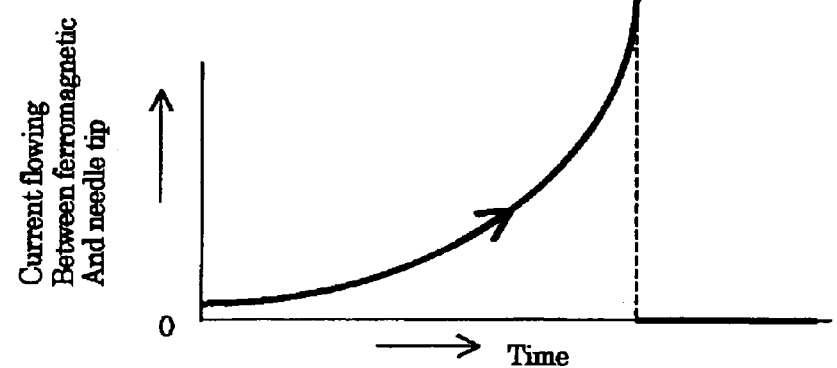
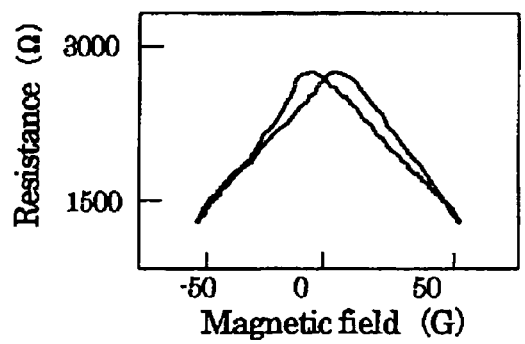
FIG.18

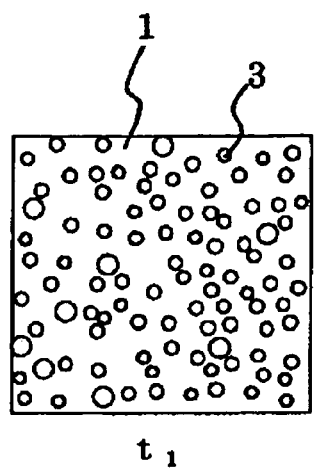 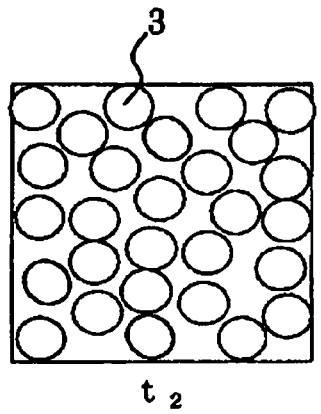 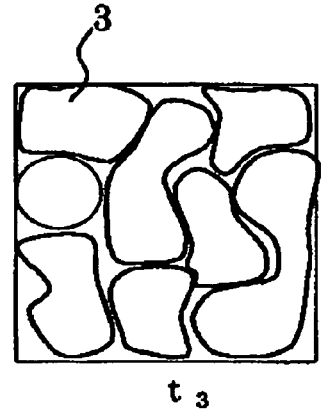
FIG.25A   FIG.25B   FIG.25C
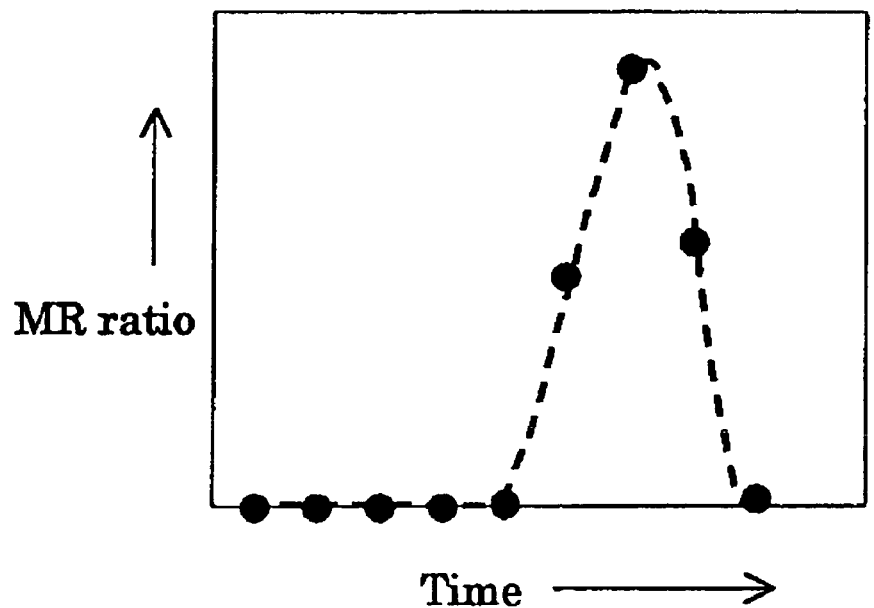
FIG.26

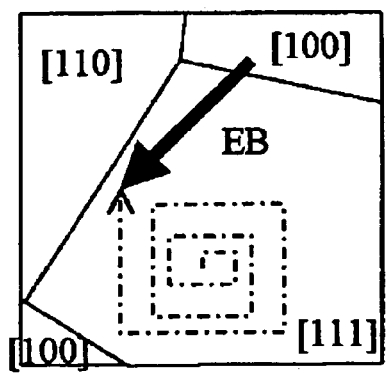
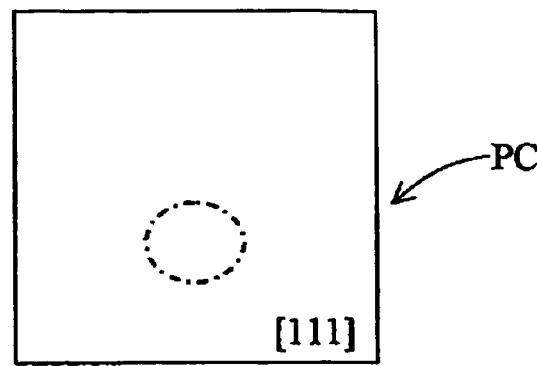
FIG.43A  FIG.43B
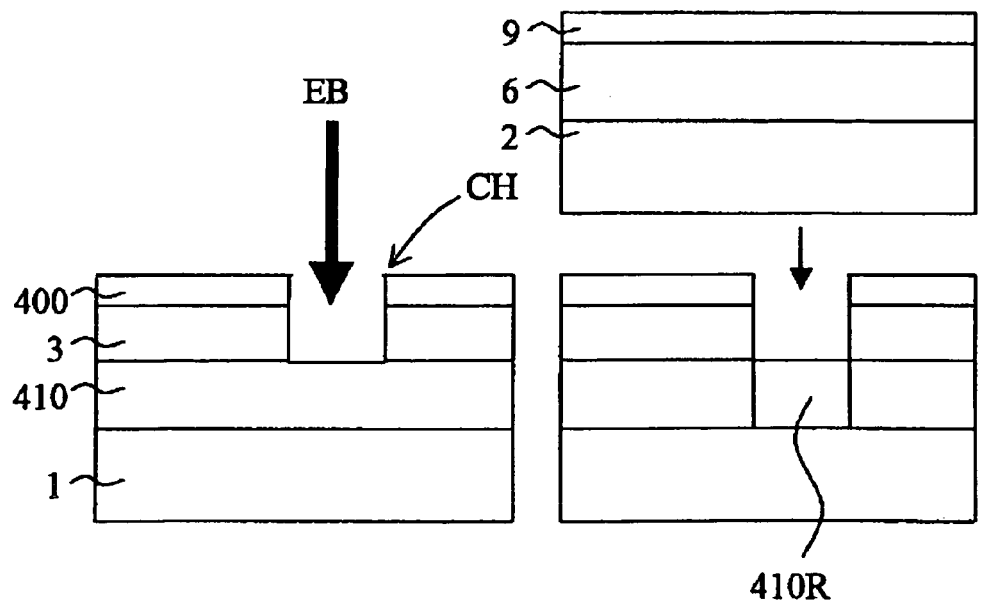
FIG.44A  FIG.44B

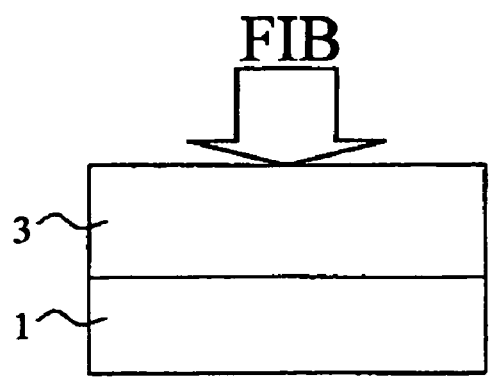
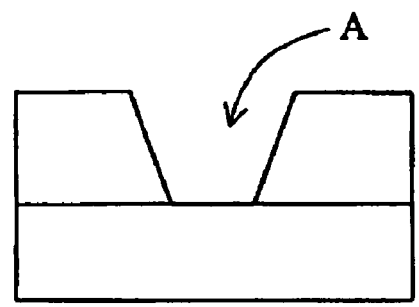
FIG.47A          FIG.47B
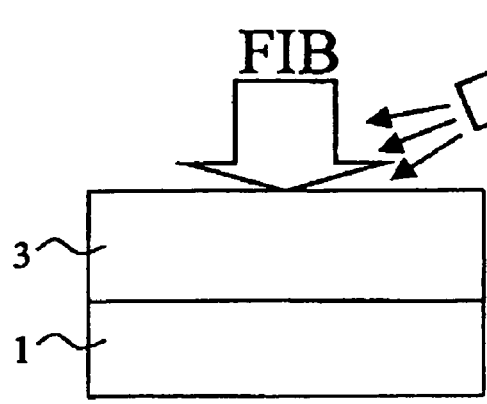
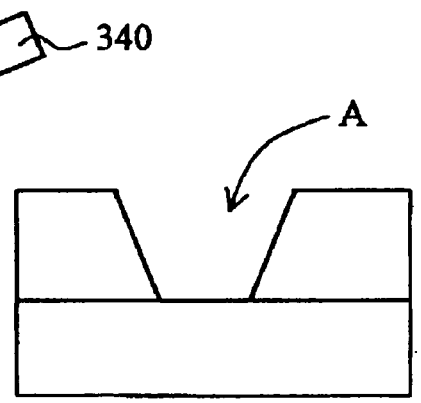
FIG.48A          FIG.48B

MAGNETORESISTANCE EFFECT ELEMENT, ITS MANUFACTURING METHOD, MAGNETIC REPRODUCING ELEMENT AND MAGNETIC MEMORY

CROSS-REFERENCE TO RELATED APPLICATIONS

This application is a Divisional of application Ser. No. 10/244,550 filed on Sep. 17, 2002, now U.S. Pat. No. 6,937,447.

This application is based upon and claims the benefit of priority from the prior Japanese Patent Application No. 2001-284467, filed on Sep. 19, 2001; the entire contents of which are incorporated herein by reference.

BACKGROUND OF THE INVENTION

This invention relates to a magnetoresistance effect (MR) element, its manufacturing method, and its use as a magnetic recording element or a magnetic memory. More particularly, the invention relates to a magnetoresistance effect element having magnetic nanocontacts that exhibit high magnetoresistance ratios, its manufacturing method, and its use as a magnetic reproducing element or a magnetic memory.

Since the discovery that a giant magnetoresistance effect occurs when a current is supplied to flow in parallel with the major plane of a multi-layered structure, efforts have been made to find systems having still larger magnetoresistance ratios. Thus, ferromagnetic tunnel junction elements and CPP (current perpendicular to plane) type MR elements in which electric current flows vertically in a multi-layered structure have been developed and suggested for use as magnetic sensors and reproducing elements for magnetic recording.

In the technical field of magnetic recording, enhancement of the recording density inevitably requires miniaturization of the recording bit, and this makes it more and more difficult to ensure sufficient signal intensity. Accordingly, materials exhibiting an even more sensitive magnetoresistance effect are in demanded, and the importance of systems having large magnetoresistance ratios, as referred to above, is greater and greater.

Recently, "magnetic nanocontacts" by tip-to-tip abutment of two nickel (Ni) needles and nanocontacts by contact of two magnetite elements have been reported as elements exhibiting 100% or higher magnetoresistive effects, see (1) Garcia, M. Munoz and Y.-W. Zhao, Physical Review Letters, vol.82, p2923(1999) and (2) J. J. Versluijs, M. A. Bari and J. W. D. Coery, Physical Review Letters, vol.87, p26601-1 (2001), respectively. These nanocontacts certainly exhibit large magnetoresistive changes. In both proposals, however, the magnetic nanocontacts are made by bringing two needle-shaped or triangular-shaped ferromagnetic elements into tip-to-tip contact.

More recently, magnetic nanocontacts have been formed by arranging two thin nickel wires in a "T"-configuration and by growing a micro column at the connecting point thereof by electroplating technique, see (3) N. Garcia et. al., Appl. Phys. Lett., vol.80, p1785 (2002) and (4) H. D. Chopra and S. Z. Hua, Phys. Rev. B, vol.66, p.20403-1 (2002).

These magnetic nanocontacts also exhibit a large mangetoresistance change, however, the structure of these magnetic nanocontacts makes it almost impossible to realize a practical magnetoresistance effect element.

Another group has reported a magnetic nanocontact which was formed by growing a cluster of nickel using an electroplating technique in a pinthrough hole made on an alumina layer, see (5) M. Munoz, G. G. Qian, N. Karar, H. Cheng, I. G. Saveliev, N. Garcia, T. P. Moffat, P. J. Chen, L. Gan, and W. F. Egelhoff, Jr., Appl. Phys. Lett., vol. 79, p.2946, (2001).

However, it is difficult to control the magnetic domain structure and the configuration of the point contact, therefore, the resulting magnetoresistance ratio is as small as 14% or even smaller.

Magnetic nanocontacts have a potential to exhibit a large magnetoresistance ratio, however, in order to ensure a large magnetoresistive effect therewith, the structures proposed by the above-noted articles include placing two needle-shaped ferromagnetic elements in tip-to-tip abutment or growing a micro column between two wires by an electroplating technique, and this and other requirements make it difficult to accurately control the contact portions in the manufacturing process. Taking into account of the application of such magnetic nanocontacts to magnetic heads or solid magnetic memory devices, however, it is necessary to develop a structure for nanocontacts that is suitable for mass production under reasonable control, as well as the manufacturing method to achieve such a structure. Additionally, to detect the difference in magnetization directions on opposite sides of a nanocontact, control of magnetic domains of both magnetic electrodes is important. Therefore, in order to realize a practical magnetoresistance effect element, it is essential to develop a structure where the control of the magnetic domains of the both magnetic electrodes is quite easy.

SUMMARY OF THE INVENTION

According to the present invention, there is provided a magnetoresistance effect element comprising: a first ferromagnetic layer; an insulating layer overlying said first ferromagnetic layer; and a second ferromagnetic layer overlying said insulating layer, said insulating layer having a through hole penetrating its thickness direction at a predetermined position, said first ferromagnetic layer and said second ferromagnetic layer being electrically connected to each other via said through hole, and said through hole having an opening width not larger than 20 nm.

According to another embodiment of the invention, there is provided a magnetic reproducing element comprising a magnetoresistance effect element including: a first ferromagnetic layer; an insulating layer overlying said first ferromagnetic layer; and a second ferromagnetic layer overlying said insulating layer, said insulating layer having a through hole penetrating its thickness direction at a predetermined position, said first ferromagnetic layer and said second ferromagnetic layer being electrically connected to each other via said through hole, and said through hole having an opening width not larger than 20 nm, said magnetoresistance effect element being provided on a path of the magnetic flux emitted from a magnetic recording medium so that said first and second ferromagnetic layers are serially aligned on a path of the magnetic flux emitted from a magnetic recording medium, and said magnetoresistance effect element detects a difference between magnetization directions of said first and second ferromagnetic layers as a resistance change.

According to an embodiment of the present invention, there is provided a magnetic reproducing element comprising a magnetoresistance effect element including: a first ferromagnetic layer; an insulating layer overlying said first ferromagnetic layer; and a second ferromagnetic layer overlying said insulating layer, said insulating layer having a through hole penetrating its thickness direction at a predetermined position, said first ferromagnetic layer and said second ferromagnetic layer being electrically connected to each other via said through hole, and said through hole having an opening width not larger than 20 nm, and said magnetoresistance effect being arranged so as to make a main plane of said first ferromagnetic layer substantially perpendicular to a recording surface of said magnetic recording medium.

According to yet another embodiment of the present invention, there is provided a magnetic memory comprising: magnetoresistance effect element including: a first ferromagnetic layer being pinned in magnetization in a first direction; an insulating layer overlying said first ferromagnetic layer; a second ferromagnetic layer overlying said insulating layer, said second ferromagnetic layer being free in direction of magnetization, and at least one of a reading and a writing being executable by flowing a current in a direction of its layer thickness; a nonmagnetic intermediate layer overlying said second ferromagnetic layer; and a third ferromagnetic layer overlying said nonmagnetic intermediate layer and being pinned in magnetization in a second direction substantially opposite from said first direction, said insulating layer having a through hole penetrating its thickness direction at it's a predetermined position, said first ferromagnetic layer and said second ferromagnetic layer being electrically connected to each other via said through hole, and said through hole having an opening width not larger than 20 mm.

According to yet another embodiment of the present invention, there is provided a magnetic memory comprising: magnetoresistance effect element including: a first ferromagnetic layer being pinned in magnetization in a first direction; an insulating layer overlying said first ferromagnetic layer; a second ferromagnetic layer overlying said insulating layer, said second ferromagnetic layer being free in direction of magnetization, and at least one of a reading and a writing being executable by flowing a current in a direction of its layer thickness; a nonmagnetic intermediate layer overlying said second ferromagnetic layer; and a third ferromagnetic layer overlying said nonmagnetic intermediate layer and being pinned in magnetization in said first direction, said insulating layer having a through hole penetrating its thickness direction at its a predetermined position, said first ferromagnetic layer and said second ferromagnetic layer being electrically connected to each other via said through hole, and said through hole having an opening width not larger than 20 nm.

According to yet another embodiment of the invention, there is provided a magnetic memory comprising a magnetoresistance effect element including: a first ferromagnetic layer; an insulating layer overlying said first ferromagnetic layer; and a second ferromagnetic layer overlying said insulating layer, said insulating layer having a through hole penetrating its thickness direction at it's a predetermined position, said first ferromagnetic layer and said second ferromagnetic layer being electrically connected to each other via said through hole, and said through hole having an opening width not larger than 20 nm, one of said first and second ferromagnetic layers being pinned in magnetization in a first direction, another of said first and second ferromagnetic layers being free in direction of magnetization and at least one of reading and writing being executable by flowing a current in a direction of thicknesses of said first and second ferromagnetic layers.

According to yet another embodiment of the present invention, there is provided a magnetic memory comprising a plurality of memory cells, said memory cells being two-dimensionally arranged, each of said memory cells being separated each other by insulating region, a current being provided to each of said memory cells by a conductive probe or fixed wiring, an absolute value of a writing current provided to each of said memory cells being larger than an absolute value of a reading current provided to each of said memory cells, and each of said memory cells having a magnetoresistance effect element including: a first ferromagnetic layer; an insulating layer overlying said first ferromagnetic layer; and a second ferromagnetic layer overlying said insulating layer, said insulating layer having a through hole penetrating its thickness direction at it's a predetermined position, said first ferromagnetic layer and said second ferromagnetic layer being electrically connected to each other via said through hole, and said through hole having an opening width not larger than 20 nm, one of said first and second ferromagnetic layers being pinned in magnetization in a first direction, and the other of said first and second ferromagnetic layers being free in direction of magnetization and said writing current and said reading current being provided in a direction of thicknesses of said first and second ferromagnetic layers.

In this specification, "magnetoresistance ratio" is defined to be a change in electrical resistance divided by electrical resistance. That is, the magnetoresistance ratio is obtained by dividing a change in electrical resistance by the electrical resistance at the magnetic field. In the case where the magnetization is unsaturated under the insufficient magnetic field, the magnetoresistance ratio is obtained by dividing the electrical resistance change by the smallest resistance of the MR element.

Also in this specification, "resistance between a first ferromagnetic layer and a second ferromagnetic layer" is defined as an average. That is, let the maximum resistance between the first and second ferromagnetic layers be Rmax, and the minimum resistance therebetween be Rmin, "resistance between a first ferromagnetic layer and a second ferromagnetic layer" is defined as the average of these values which equals to (Rmax+Rmin)/2.

BRIEF DESCRIPTION OF THE DRAWINGS

The present invention will be understood more fully from the detailed description given herebelow and from the accompanying drawings of the embodiments of the invention. However, the drawings are not intended to imply the limitation of the invention to a specific embodiment, but are for explanation and understanding only.

IN THE DRAWINGS

Figure 3A:
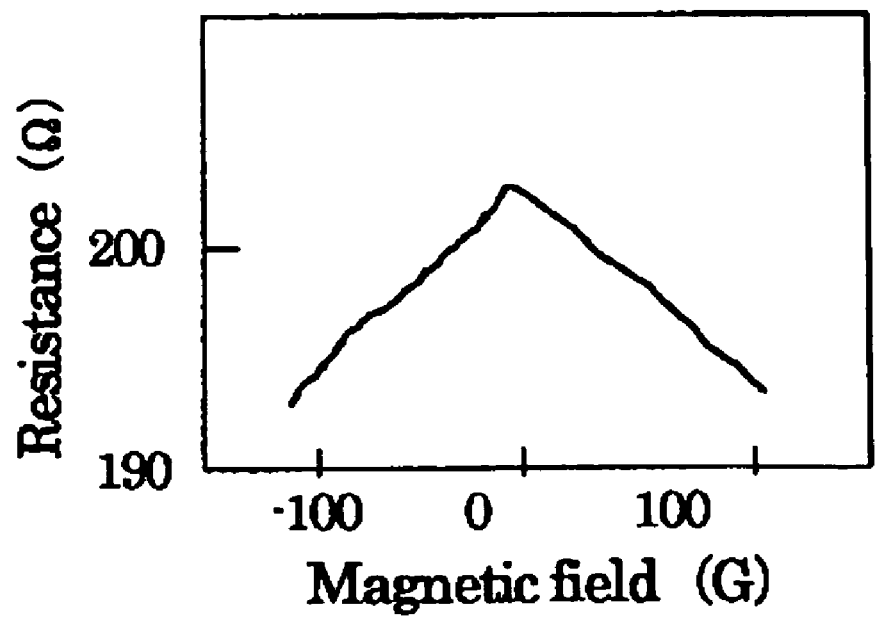
Figure 3B:
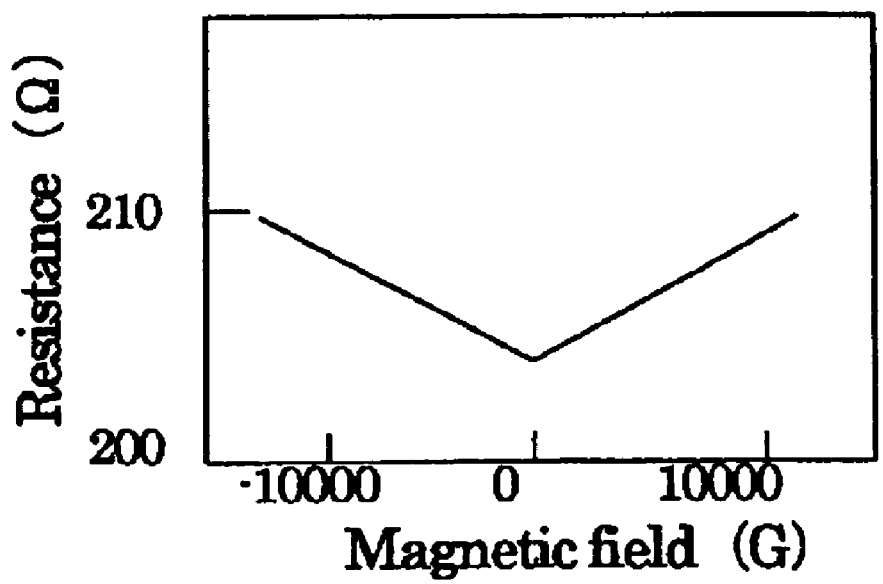
Figure 9:
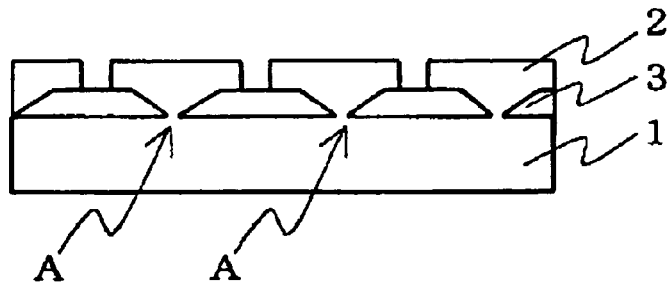
Figure 11A:
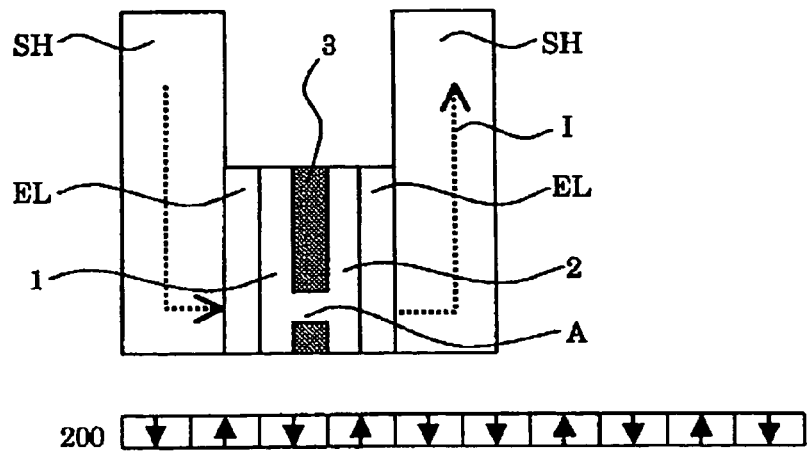
Figure 11B:
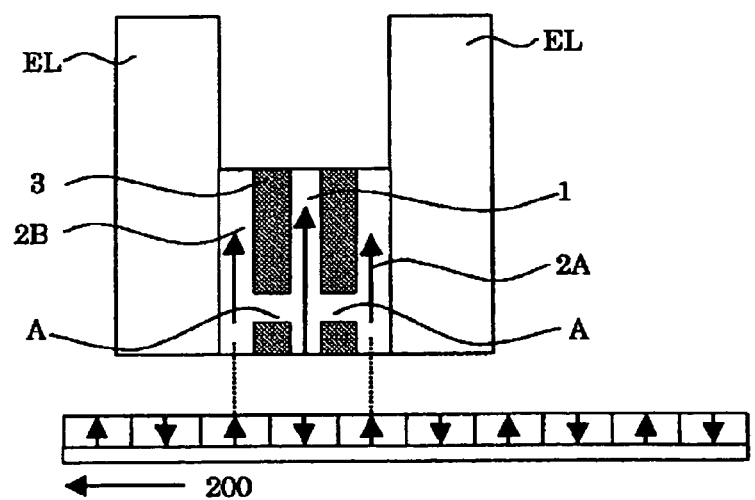
Figure 11C:
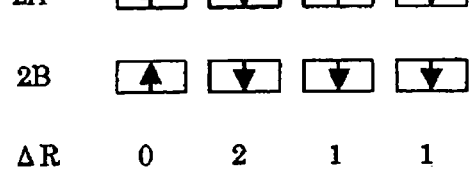
Figure 12:
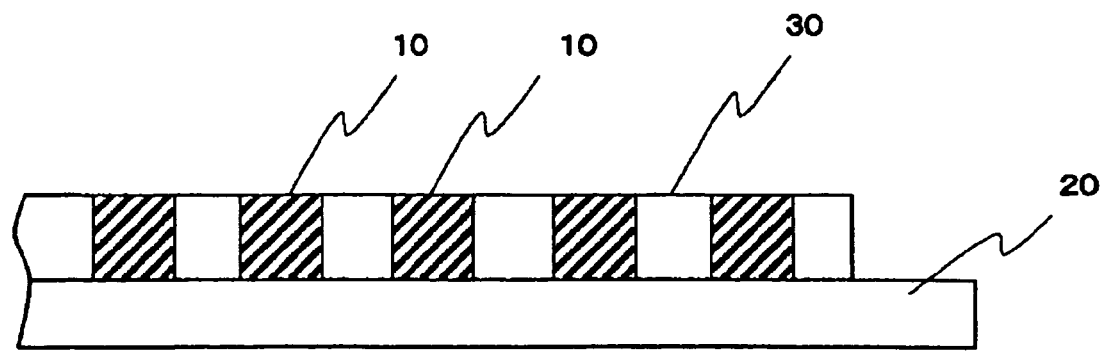
Figure 13A:
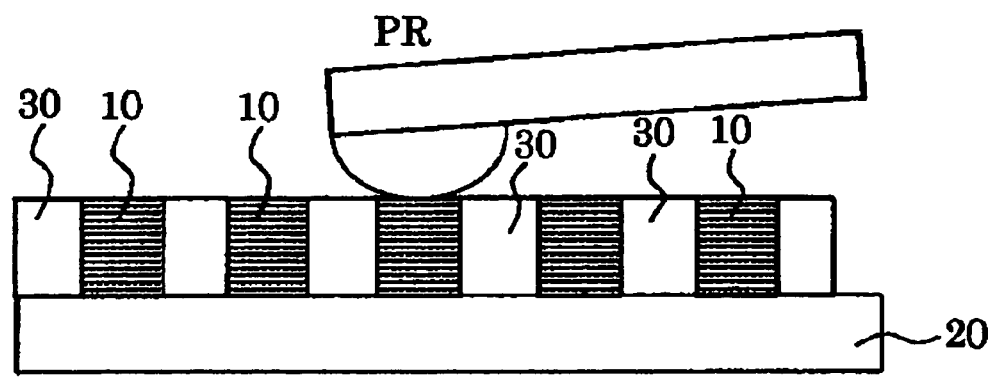
Figure 13B:
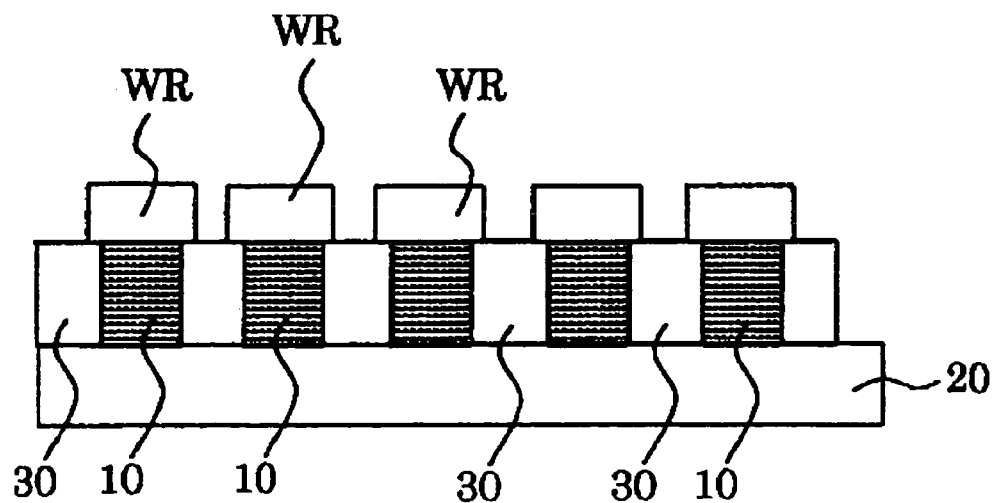
Figure 19A:
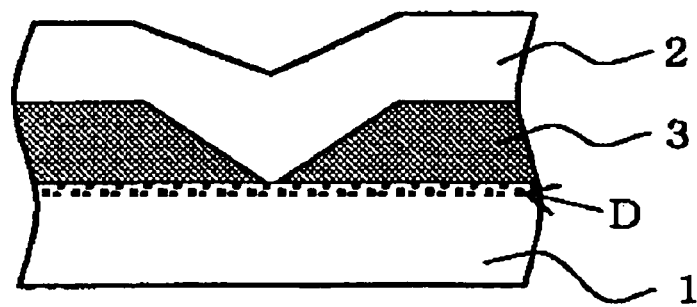
Figure 20:
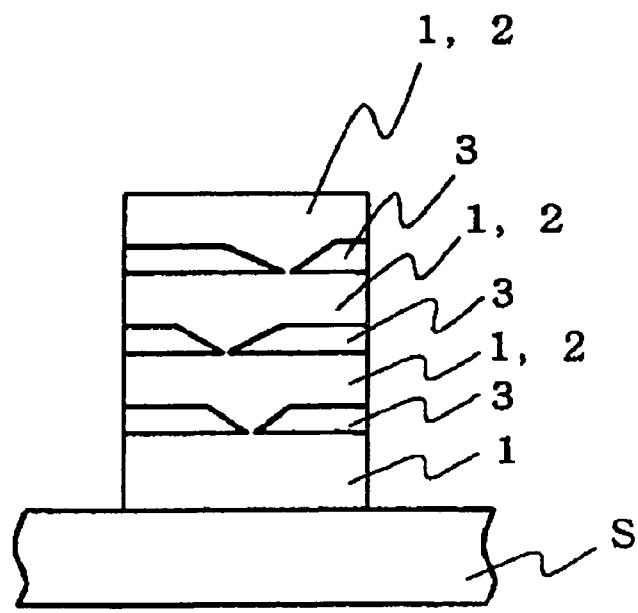
Figure 21:
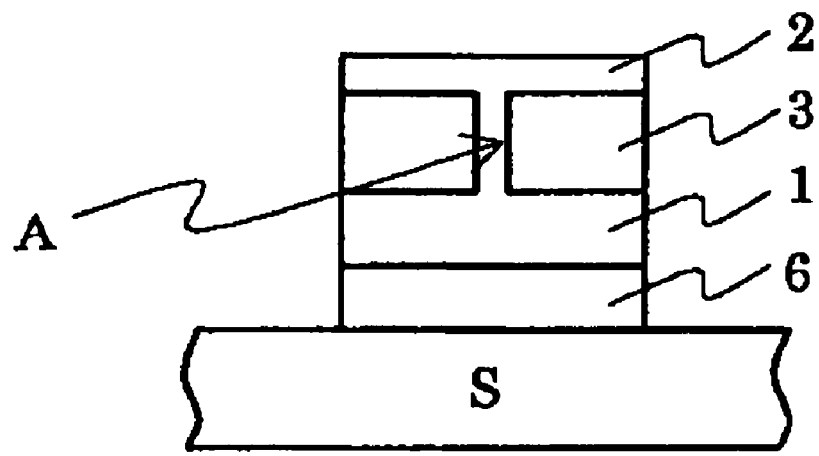
Figure 22:
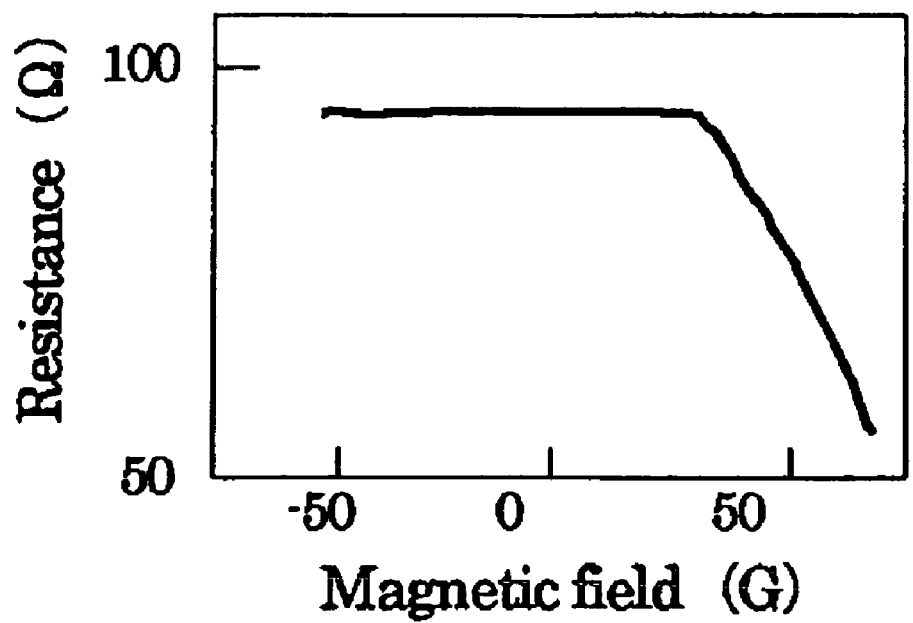
Figure 23:
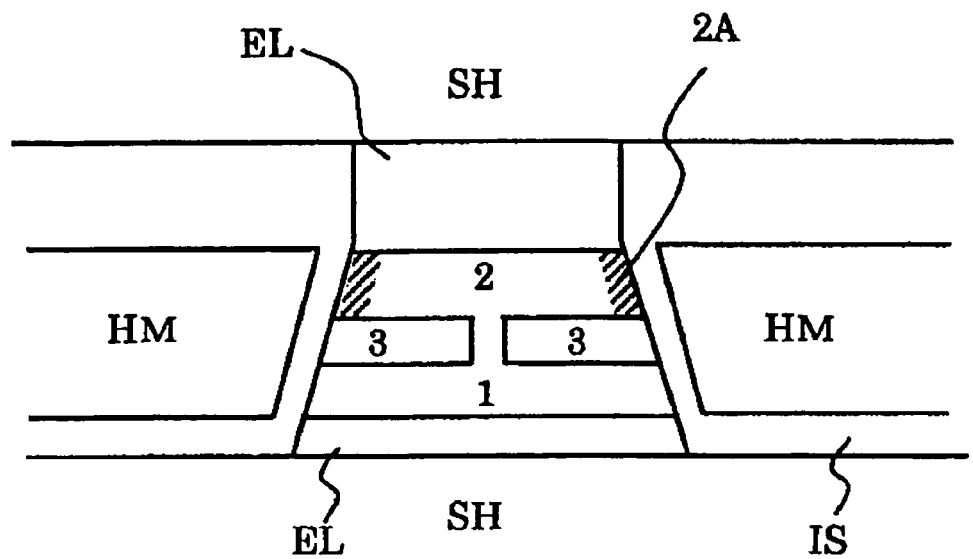
Figure 24:
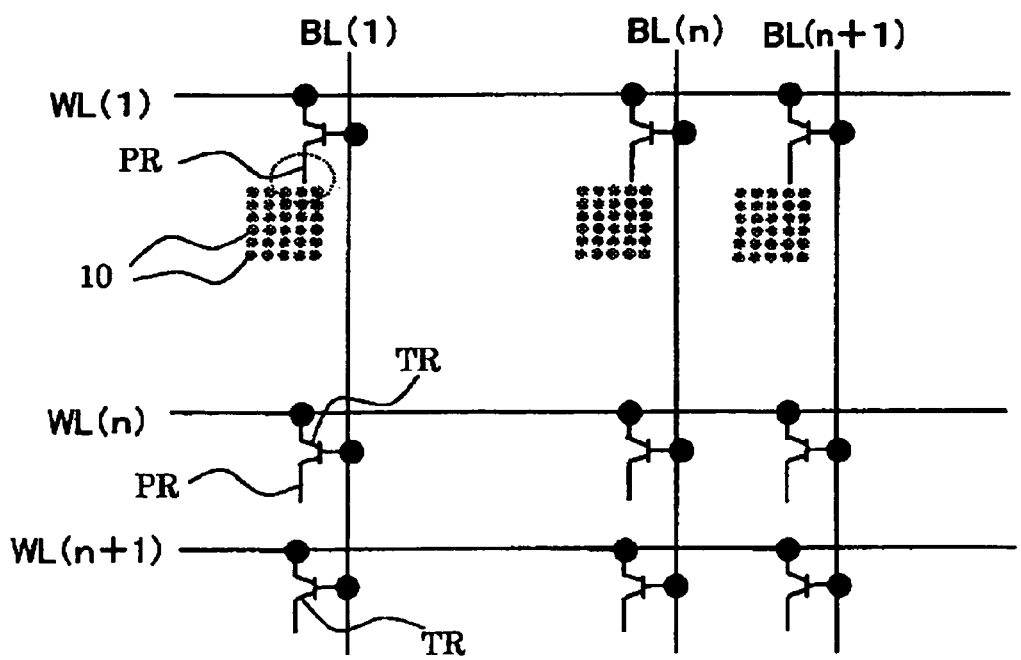
Figure 27:
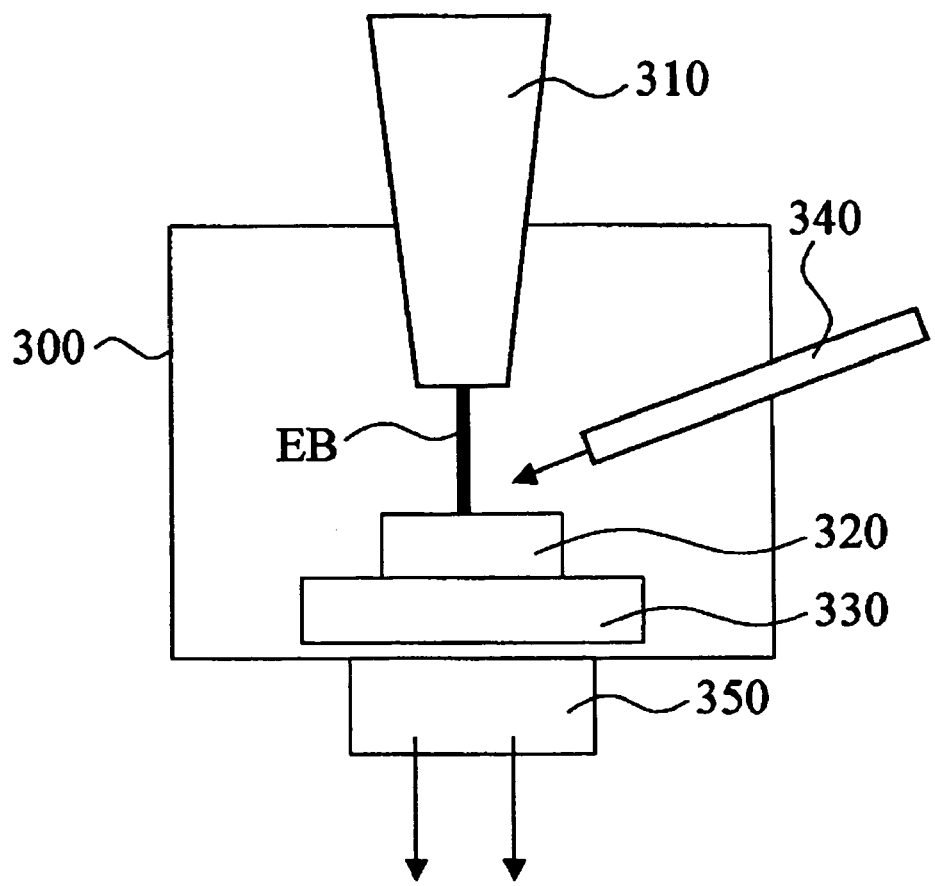
Figure 28:
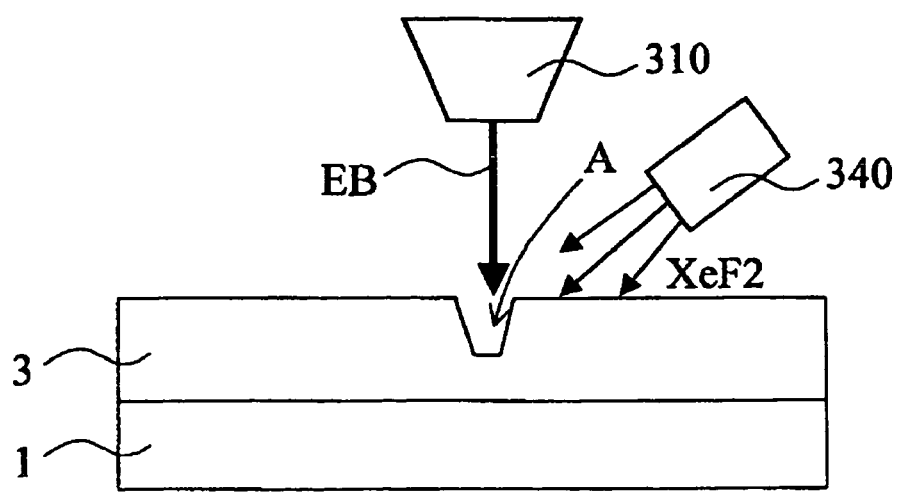
Figure 29A:
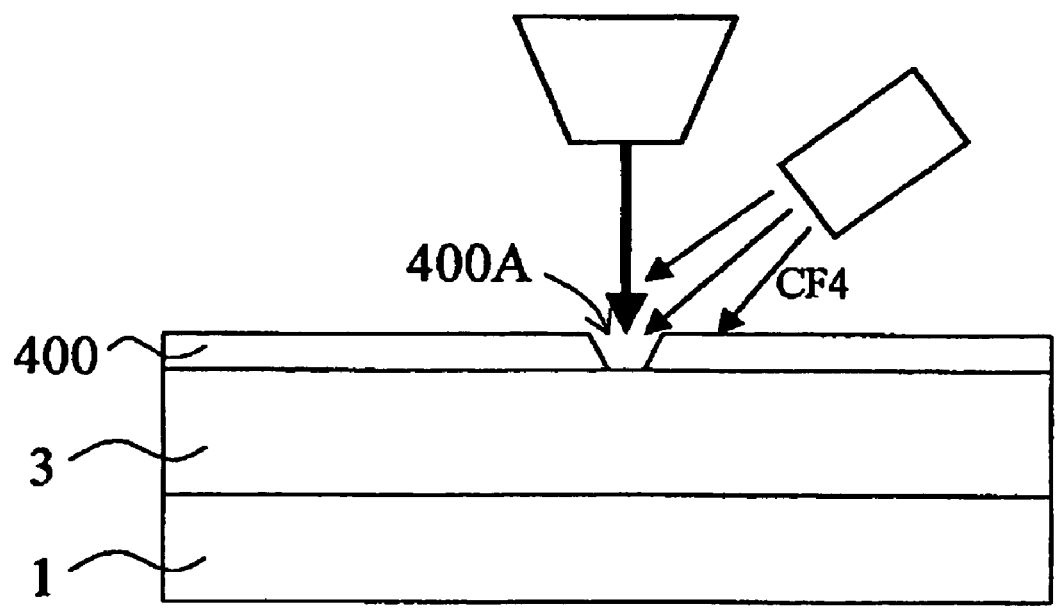
Figure 29B:
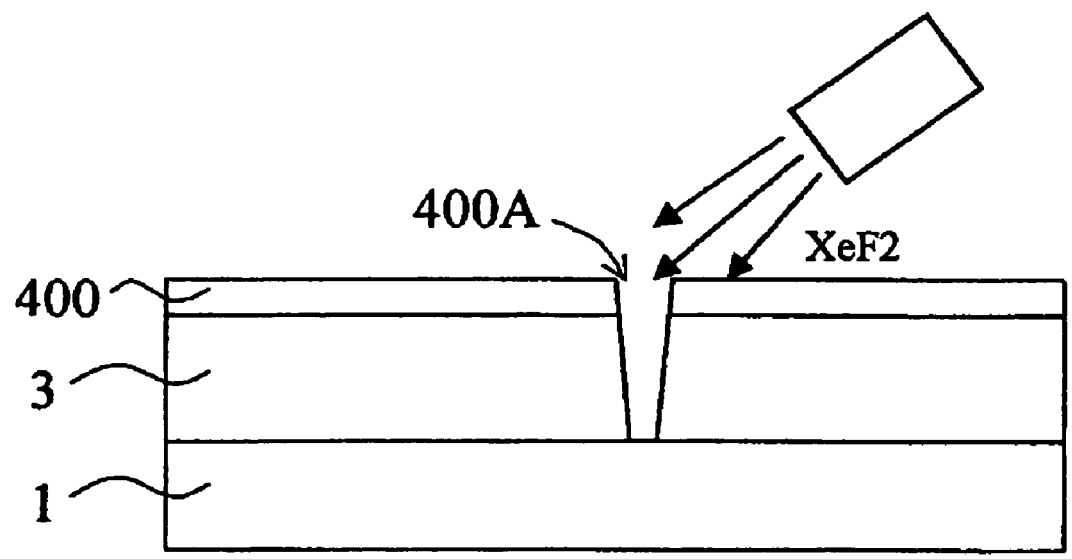
Figure 30A:
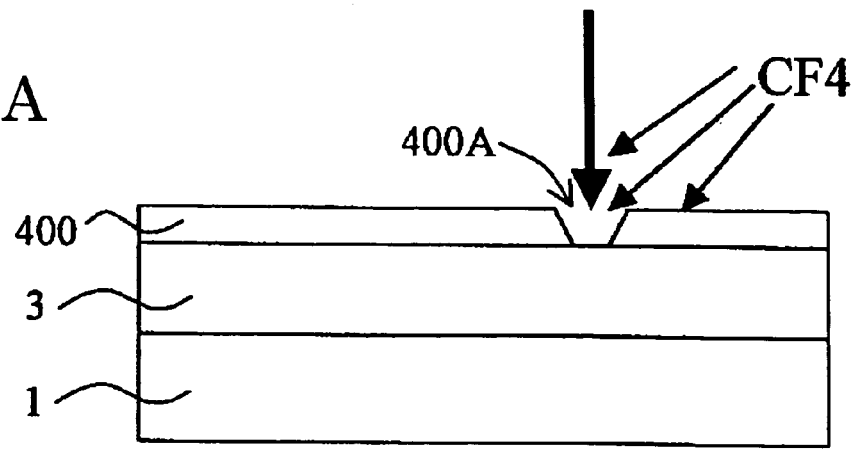
Figure 30B:
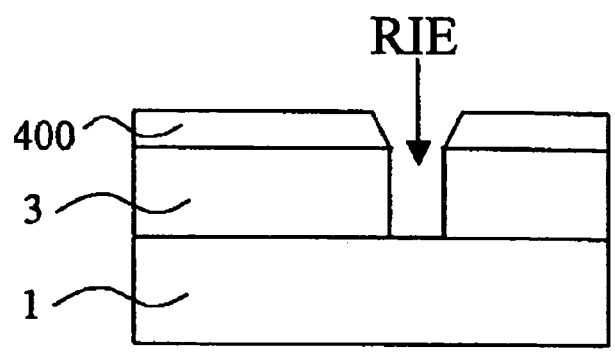
Figure 30C:
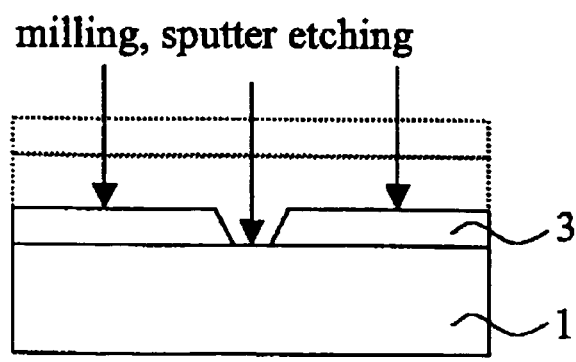
Figure 31A:
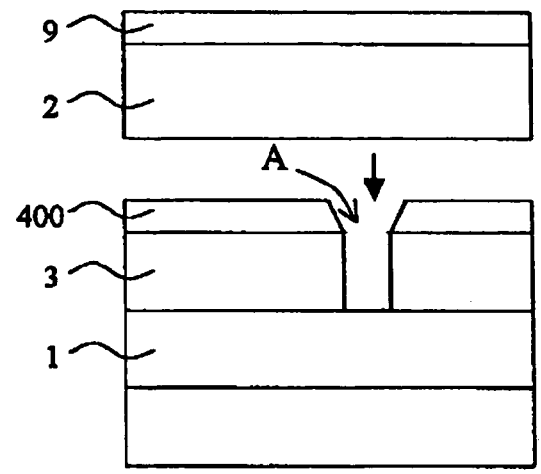
Figure 31B:
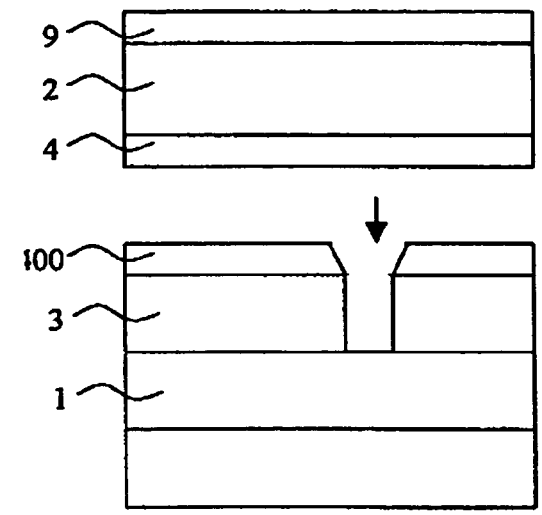
Figure 31C:
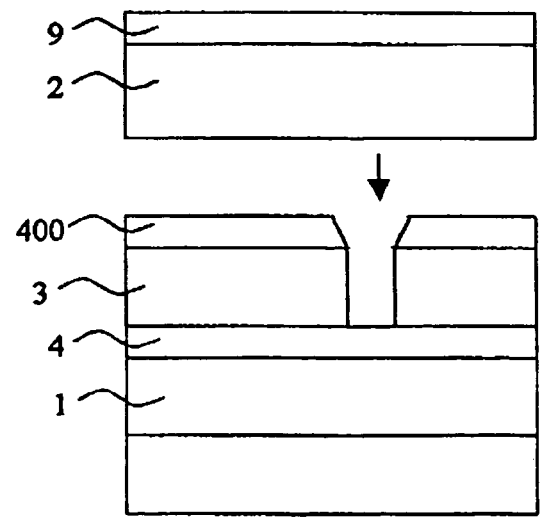
Figure 32A:
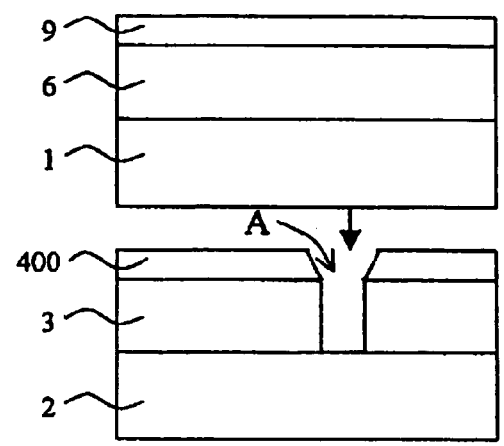
Figure 32B:
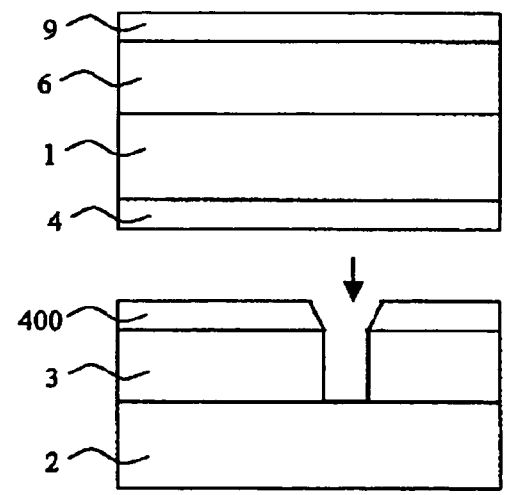
Figure 32C:
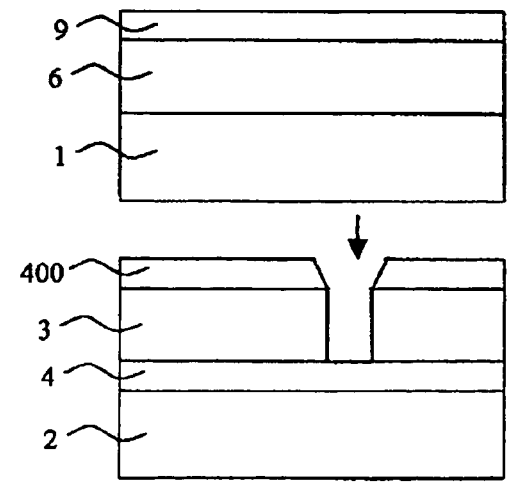
Figure 33:
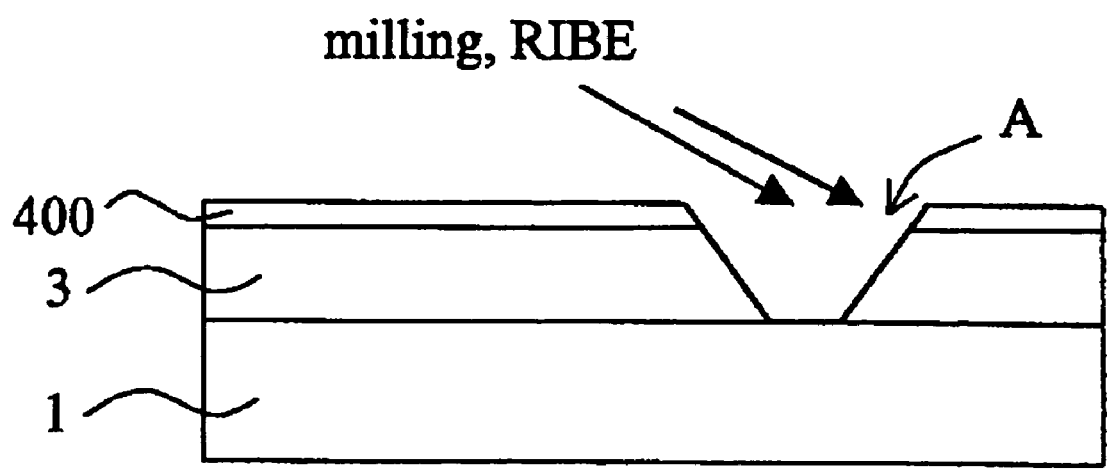
Figure 34A:
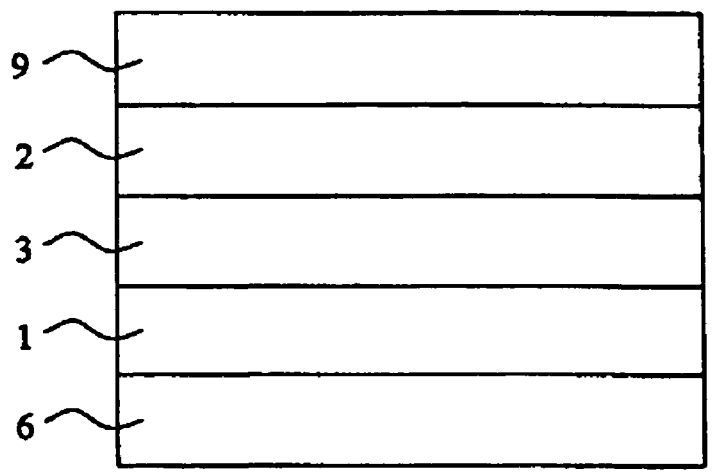
Figure 34B:
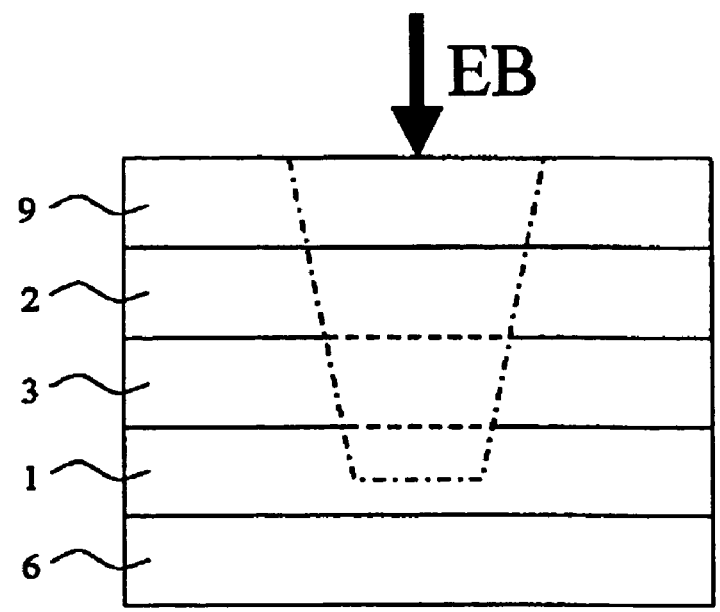
Figure 34C:
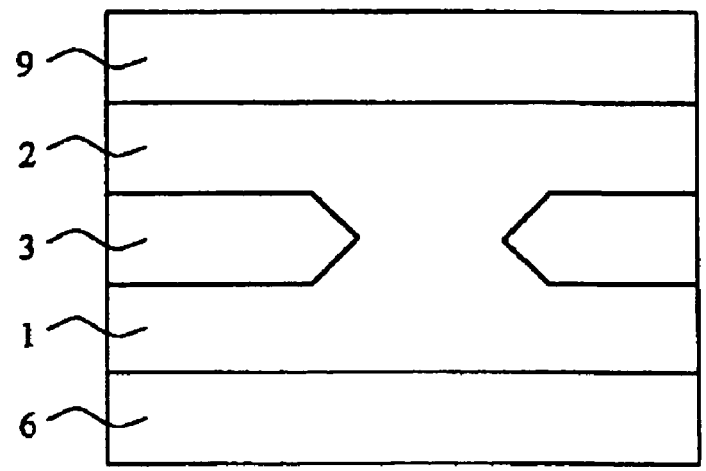
Figure 35A:
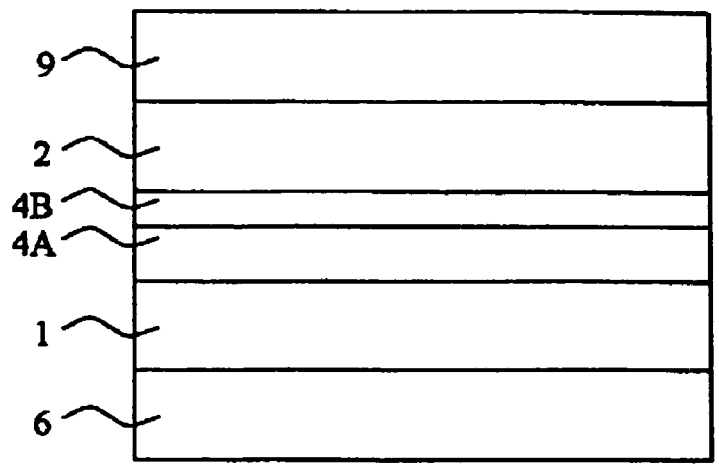
Figure 35B:
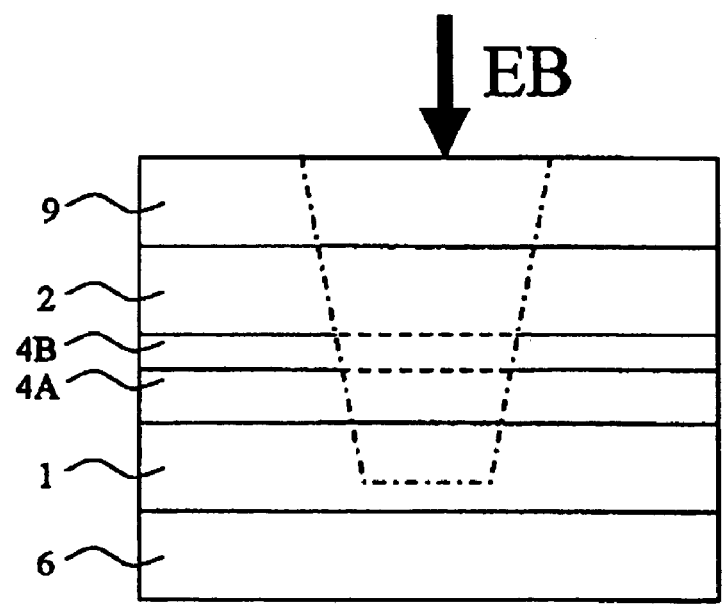
Figure 35C:
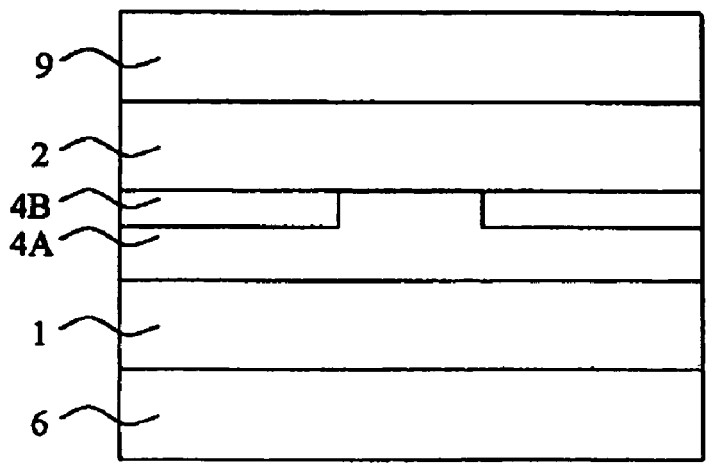
Figure 36A:
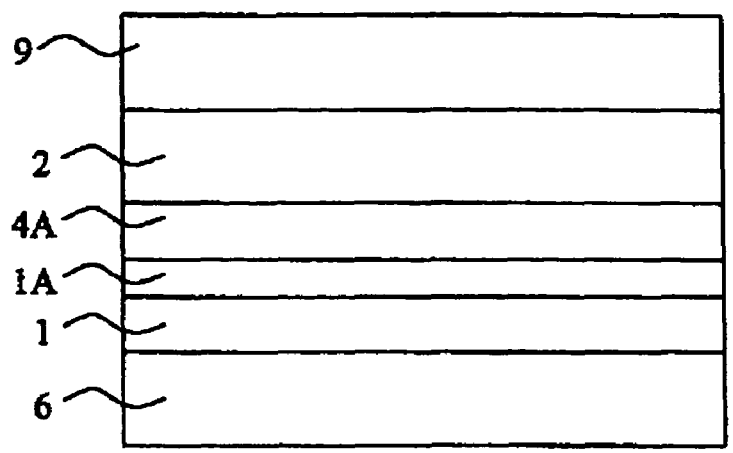
Figure 36B:
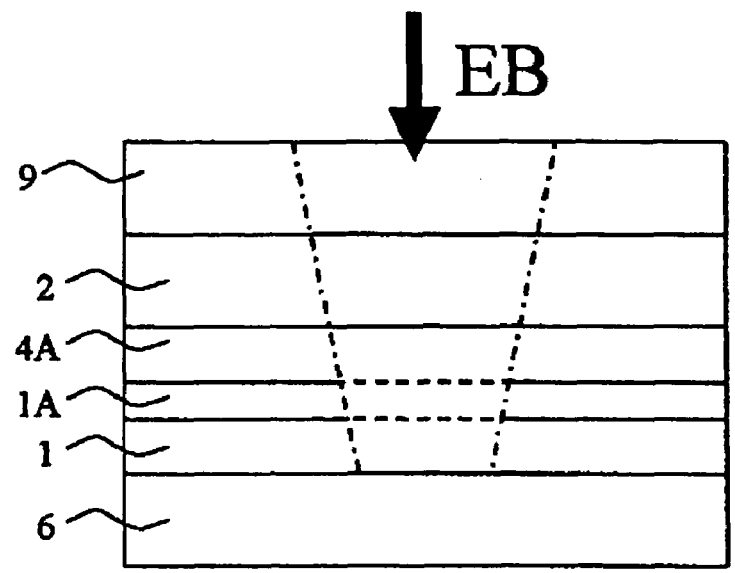
Figure 36C:
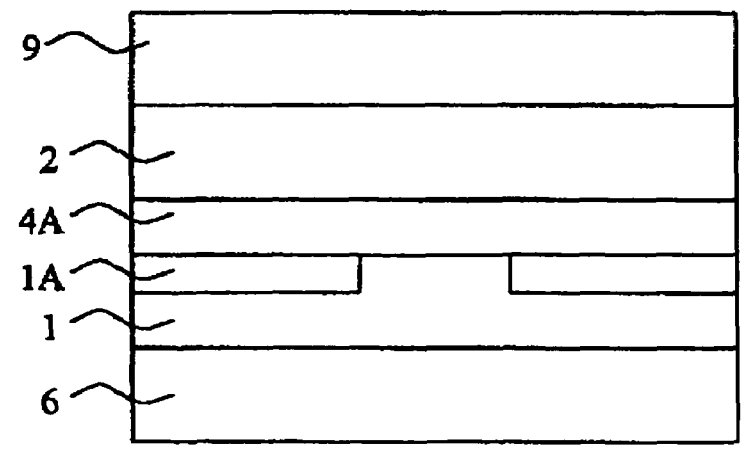
Figure 37A:
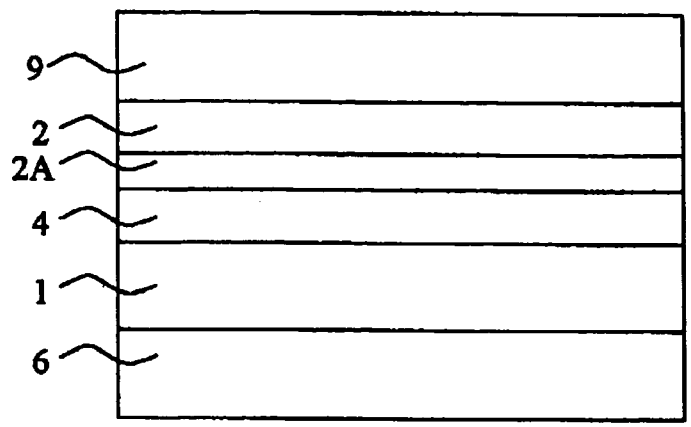
Figure 37B:
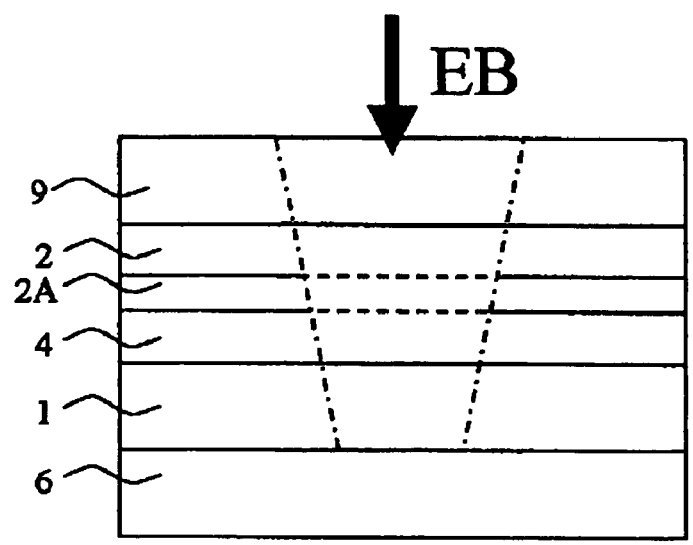
Figure 37C:
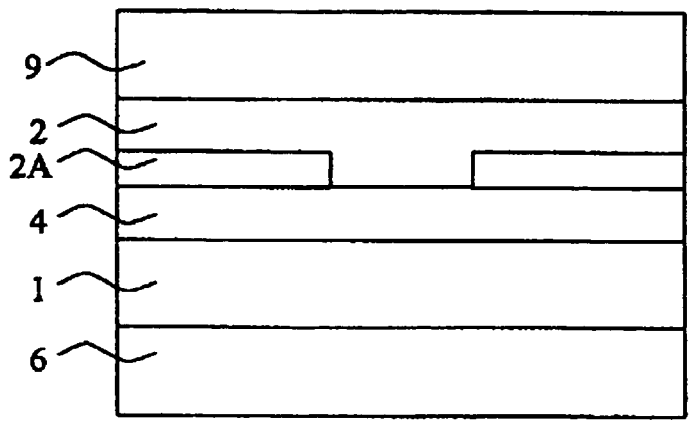
Figure 38A:
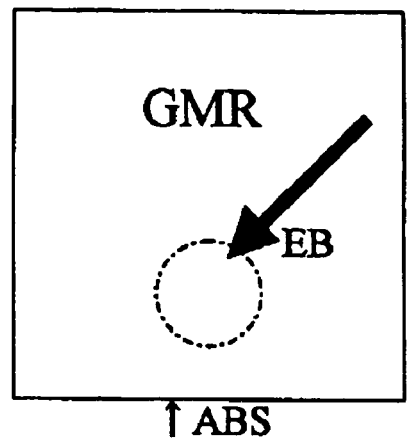
Figure 38B:
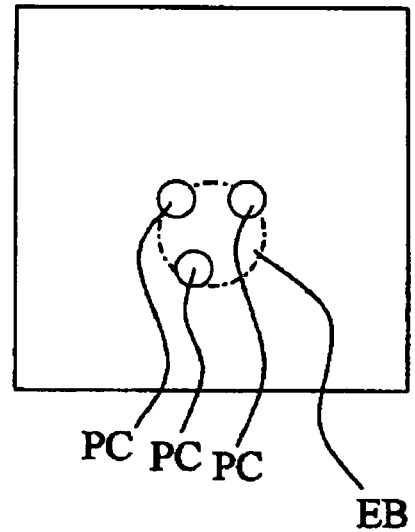
Figure 38C:
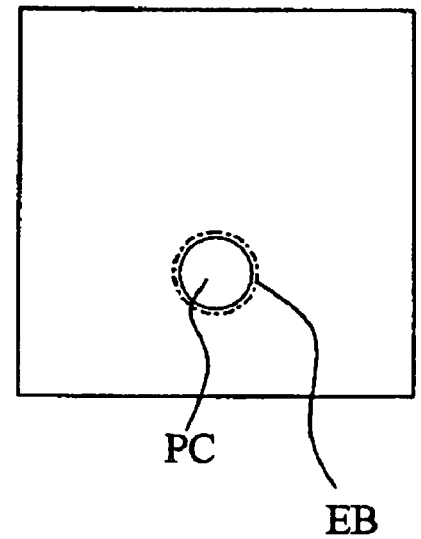
Figure 39:
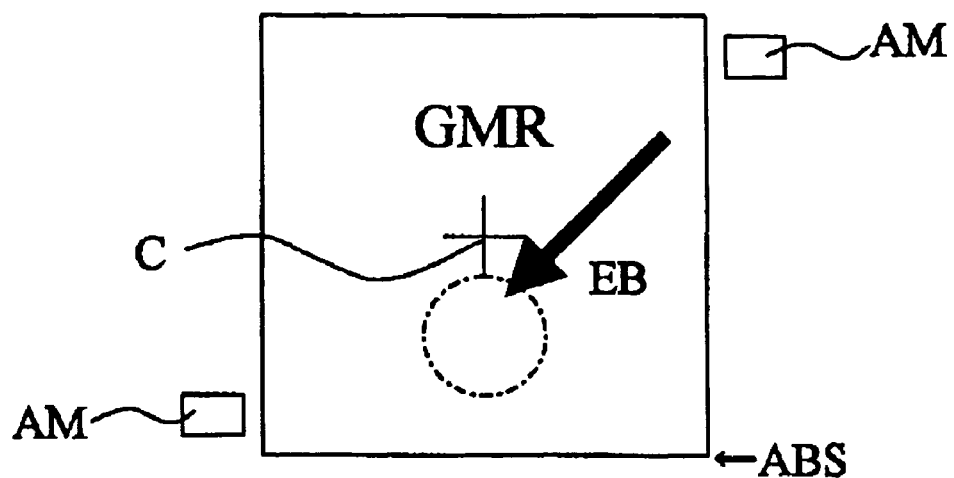
Figure 40:
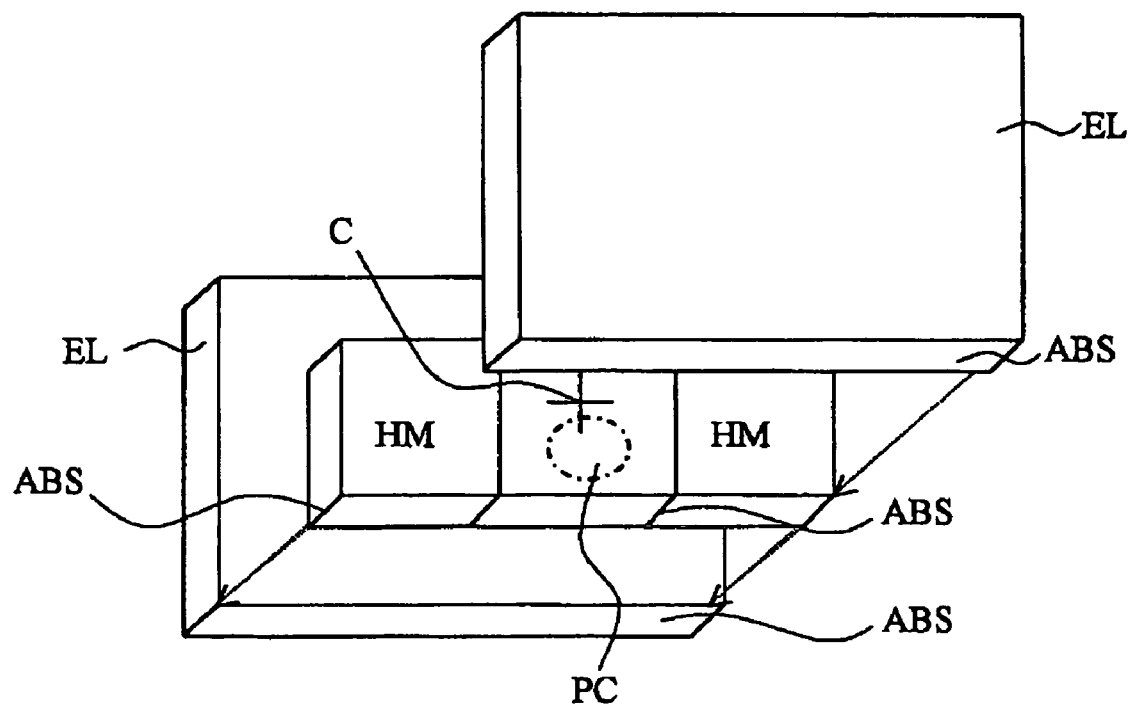
Figures 41A, 41B:
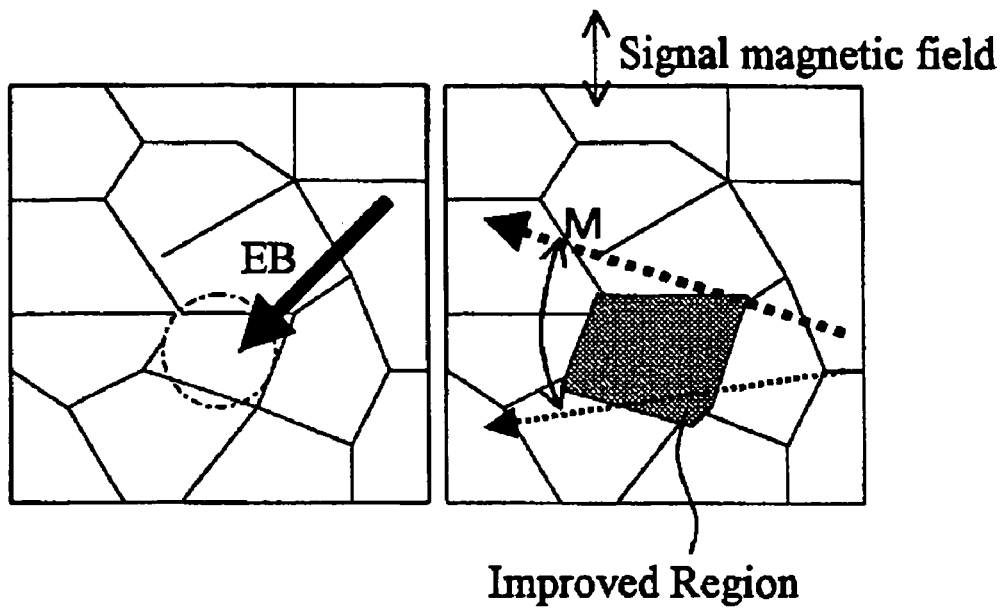
Figure 42:
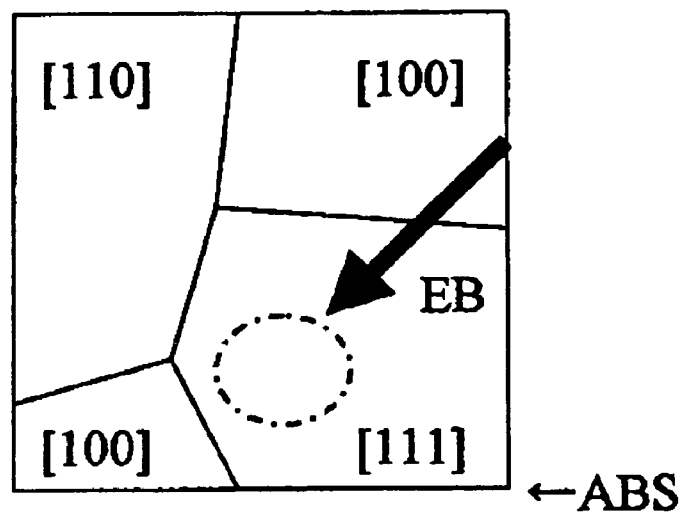
Figures 45A, 45B:
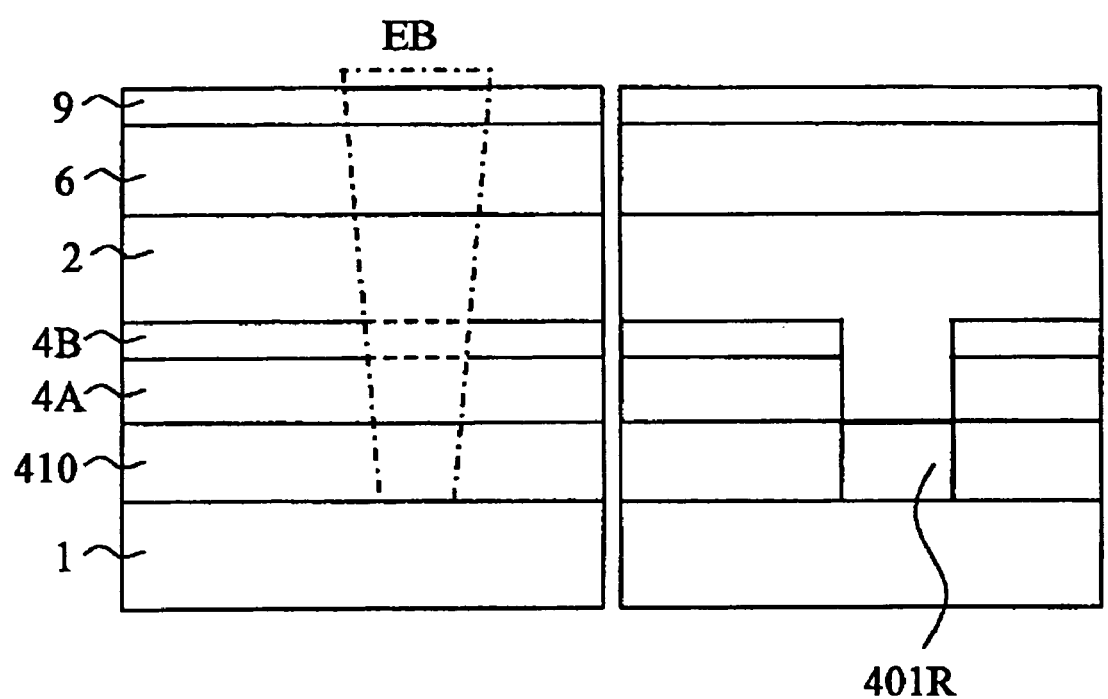
Figure 46A:
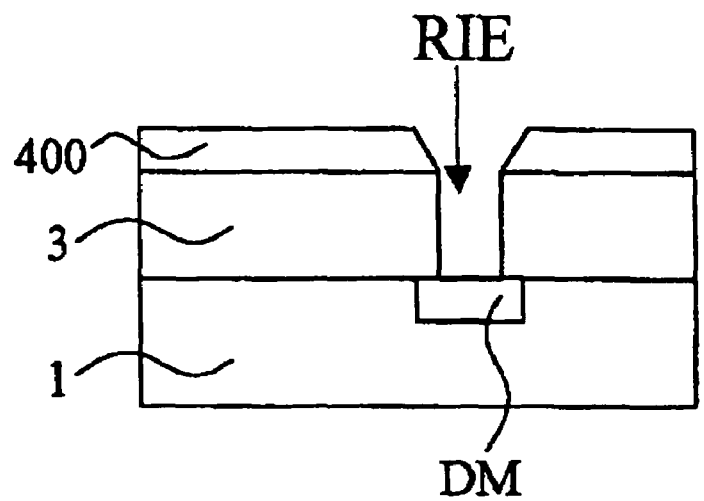
Figure 46B:
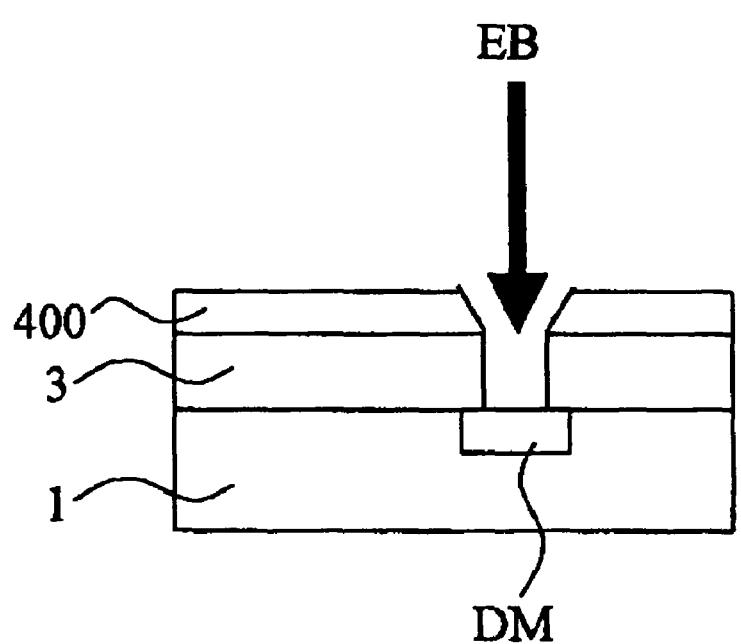
Figure 46C:
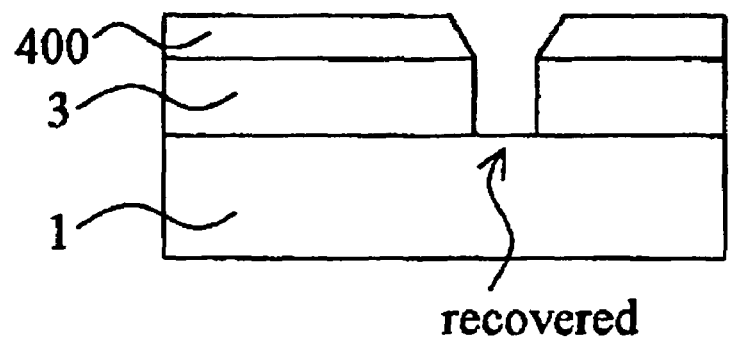
Figure 49A:
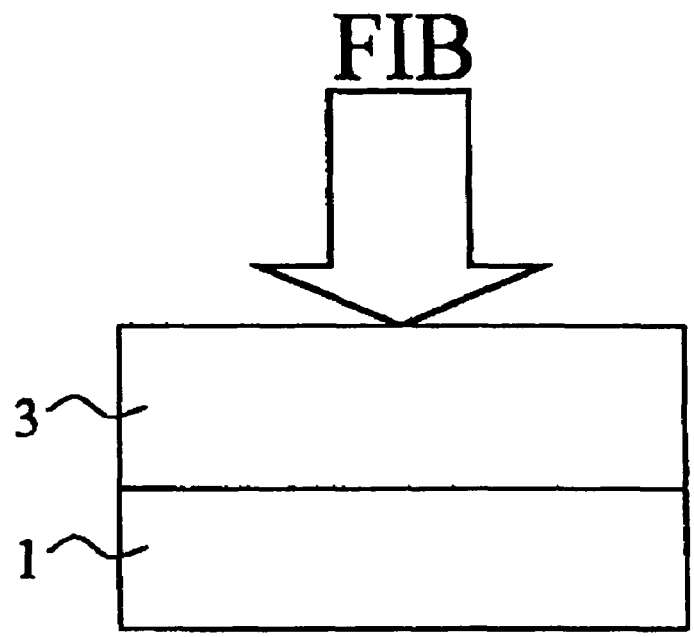
Figure 49B:
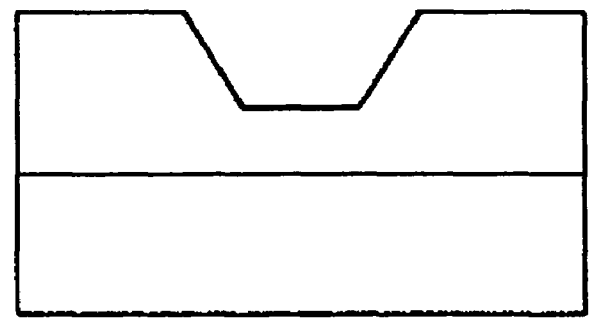
Figure 49C:
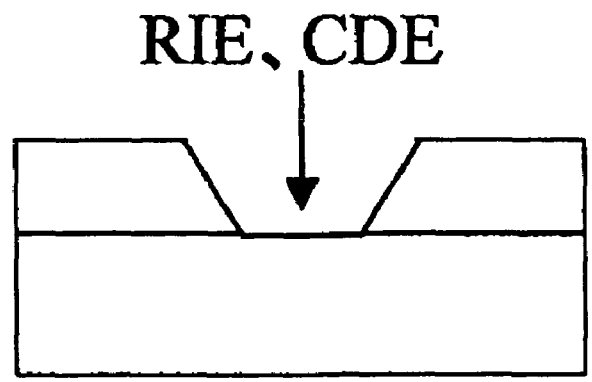
Figure 50A:
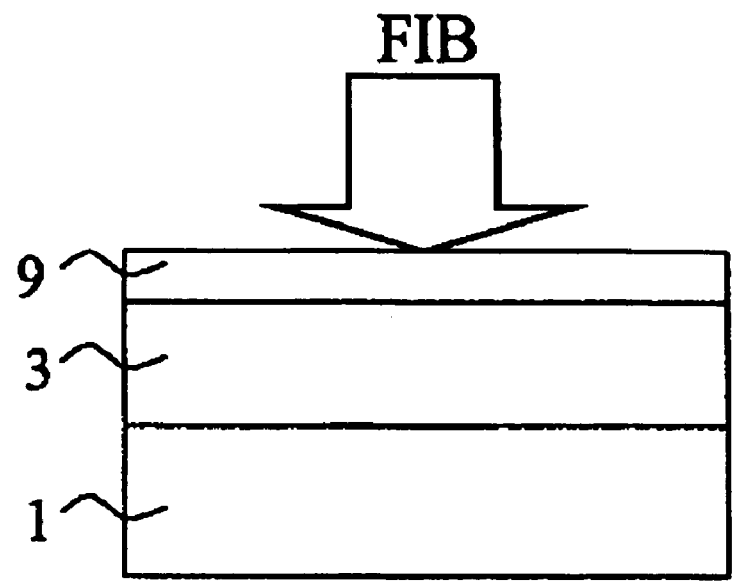
Figure 50B:
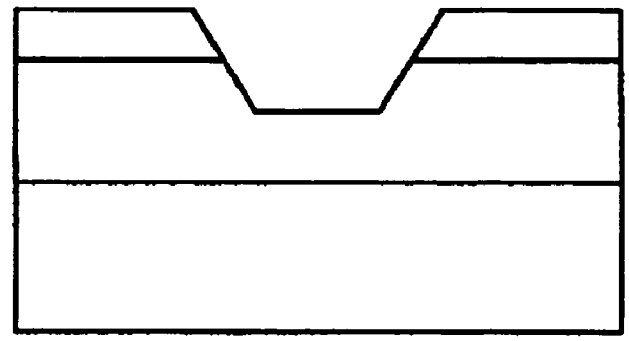
Figure 50C:
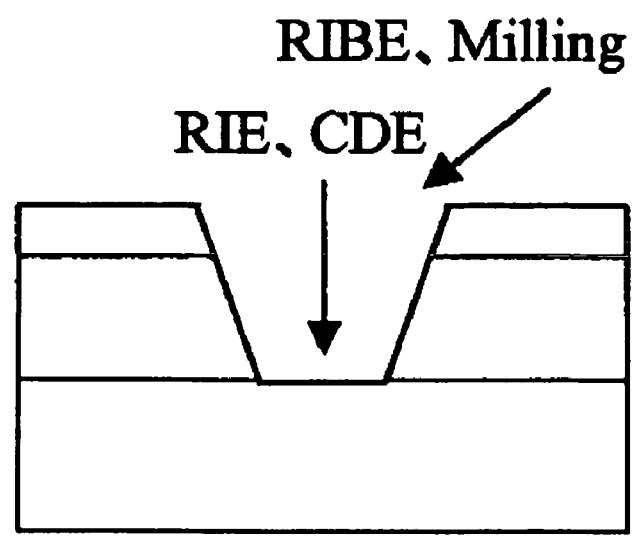
Figure 51A:
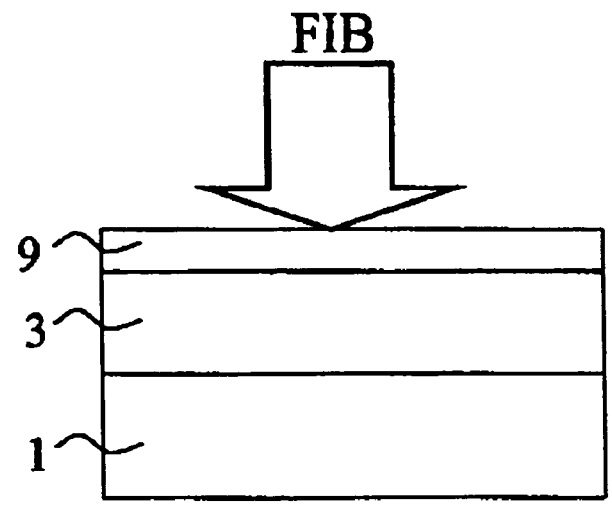
Figure 51B:
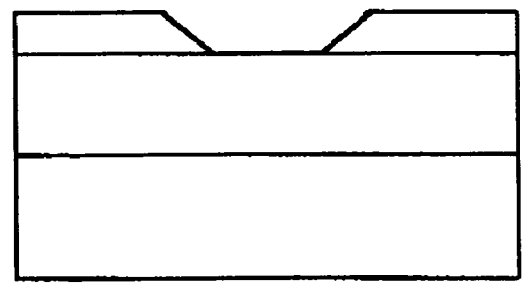
Figure 51C:
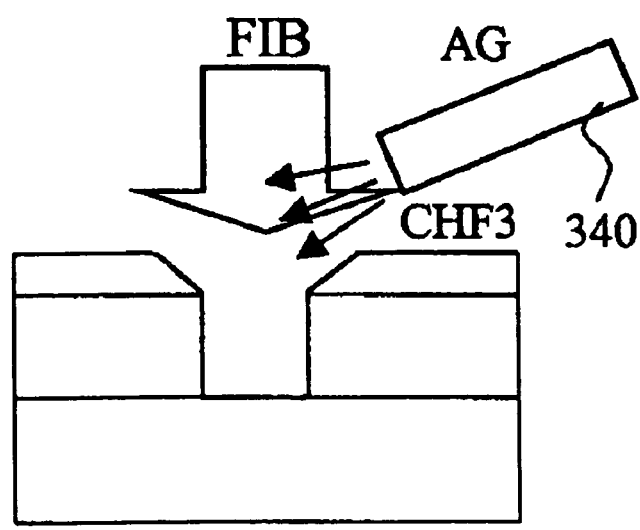
Figure 52:
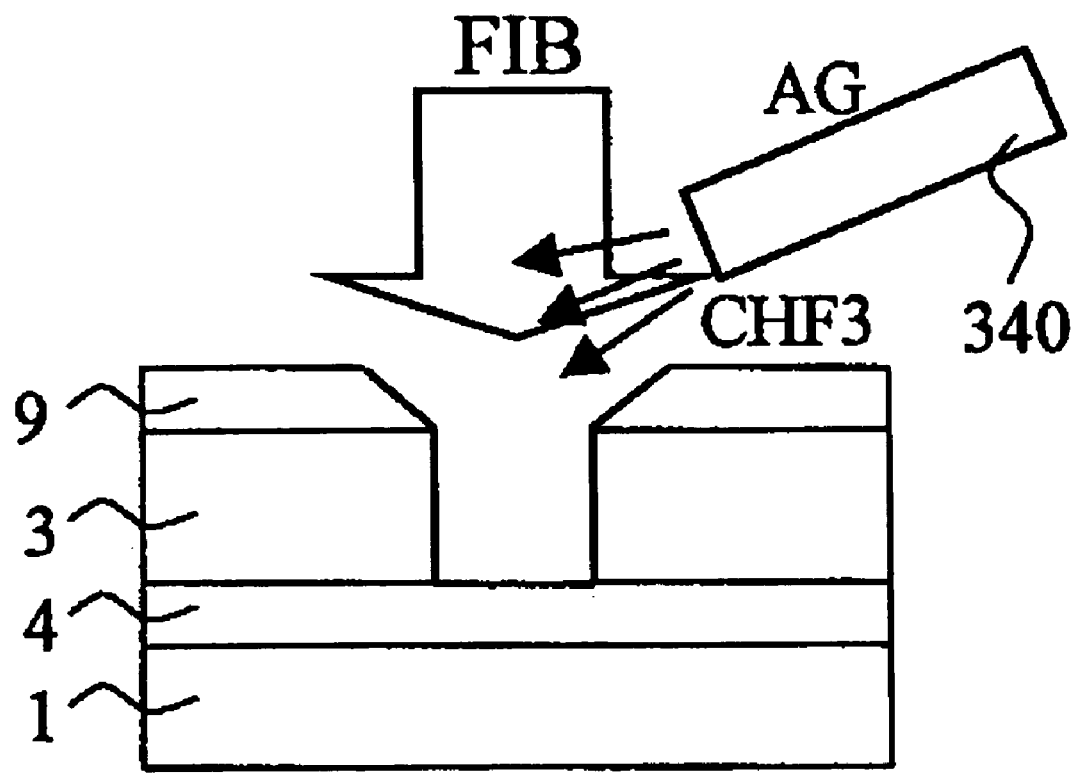
Figure 55:
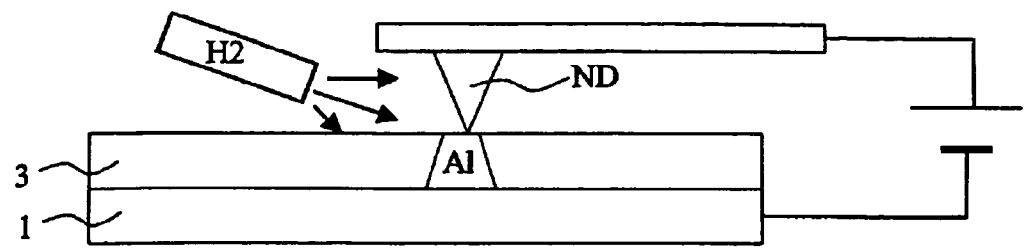
Figure 56:
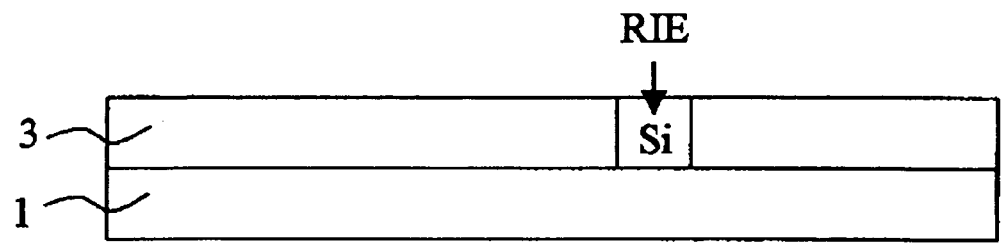
Figure 57:
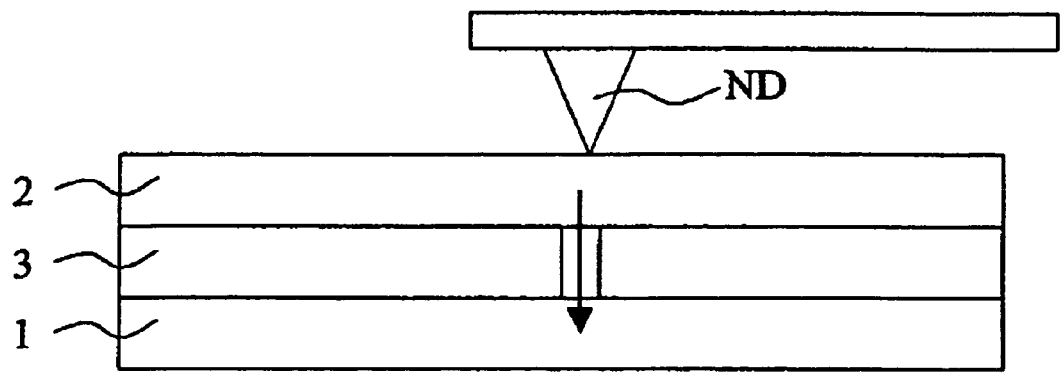
Figure 58A:
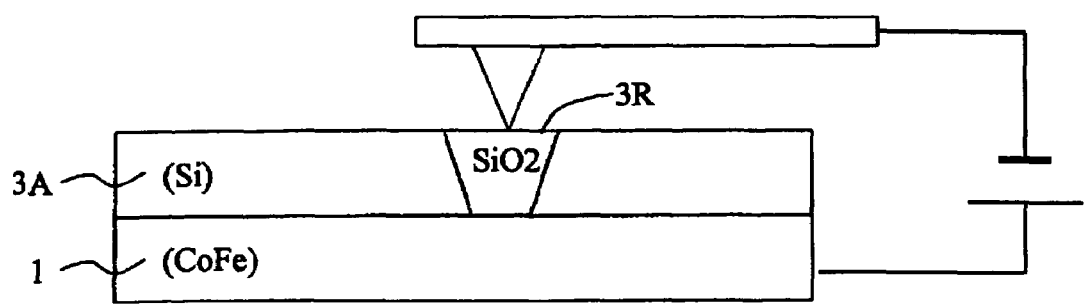
Figure 58B:
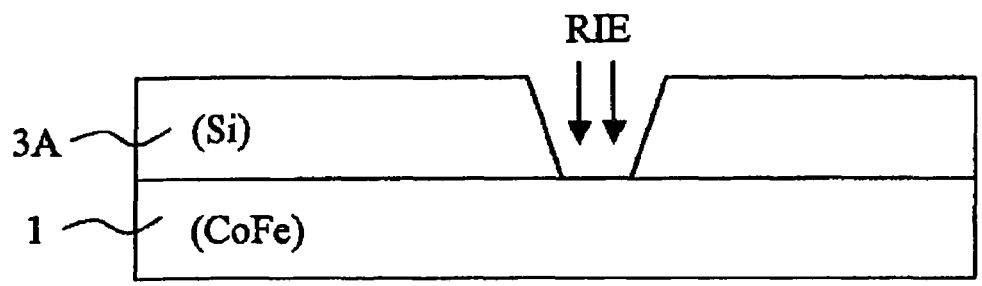
Figure 59A:
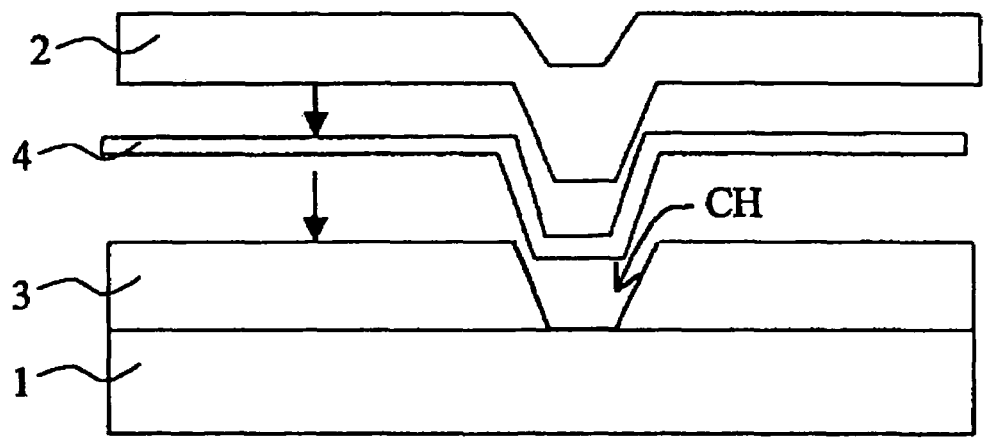
Figure 59B:
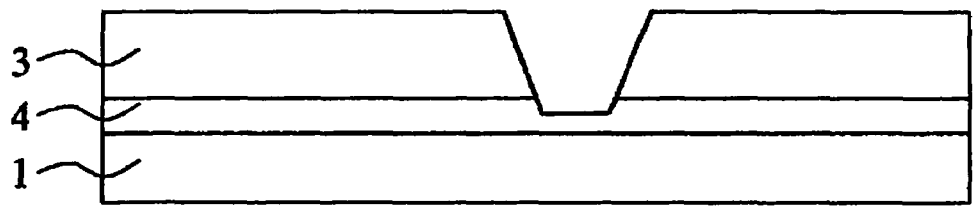
Figure 59C:
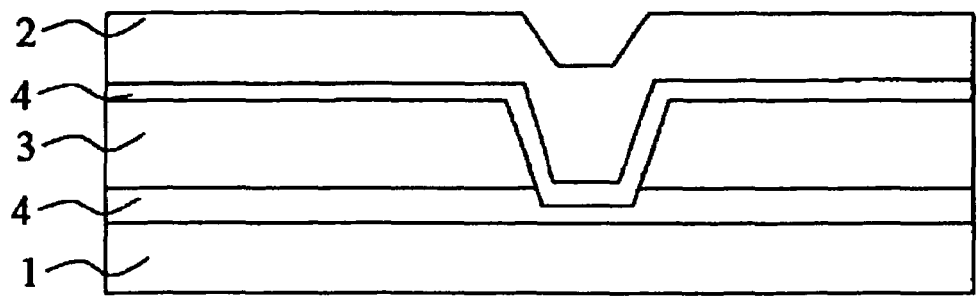
Figure 60A:
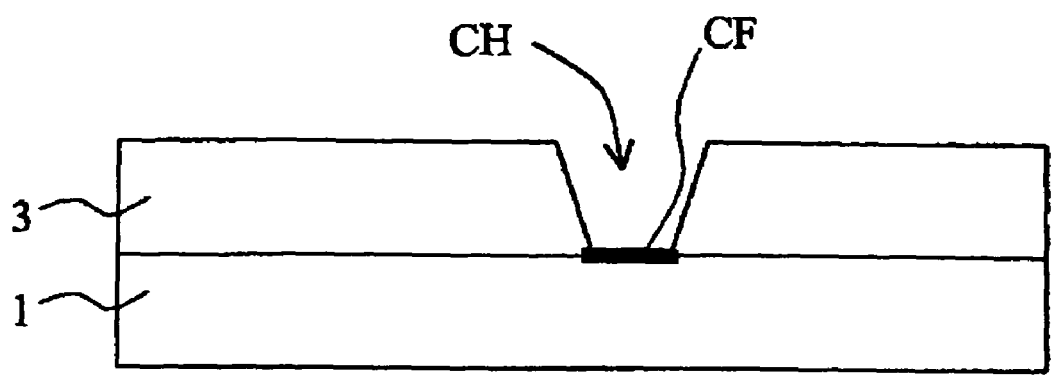
Figure 60B:
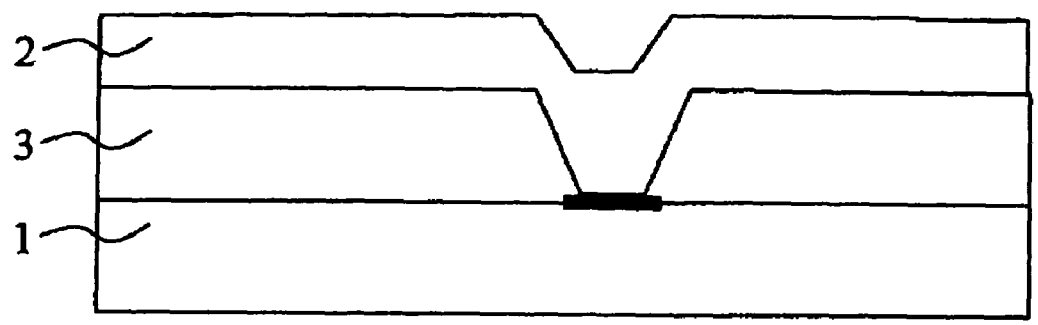
Figure 61A:
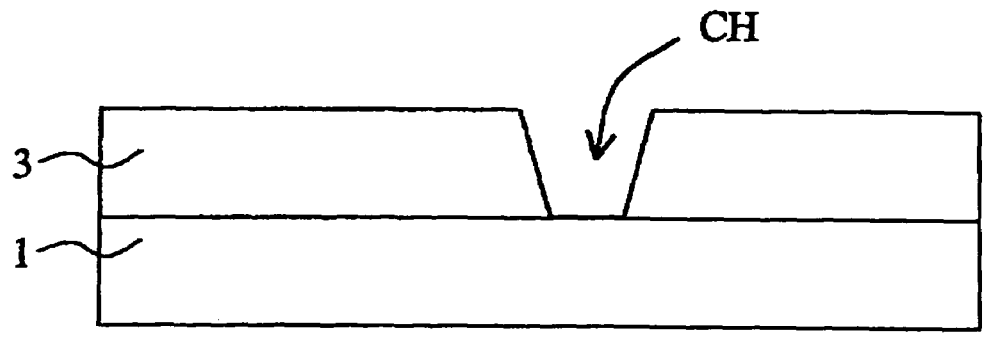
Figure 61B:
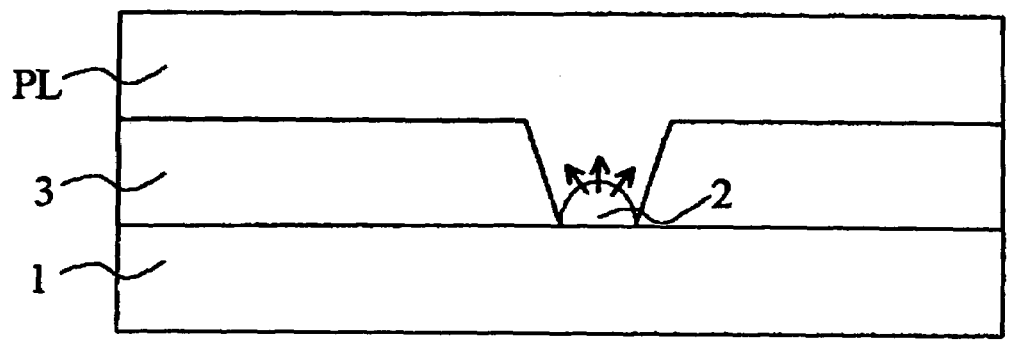
Figure 61C:
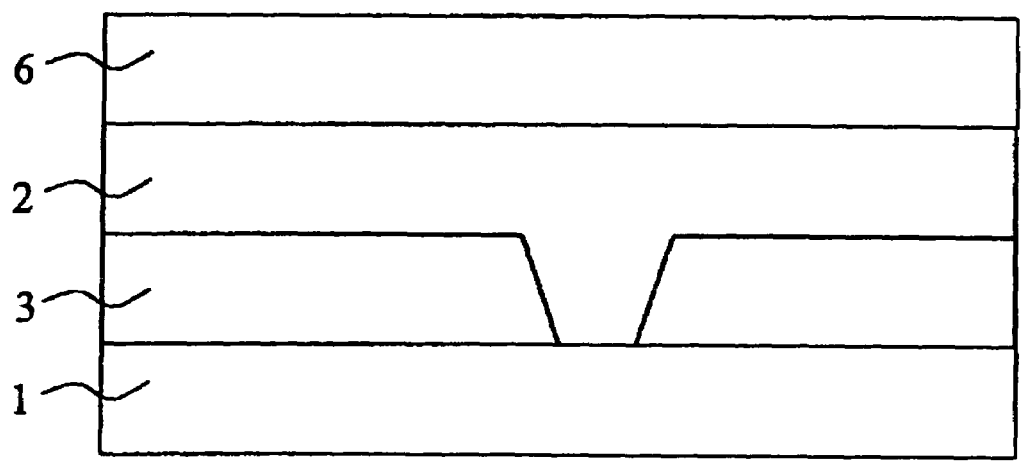
Figure 62:
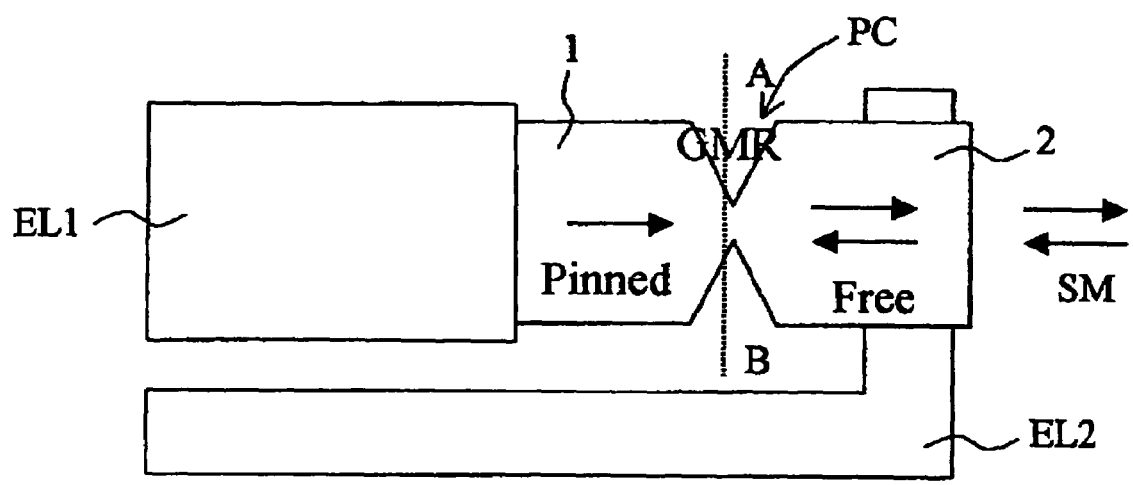
Figure 64:
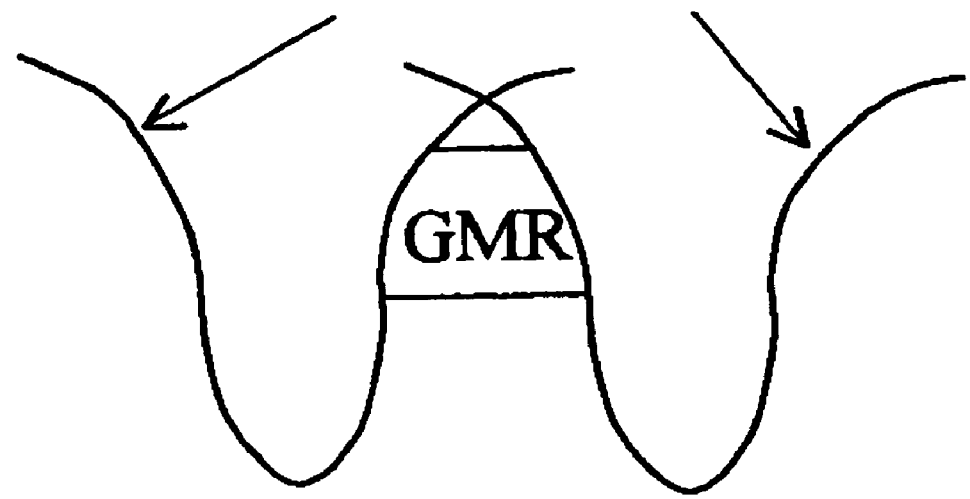
Figure 65:
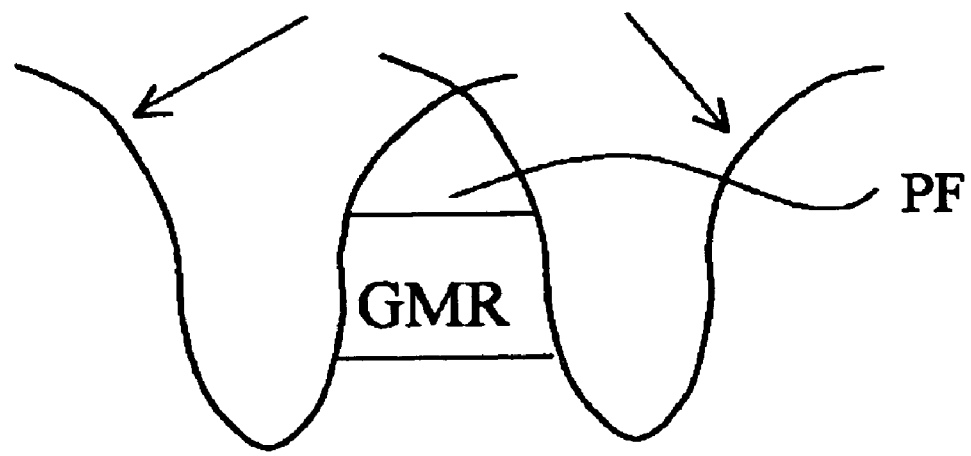
Figure 66:
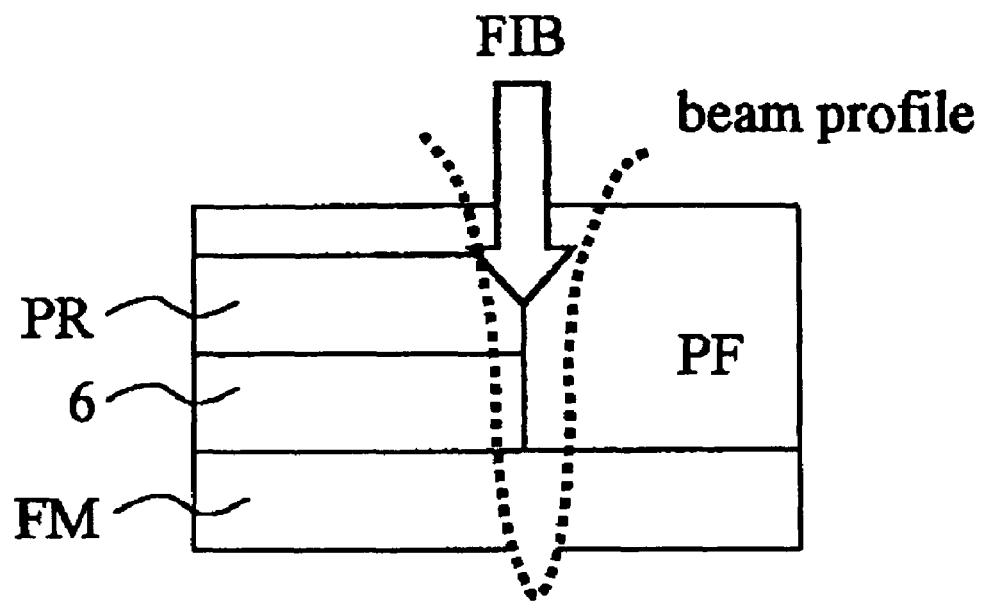
Figure 67:
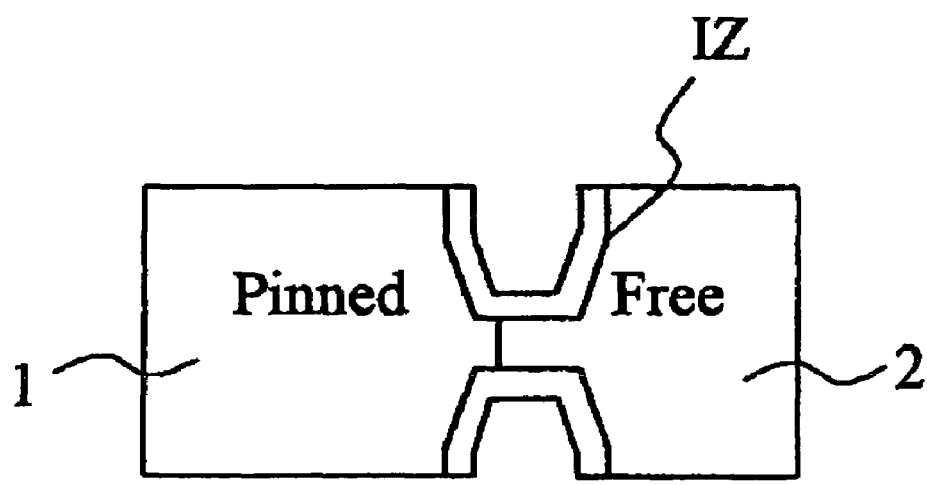

FIGS. 1A and 1B are diagrams that roughly illustrate cross-sectional structures of substantial parts of magnetoresistance effect elements according to an embodiment of the invention;

FIGS. 2A through 2D are schematic diagrams for explaining a relation between an applied magnetic field and the electric resistance;

FIGS. 3A and 3B are schematic diagrams for explaining changes of magnetoresistance by a typical anisotropic magnetoresistive effect;

FIGS. 4A through 4F are diagrams that roughly show properties of magnetoresistance effect elements according to an embodiment of the invention in comparison with properties of conventional magnetoresistance effect elements;

FIGS. 5A through 5D are diagrams that roughly illustrate magnetoresistance effect elements having a plurality of nanocontacts;

FIGS. 6A through 6C are diagrams roughly illustrating cross-sectional forms of openings of nanocontacts;

FIGS. 7A and 7B are diagrams that roughly illustrate magnetoresistance effect elements each locating a region D added with a different kind of element near the opening end of a nanocontact A;

FIGS. 8A through 8D are cross-sectional views of the substantial part of a magnetoresistance effect element according to an embodiment of the invention under a manufacturing process;

FIG. 9 is a cross-sectional view of a structure having an arrangement of a plurality of magnetoresistance effect elements on a common substrate (not shown);

FIGS. 10A through 10C are diagrams that roughly show specific examples using magnetoresistance effect elements according to an embodiment of the invention as magnetic reproducing elements;

FIGS. 11A through 11C are diagrams that roughly show other specific examples using magnetoresistance effect elements according to an embodiment of the invention that monitor resistance AR;

FIG. 12 is a schematic diagram roughly illustrating a cross-sectional structure of the substantial part of a magnetic memory device using magnetoresistance effect elements according to an embodiment of the invention;

FIGS. 13A through 13B are diagrams roughly illustrating access means to individual recording/reproducing cells 10;

FIGS. 14A through 14D are diagrams that roughly show cross-sectional structures of magnetoresistance effect elements 10 that are used in the magnetic memory device of FIG. 12;

FIGS. 15A through 15H are diagrams roughly showing cross-sectional structures of magnetoresistance effect elements 10 that are used in the magnetic memory device of FIG. 12;

FIGS. 16A through 16E are cross-sectional views that roughly show other specific examples of magnetoresistance effect element usable in the magnetic memory device of FIG. 12;

FIGS. 17A and 17B are graph diagrams that show changes in distance between the top surface of a ferromagnetic layer 1 and the tip portion of a needle 110 and changes in current flowing between them, respectively, with time, when the needle 110 is thrust at a constant speed;

FIG. 18 is a graph diagram showing a relation between applied magnetic field and electrical resistance in a magnetoresistance effect element according to an embodiment of the invention;

FIGS. 19A and 9B are diagrams roughly showing a cross-sectional structure of a substantial part of a magnetoresistance effect element experimentally prepared as the fourth example of the invention;

FIG. 20 is a diagram roughly showing a cross-sectional structure of a substantial part of a magnetoresistance effect element experimentally prepared in an embodiment of the invention;

FIG. 21 is a diagram roughly showing a cross-sectional structure of a substantial part of a magnetoresistance effect element prepared in an example of the invention;

FIG. 22 is a graph diagram showing changes of magnetoresistance of a magnetoresistance effect element according to an example of the invention;

FIG. 23 is a diagram roughly showing a cross-sectional structure of an element formed in the seventh example of the invention, viewed from a medium 200;

FIG. 24 is a diagram roughly showing an array connection of a plurality of probes via transistors TR;

FIGS. 25A through 25C are diagrams roughly showing plan-viewed configurations of a $SiO_2$ layer 3 that changes with growth time;

FIG. 26 is a graph diagram showing growth time of a $SiO_2$ layer on the abscissa and MR ratio on the ordinate;

FIG. 27 is a diagram roughly illustrating a method used in the tenth example of the invention;

FIG. 28 is a diagram roughly showing a process of fabricating a magnetoresistance effect element;

FIGS. 29A and 29B are diagrams roughly showing an example of forming a Nb film 400;

FIGS. 30A through 30C are cross-sectional views roughly showing a process of forming a nanocontact;

FIGS. 31A through 31C are cross-sectional views roughly showing continuous part of the process shown in FIGS. 30A through 30C;

FIGS. 32A through 32C are cross-sectional views roughly showing another process of forming a nanocontact;

FIG. 33 is a diagram roughly showing an aspect of milling with oblique angle of incidence;

FIGS. 34A through 34C are cross-sectional views roughly showing a manufacturing process of a magnetoresistance effect element taken as an example of the invention;

FIGS. 35A through 35C are cross-sectional views roughly showing a manufacturing process of a magnetoresistance effect element taken as another example of the invention;

FIGS. 36A through 36C are cross-sectional views roughly showing a manufacturing process of a magnetoresistance effect element taken as another example of the invention;

FIGS. 37A through 37C are cross-sectional views roughly showing a manufacturing process of a magnetoresistance effect element taken as another example of the invention;

FIGS. 38A through 38C are diagrams roughly showing different results of spot irradiation of electron beams;

FIG. 39 is a diagram roughly illustrating the position for EB irradiation relative to the device center C;

FIG. 40 is a diagram that roughly illustrates configuration of a device;

FIGS. 41A and 41B are diagrams that roughly show a process of local annealing;

FIG. 42 is a diagram roughly illustrating an MR element having some growth axes;

FIGS. 43A and 43B are diagrams roughly showing a process of uniforming orientation of crystal grains;

FIGS. 44A and 44B are cross-sectional views roughly showing an annealing process inserted in the film-stacking process;

FIGS. 45A and 45B are cross-sectional views roughly showing an annealing process executed after the film-stacking process;

FIGS. 46A through 46C are cross-sectional views roughly showing a process of removing damage produced in the boring process;

FIGS. 47A and 47B are cross-sectional views roughly illustrating a method of making micro through holes;

FIGS. 48A and 48B are cross-sectional views roughly showing a method of preventing over-etching;

FIGS. 49A through 49C are cross-sectional views roughly showing a process of making a micro through hole by sequentially using different ways of etching;

FIGS. 50A through 50C are cross-sectional views roughly showing a technique for minimizing unintended removal of the insulting layer;

FIGS. 51A through 51C are cross-sectional views roughly showing a technique using FIB;

FIG. 52 is a diagram roughly showing a model using a spacer layer;

FIGS. 53A through 54D are diagrams roughly showing a process taken as a further example;

FIG. 55 is a schematic diagram for explaining a process using a reducing reaction, taken as a further example;

FIG. 56 is a diagram roughly showing an alternative of the process shown in FIG. 55;

FIG. 57 is a diagram roughly showing another process using reduction;

FIGS. 58A and 58B are rough diagrams for explaining a process using oxidation;

FIG. 59A is a diagram roughly showing a structure including a spacer layer to explain functions of the spacer layer;

FIG. 59B is a diagram roughly showing an aspect of the spacer layer partly removed by etching;

FIG. 59C is a diagram roughly showing an aspect of the spacer layer partly removed by etching;

FIGS. 60A and 60B are diagrams roughly showing an aspect of the upper spacer layer 4 and the upper magnetic layer 2 stacked;

FIGS. 61A through 61C are diagrams roughly showing a process of burying the contact through hole with a magnetic material;

FIG. 62 is a diagram roughly showing a magnetoresistance effect element in which electricity is applied in parallel to the film plane;

FIGS. 63A through 63D are diagrams roughly illustrating a process of fabricating the magnetoresistance effect element shown in FIG. 62;

FIG. 64 is a diagram roughly showing a rounded shape of the magnetic layer in relation with the beam profile;

FIG. 65 is a diagram roughly showing a process using a protective film PF;

FIG. 66 is a diagram roughly showing a process additionally using a photo resist; and FIG. 67 is a diagram roughly showing a process capable of substantially narrowing a contact.

DETAILED DESCRIPTION

Some embodiments of the invention will now be explained below with reference to the drawings.

FIGS. 1A and 1B are schematic diagrams that illustrate cross-sectional structures of substantial parts of magnetoresistance effect elements according to an embodiment of the invention.

In the magnetoresistance effect element according to this embodiment, an insulating layer 3 having a micro through hole A is formed on a first ferromagnetic layer 1, either directly or indirectly, on a substrate S, and a second ferromagnetic layer 2 is formed to bury the micro through hole A.

The width of the micro through hole A opening is preferably not larger than 20 nm at the narrowest portion as explained later in greater detail. If the opening shape of the micro through hole A is circular, the "opening width" means its diameter. If the opening shape is polygonal, it means the longest of its diagonals. If it has an isometric shape, such as a flat circle, it means the longest of its opening widths.

The insulating layer 3 has a through hole of a conical, circular, pyramidal, columnar or prismatic shape, or any other appropriate shape, toward the first ferromagnetic layer 1, and a part of the through hole forms the micro through hole A. In one of the preferred embodiments of the invention, the micro through hole A is located near the first ferromagnetic layer.

That is, the magnetoresistance effect element shown here has a magnetic nanocontact that brings the first ferromagnetic layer 1 and the second ferromagnetic layer 2 into contact at the micro through hole A.

Further, the ferromagnetic layers 1, 2 function as electrodes, or electrodes are provided separately and connected to them. The electric resistance obtained between the ferromagnetic layers 1, 2 by application of a current between the electrodes changes with regard to the relative magnetization arrangement.

That is, when the opening width of the magnetic nanocontact formed at the micro through hole A decreases to 20 nm or less, the through hole functions as a generating point of an ultra-thin magnetic wall. Then, the relative magnetic arrangement between the ferromagnetic layers 1 and 2 can be changed by applying an external magnetic field to either one of the ferromagnetic layers 1 and 2, and this change cause a change in the electric resistance between the first and second ferromagnetic layers 1 and 2.

Relative to the magnetoresistance effect element shown here, the electric resistance basically decreases with the magnetic field in both magnetic directions over a certain magnetic field range. Therefore, the magnetoresistive effect generated here can be regarded to be a magnetoresistive effect generated by the magnetic wall formed by the nanocontact. This magnetic wall functions as a transition region between two portions having a different magnetization direction relative to each other. In this magnetoresistance effect element, a magnetoresistive effect as large as 20% or more is generated depending on the magnitude of the applied magnetic field.

FIGS. 2A through 2D are schematic diagrams for explaining a relation between an applied magnetic field and the electric resistance. FIGS. 2A and 2C are graph diagrams that demonstrate changes of electric resistance obtained by applying a magnetic field in parallel to the film plane of the ferromagnetic layer 1 or 2 when the opening width of the micro through hole A, i.e. magnetic nanocontact, is 20 nm or less. Similarly, FIGS. 2B and 2D are graph diagrams that demonstrate changes of electric resistance obtained by applying a magnetic field perpendicularly to the film plane of the ferromagnetic layer 1 or 2 when the opening width of the micro through hole A is 20 nm or less. FIGS. 2A through 2D are shown for the most simple basic structure which does not include an exchange bias film. Also these figures show the case where the easy axis of magnetization of the element lies in parallel to the film plane.

As apparent from these graph diagrams, when the opening width of the micro through hole A is 20 nm or less, in a certain range of the magnetic field, electric resistance basically decreases with the applied magnetic field irrespectively of the direction of the magnetic field. When the magnetic field is applied in a direction of a hard axis of magnetization, the resistance decrease may not be as clear because the change is very small.

When the opening width of the magnetic nanocontact becomes larger than 20 nm, the ordinary anisotropic magnetoresistance effect becomes noticeable. That is, electric resistance varies in accordance with the direction of the magnetic field applied.

FIGS. 3A and 3B are schematic diagrams for explaining changes of magnetoresistance by such a typical anisotropic magnetoresistive effect. In the case of such an anisotropic magnetoresistive effect, if the magnetic field is applied perpendicularly relative to the current, that is, in parallel to the film plane of the ferromagnetic layer 1 or 2, electric resistance slightly decreases due to application of the magnetic field as shown in FIG. 3A.

On the other hand, if the magnetic field is applied in parallel to the current, i.e. perpendicular to the film plane of the ferromagnetic layer 1 or 2, magnetization is not easily saturated with respect to the magnetic field, and as shown in FIG. 3B, although the gradient of the magnetic field is small, electric resistance rises in response to application of the magnetic field. However, as appreciated from FIGS. 3A and 3B, when the element exhibits an ordinary anisotropic magnetoresistive effect, the magnetoresistance ratio hits a peak at several %.

In contrast, in the magnetoresistance effect element according to the embodiment of the invention, electric resistance changes greatly with regard to the magnetic field regardless of the direction of the magnetic field applied as shown in FIGS. 2A through 2D, and moreover, the magnetoresistance ratio is remarkably large.

The reason why the magnetoresistance effect element according to the invention exhibits a larger magnetoresistance ratio than conventional magnetoresistance effect elements is explained below.

FIGS. 4A through 4F are diagrams that show properties of magnetoresistance effect elements according to the embodiment of the invention in comparison with properties of conventional magnetoresistance effect elements.

Figure 4A:
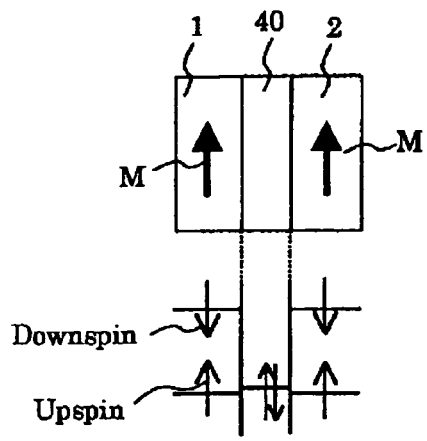
Figure 4B:
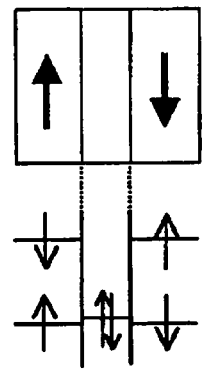
Figure 4C:
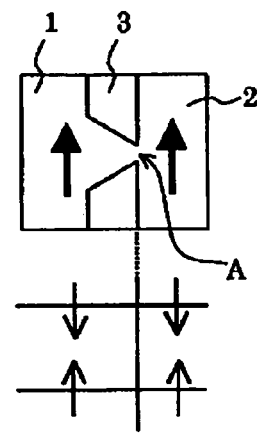
Figure 4D:
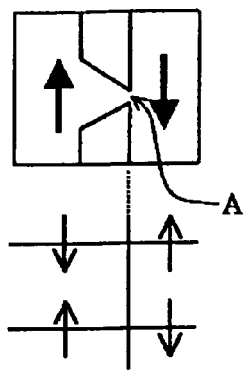
Figure 4E:
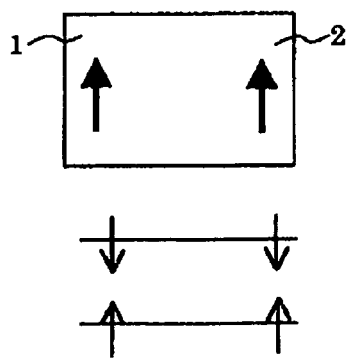
Figure 4F:
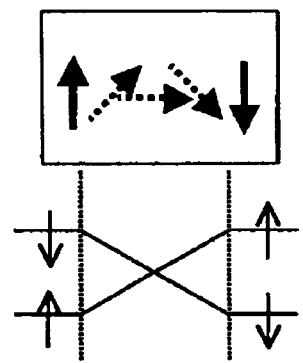

FIGS. 4A through 4F contain schematic diagrams of elements together with indication of magnetization directions in upper parts, and corresponding potential diagrams in lower parts. FIGS. 4A and 4B are those of CPP type magnetoresistance effect elements, FIGS. 4C and 4D are those of magnetoresistance effect elements having nanocontacts according to embodiments of the invention, and FIGS. 4E and 4F are those of magnetoresistance effect elements not having nanocontacts, for parallel magnetization arrangement and anti-parallel magnetization arrangement.

Using these schematic drawings, an explanation is presented below as to electron flow from the ferromagnetic layer 1 to the ferromagnetic layer 2.

In the case of the CPP-MR shown in FIGS. 4A and 4B, an intermediate layer 40 between the ferromagnetic layers 1 and 2 is made of a nonmagnetic material such as copper (Cu). That is, the CPP type MR elements each have a multi-layered structure of cobalt (Co)/copper (Cu)/cobalt (Co). In these CPP type MR elements, if directions of magnetization M are parallel between the ferromagnetic layer 1 and that of the ferromagnetic layer 2, as shown in FIG. 4A, up-spin electrons flow from the ferromagnetic layer 1 via the intermediate layer 40 into the ferromagnetic layer 2. If directions of magnetization M are anti-parallel between the ferromagnetic layers 1 and 2, as shown in FIG. 4B, up-spin electrons having arrived without being scattered upon passing the intermediate layer 40 from the ferromagnetic layer 1 move toward the ferromagnetic layer 2 and are scattered in the ferromagnetic layer 2.

In the case of MR elements according to the embodiment of the invention, if directions of magnetization M are parallel as shown in FIG. 4C, up-spin electrons and down-spin electrons directly flow from the ferromagnetic layer to the ferromagnetic layer 2. If directions of magnetization M are anti-parallel as shown in FIG. 4D, a very thin magnetic wall is formed at the portion of the nanocontact, and directions of magnetization M rapidly change (in FIG. 4D, thickness of the magnetic wall is equivalent to thickness of the drawing line, for example). Therefore, up-spin electrons are scattered in the ferromagnetic layer 2, and downspin electrons are also scattered in the ferromagnetic layer 2. As such, in the case of the MR element according to the embodiment, since both up-spin and down-spin electrons are scattered, a magnetoresistive effect larger than those of the CPP-MR elements shown in FIGS. 4A and 4B can be obtained.

As will be explained later in detail, the inventors have found that a large magnetoresistance effect can also be obtained in the case where an additive element is introduced into the connecting portion at the through hole. In this case, since the thickness of the layer where the additive element is incorporated is very small, the existence of the additive element can be neglected in the above-explained mechanism shown in FIGS. 4C and 4D.

On the other hand, if the nanocontact has a size exceeding 20 nm, if directions of magnetization M are anti-parallel, the magnetic wall between them becomes very thick, and makes it difficult for electrons to hold spin information even after passing therethrough. As a result, it becomes difficult to obtain the magnetoresistive effect derived from the change in direction of magnetization M.

This is the reason why the magnetoresistance effect element according to the embodiment of the invention exhibits a very large magnetoresistance ratio.

In the embodiment of the invention, since a multi-layered structure is used as the element structure for easier control of magnetization M of the ferromagnetic layers 1, 2, the state of magnetization shown in FIG. 4D can be easily realized.

Consequently, although the magnetoresistance effect element according to the embodiment of the invention decreases in electric resistance upon application of a magnetic field, if any hysteresis exists, the resistance maximum may shift slightly from the zero magnetic field as shown in FIG. 2A. Alternatively, the resistance may drop when the magnetic field is around zero. In both cases, once the resistance maximum is exceeded by applying the magnetic field, the electric resistance decreases until all directions of magnetization of the element are aligned in parallel by further application of a magnetic field.

Turning back to FIGS. 1A and 1B, in the magnetoresistance effect element according to this embodiment of the invention, the ferromagnetic layers 1 and 2 sandwiching the nanocontact have a film-like plane for easier control of the magnetic domain. In this manner, it is possible to make the magnetization distribution profile uniform, thereby sharply keep the width of the magnetic wall between this and the other ferromagnetic layers connected at the nanocontact, and, accordingly, obtain a large magnetoresistance ratio.

However, the ferromagnetic layer 1 and the insulating layer 3 need not be a strictly flat layer, but may have small undulations or curves as shown in FIG. 1B.

Furthermore, in the embodiment of the invention, a plurality of nanocontacts may be provided as shown in FIGS. 5A through 5D. When a plurality of nanocontacts are used, although the MR value decreases, "fuctuation" of MR value among elements can be reduced as compared with the model having a single nanocontact, and stable MR characteristics can be easily reproduced.

Figure 5A:
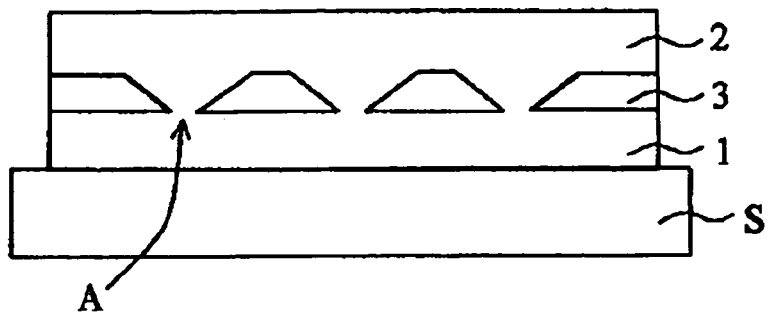
Figure 5B:
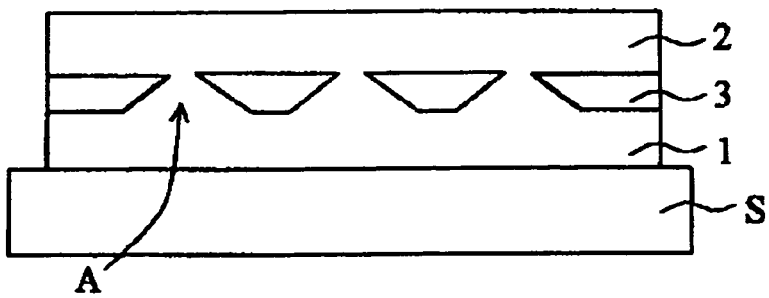
Figure 5C:
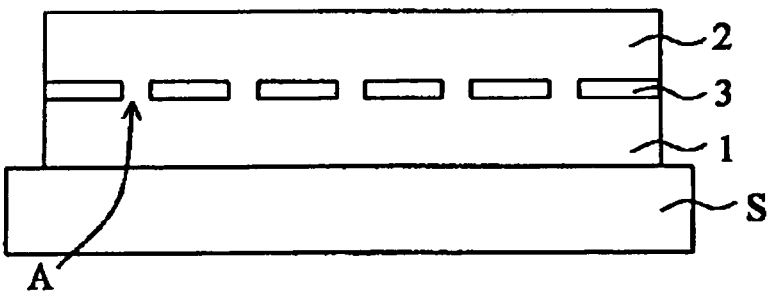

The opening configuration of each nanocontact may be bowl-shaped as shown in FIGS. 5A and 5B, or may define a spherical convex shape formed on the flat ferromagnetic layer 1 as shown in FIG. 6A. Alternatively, it may be a vertical wall surface as shown in FIG. 6B. Alternatively, as shown in FIG. 6C, it may define spherical surfaces convex into both ferromagnetic surfaces 1 and 2.

The insulating layer 3 encircling the magnetic nanocontact may be made of a polymer, or an oxide, nitride or fluoride containing at least one element among aluminum (Al), titanium (Ti), tantalum (Ta), cobalt (Co), nickel (Ni), silicon (Si), iron (Fe), zirconium (Zr) and hafnium (Hf). Alternatively, the insulating layer 3 may be made of a compound semiconductor having a high resistance such as aluminum arsenide (AlAs).

The ferromagnetic layers 1, 2 may be made of a softmagnetic material such as an element among iron (Fe), cobalt (Co), nickel (Ni), etc., an alloy containing at least one element among iron (Fe), cobalt (Co), nickel (Ni), manganese (Mn) and chromium (Cr), a NiZr-family alloy called "Permalloy", a CoNbZr-family alloy, a FeTaC-family alloy, a CoTaZr-family alloy, a FeAlSi-family alloy, a FeB-family alloy, a CoFeB-family alloy, or the like, or a half-metal magnetic material such as a Heusler alloy, $CrO_2$, $Fe_3O_4$, or $La_{1-x} Sr_x MnO_3$. Alternatively, the ferromagnetic layers 1, 2 may be made of a compound semiconductor or oxide semiconductor containing at least one magnetic element among iron (Fe), cobalt (Co), nickel (Ni), manganese (Mn) and chromium (Cr), such as (Ga, Cr)N, (Ga, Mn)N, MnAs, CrAs, (Ga, Cr)As, Zn O:Fe, (Mg, Fe). Any of these materials having a magnetic property suitable for the intended use and may be selected.

The ferromagnetic layer 1 and 2 may be made of a single film, or may have a multi-layered structure including a plurality of ferromagnetic layers. For example, the soft magnetic layer may have a dual film structure including CoFe layer and permalloy layer. As such, an appropriate combination of various films may be selected with regard to the each application.

The ferromagnetic layer 1 and 2 may be made of the same material or different materials.

An anti-ferromagnetic layer or a multi-layered film of nonmagnetic layer/ferromagnetic layer/anti-ferromagnetic layer may be additionally provided adjacent to the ferromagnetic layer 1 or 2 to fix the direction of magnetization of the ferromagnetic layer 1 or 2 and to control the response of the magnetoresistance effect element relative to the magnetic field. As the anti-ferromagnetic material for this purpose, FeMn, PtMn, PdMn, PdPtMn, or the like, are useful.

To obtain a desired value by controlling the element resistance, it is useful to place a slight amount of conductor or semiconductor, or a different kind of element having the nature of an insulator, near the opening portion of the nanocontact.

FIGS. 7A and 7B are schematic diagrams that illustrate such magnetoresistance effect elements. In these specific examples, a region D containing an additive element of a different kind is provided near the opening end of the micro through hole A. In this case, the magnetoresistance ratio may be sacrificed more or less; however, the resistance can be adjusted to a value the system using the magnetoresistance effect element requires. The region D including the additive element may be formed in a layer. In this case, the thickness of the layer D at the through hole A may preferably be in a range larger than zero atomic layer and not larger than ten atomic layers.

By incorporating such an additive element, the exchange coupling between the ferromagnetic layers 1 and 2 can be cut off, and it becomes easy to control the magnetic domain structure. Further, by adding such an additive element, the substantial size of the through hole A may be reduced and the magnetoresistance effect obtained with the nanocontact may become more efficient.

As the additive element, noble metals, oxides, complex compounds including oxide, or other elements which act as so-called "surfactant" for the growth of the magnetic layer can be used.

As the noble metal, metals such as copper (Cu), gold (Au) or silver (Ag) may be used. As the oxide, oxides such as Ni—O, Fe—O, Co—O, Co—Fe—O, Ni—Fe—O, Ni—Fe—Co—O, Al—O or Cu—O may be used. As the complex compound, compounds such as Al—Cu—O may be used. As the surfactant, surfactants such as antimony (Sb) or tin (Sn) may be used.

The magnetoresistance effect element according to the embodiment of the invention can be easily manufactured and reliably formed into a device as compared with conventional magnetoresistance effect elements using nanocontacts. A method of producing the magnetoresistance effect element according to the embodiment of the invention will be explained below.

Figure 8A:

FIGS. 8A through D8 are cross-sectional views of stages of manufacturing the substantial part of a magnetoresistance effect element.

First, referring to FIG. 8A, the ferromagnetic layer 1 is formed on a substrate (not shown) directly or indirectly via a single layer, such as a buffer layer or a plurality of such layers, not shown, and the insulating layer 3 is formed thereon. The insulating layer 3 may be formed by deposition or precipitation of a different kind of material on the ferromagnetic layer 1, or by changing the nature of the surface layer of the ferromagnetic layer 1 by oxidation, nitrification or fluoridation, for example.

Figure 8B:
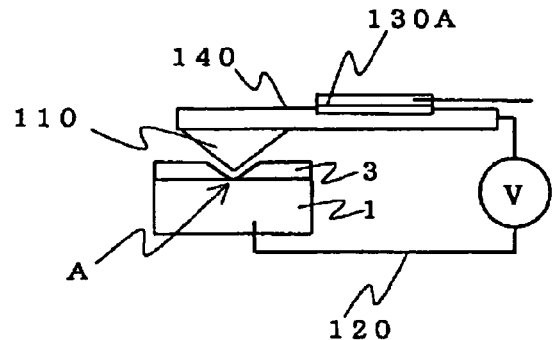
Figure 8C:
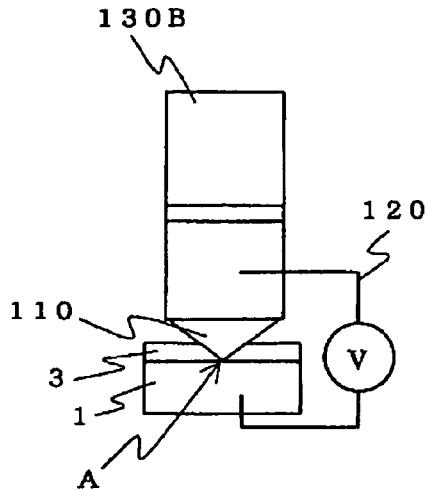

Next, as shown in FIGS. 8B and 8C, an electrically conductive needle 110 having a tip in the form of a ball with a curvature radius in the range from 5 to 1000 nm, cone or pyramid is brought into contact, and a pressure is applied to form the micro through hole A in the insulating layer 3. In this process, a predetermined voltage is applied to a conductive wire 120 formed between the needle 110 and the magnetic layer, and the needle 110 is thrust until the current flowing in the conductive wire 120 reaches a predetermined value. That is, by monitoring the current flowing between the needle 110 and the ferromagnetic layer 1 upon thrusting the needle 110 into the insulating layer 3, the opening width of the micro through hole A is controlled. When the current reaches the predetermined value, the needle 110 is moved back in the opposite direction and removed out of the surface of the insulating layer 3. The needle 110 is driven by a distance-changing functional portion 130A (130B) as shown in FIGS. 8B and 8C. The distance-changing functional portion 130 functions to move the needle 110 vertically of the sample surface. For this purpose, there is the method of curving an arm as shown in FIG. 8B, or the method of moving it vertically as shown in FIG. 8C, for example.

In the case of the curving method shown in FIG. 8B, the needle 110 is attached to an arm 140 extending in parallel to the sample surface, and the distance-changing functional portion 130A located on and under the arm 140 is expanded or contracted to curve the arm 140, thus the height of the needle 110 can be changed. The distance-changing functional portion 130A may be a film that thermally expands upon a temperature change caused by heating with electricity. When such heating with electricity is employed, an appropriate insulator is required between the distance-changing functional portion 130 and the arm 140.

In the case of the vertical movement method shown in FIG. 8C, a distance-changing functional portion 130B such as a piezo element may be formed above the needle 110 such that the position of the needle 110 can be controlled by the voltage applied to the piezo element.

Alternatively, a piezo element can be used as the distance-changing functional portion 130A shown in FIG. 8B. In this case, the curving of the arm 140 is controlled by applying a voltage to the piezo element.

The through hole formed by using such a mechanism capable of controlling the minute distance basically has a predetermined diameter at the narrowest portion, and defines spherical, conical, pyramidal, or other configuration copying the needle 110.

In this manner, the micro through hole for obtaining desired conductance is formed and is shaped conical, circular or pyramidal in accordance With the tip configuration of the needle 110.

Figure 8D:
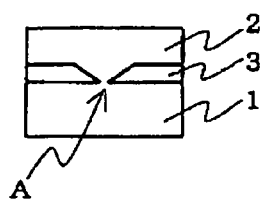

In the next step, as shown in FIG. 8D, the ferromagnetic layer 2 is deposited toward the through hole. As a result, the ferromagnetic layers 1 and 2 connect to each other with small conductance at the desired micro through hole A. Thereafter, annealing may be carried out if necessary. When the magnetoresistance effect element thus formed is used, electrodes are provided for respective ferromagnetic layers to enable their powering.

Through the method explained above, the magnetic nanocontact excellent in reproducibility and controllability is formed between the ferromagnetic layers 1, 2. Typical values of the voltage applied upon thrusting the needle 110 are in the range of 0.01 through 10V, the predetermined current range is from 0.05 .mu.A to 100 mA, and the minimum opening width of the conical, circular or pyramidal through hole of the insulator is in the range from, 0.1 to 50 nm. The opening width of the micro through hole is preferably limited within 0.1 to 20 nm.

The material used for the needle 110 is preferably harder than the insulating layer 3 and electrically conductive. For example, conductive diamond, hard metal or silicon (Si) with or without a coating of conductive diamond may be used.

The insulating layer 3 prior to formation of the magnetic nanocontact is preferably as thin as possible within the range ensuring the function as the insulating layer 3. More specifically, the range from 0.5 to 50 nm is preferable. The thickness of the ferromagnetic layer 1 and 2 may be determined appropriately depending upon the intended use. The ferromagnetic layer 1 may be a sufficiently thick bulk-shaped layer.

According to the embodiment of the invention, as shown in FIG. 9, the structure having an array of a plurality of magnetoresistance effect elements on a common substrate (not shown) can be easily formed. This kind of structure is applicable to, for example, a patterned medium that will be explained later in greater detail.

The magnetoresistance effect element according to the embodiment of the invention has the structure ready for making a device, and it is therefore employable for various purposes of use.

First, the magnetoresistance effect element can be used as a reproducing element in a magnetic recording system. Since the use of the magnetoresistance effect element according to the embodiment ensures a magnetoresistance ratio as large as 20% or more, high reproduction sensitivity can be obtained.

FIGS. 10A through 10C are schematic diagrams that show specific examples using magnetoresistance effect elements according to the embodiment of the invention as magnetic reproducing elements.

In the case of the specific example shown in FIG. 10A, the ferromagnetic layer 2, insulating layer 3 and ferromagnetic layer 1 of the magnetoresistance effect element serially appear on the path of the magnetic flux released from the surface of the magnetic recording medium 200 such that difference between directions of magnetization of the ferromagnetic layers 1, 2 opposed to each other via the magnetic nanocontact formed at the micro through hole A can be detected as a change of magnetoresistance. In this case, as illustrated here, directions of magnetization of these two ferromagnetic layers 1, 2 are preferably put under domain control, if necessary.

In the case of the specific example shown in FIG. 10B, the ferromagnetic layer 2, insulating layer 3 and ferromagnetic layer 1 of the magnetoresistance effect element serially appear in the perpendicular direction relative to the top surface of the magnetic recording medium within the range of error angle about plus and minus 20 degrees. Here again, difference between directions of magnetization of the ferromagnetic layers 1, 2 opposed to each other via the magnetic nanocontact formed at the micro through hole A can be detected as a change of magnetoresistance.

In this case, magnetization M of the ferromagnetic layer 1 remoter from the recording medium 200 is preferably pinned in a direction within plus and minus 20 degrees from the perpendicular direction relative to the top surface of the recording medium 200. For pinning the magnetization, a method of introducing a strong shape magnetic anisotropy, a method of providing an anti-ferromagnetic layer next to it and introducing unidirectional anisotropy, or the like, may be employed.

Direction of magnetization M of the ferromagnetic layer 2 nearer to the recording medium 200 is designed to be switchable by the magnetic flux from the medium 200. In this manner, a signal from the recording medium 200 can be detected from the angle made by the ferromagnetic layers 1, 2 and magnetization M.

When the magnetoresistance effect element according to the embodiment is used, high sensitivity is obtained, and the surface opposed to the recording medium 200 can be readily formed and processed because distance from the medium 200 to the magnetic nanocontact A can be determined basically by adjusting the thickness of the ferromagnetic layer 2. When the medium-opposed surface opposed to the recording medium 200 is easy to process, it is also possible to locate the ferromagnetic layer 1 nearer to the recording medium 200 as shown in FIG. 10C.

FIGS. 11A and 11B are schematic diagrams that show other specific examples using magnetoresistance effect elements according to an embodiment of the invention as magnetic reproducing elements. In these specific examples shown here, the film surface of the magnetoresistance effect element is oriented perpendicularly to the medium 200. The micro through hole A is out of a center of symmetry in a major plane of the insulating layer 3 toward the medium 200. Since the signal magnetic field becomes larger as the distance from the medium decreases, this structure is advantageous for increasing the detection efficiency of the magnetic field of the free layer 2.

The ferromagnetic layer 2 serving as a magnetization sensitive layer (free layer) may be a single layer as shown in FIG. 11A, or a two-layered film as shown in FIG. 11B. In case of the specific example shown in FIGS. 11A, the ferromagnetic layer 1 forms a "pinned layer" pinned in the direction of magnetization. The ferromagnetic layer (pinned layer) 1 may be a multi-layered structure stacked, sequentially from the nearest to the micro through hole A, a magnetic layer and an anti-ferromagnetic layer, or a magnetic layer, nonmagnetic layer, magnetic layer and anti-ferromagnetic layer. In FIG. 11A, the stacked structure is sandwiched by a pair of magnetic shields SH.

In case of the specific example of FIG. 11B, the ferromagnetic layer (pinned layer) 1 may be a multi-layered structure of ferromagnetic layer/anti-ferromagnetic layer/ferromagnetic layer. The ferromagnetic layer 1 may also be a multi-layered structure of ferromagnetic layer/nonmagnetic layer/ferromagnetic layer/anti-ferromagnetic layer/ferromagnetic layer/nonmagnetic layer/ferromagnetic layer.

As shown in FIG. 11B, free layers 2A and 2B are provided through the through hole A at opposite sides of pinned layer 1. These free layers 2A and 2B sense the magnetic signals respectively from the recording medium 200. As shown in FIG. 11C, when the magnetic signals for the free layers 2A and 2B are both upward, the resistance change AR becomes zero since the magnetization direction of the free layers 2A and 2B are the same as the magnetization direction of the pinned layer 1. In contrast, when the magnetic signals for the free layers 2A and 2B are both downward, the resistance change AR becomes 2 (in arbitrary units) since spin scattering occurs between pinned layer 1 and free layer 2A and between pinned layer 1 and free layer 2B, respectively.

When one of the magnetic signals for the free layers 2A and 2B is downward and another is upward, the resistance change AR becomes 1 (in arbitrary unit) since spin scattering occurs only between pinned layer 1 and free layer 2A or between pinned layer 1 and free layer 2B.

Thus, as shown in FIG. 11C, the each case can be distinguished by monitoring the resistance change ΔR.

Therefore, by providing a plurality of free layers, a multi-valued (more than two) resistance change can be realized. In the case of nanocontact MR element according to the embodiment, it becomes easy to realize such a multi-valued recording/reproducing since a resistance change more than 100% can be possible.

The magnetoresistance effect element according to the embodiment is applicable to a so-called "patterned medium". That is, the structure having an array of a plurality of magnetoresistance effect elements as shown in FIG. 9 can be made easily. One of such applications is a magnetic memory device. Another of such applications is a recording medium for a probe-storage system.

FIG. 12 is a schematic diagram illustrating a cross-sectional structure of the substantial part of a magnetic memory device using magnetoresistance effect elements according to an embodiment of the invention.

As illustrated, the magnetic memory device according to the embodiment of the invention has the structure including a parallel alignment of a plurality of magnetoresistance effect elements 10 on an electrode layer 20. The magnetoresistance effect elements are electrically isolated from each other by an insulating layer 30, and each has the role of a recording/reproducing cell.

To access to each recording/reproducing cell 10, a conductive probe PR as an upper electrode may be used as shown in FIG. 13A, or a fixed wiring WR may be used as shown in FIG. 13B. In the model using the fixed wiring WR, it contacts the cell 10. However, in the model using the conductive probe PR, it may be either contacted or uncontacted with the cell 10. In case the probe PR does not contact the cell, a tunneling current flowing between it and the cell 10 enables probing.

FIGS. 14A through 15H are schematic diagrams that show cross-sectional structures of magnetoresistance effect elements 10 that can be used in the magnetic memory device of FIG. 12. Any of the magnetoresistance effect element of FIGS. 14A through 14D and those of FIGS. 15A through 15H has a structure forming a magnetic layer on the second ferromagnetic layer 2 via a nonmagnetic layer 4. Further, a pair of electrodes are connected to both sides of the stacked structure. Each magnetoresistance effect element functions for both recording and reproduction. That is, recording is enabled by supplying a current of a predetermined magnitude to the magnetoresistance effect element in a predetermined direction, and a signal of the cell can be read from a resistance value measured by supplying a weaker current.

Figure 14A:
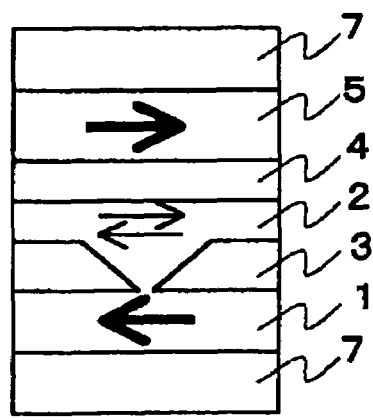
Figure 14B:
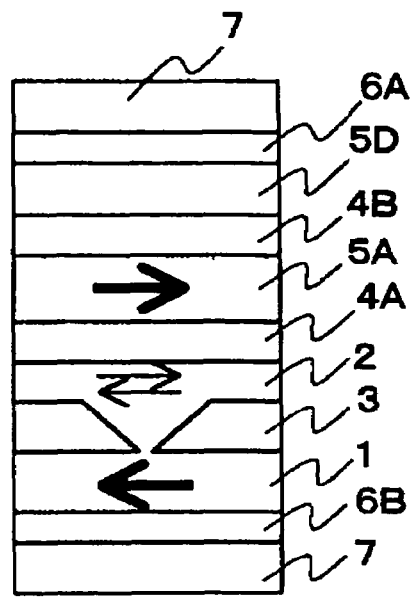

The cell shown in FIG. 14A has a structure in which a nonmagnetic intermediate layer 4 and a ferromagnetic layer 5 are stacked on the second ferromagnetic layer 2. The first ferromagnetic layer 1 and the ferromagnetic layer 5 are fixed in magnetization M (shown by the arrow) beforehand such that directions of magnetization are anti-parallel. Magnetization in anti-parallel directions enables writing with a smaller current as explained later.

When a current is supplied to this kind of multi-layered structure to flow vertically to the film plane, recording and reproduction are enabled using the second ferromagnetic layer as the recording portion. That is, when the current flows through the first ferromagnetic layer 1 or the ferromagnetic layer 5, conduction electrons receive spin information corresponding to the magnetization direction of the magnetic layer. When the electrons enter into the second ferromagnetic layer 2, if the spin direction those electrons have coincides with the spin direction corresponding to the magnetization direction (shown by the arrow) of the second ferromagnetic layer 2, the electrons can easily pass the second ferromagnetic layer 2. However, if they are anti-parallel, the electrons are reflected and cannot easily pass the second ferromagnetic layer 2.

At that time, conductance between the ferromagnetic layer 1, 2 is small, and the change of the magnetoresistance between them is large. On the other hand, conductance between the ferromagnetic layers 2, 5 is large, and the change of magnetoresistance between them is small. Therefore, in the model of FIG. 14A in which they are serially aligned, the former conductance between the ferromagnetic layer 1, 2 is dominant, and the device results in detecting the difference between magnetization directions of the ferromagnetic layers 1, 2. That is, an increase or decrease of the electric resistance is observed in accordance with the magnetization direction of the second ferromagnetic layer 2, and information corresponding to the magnetization direction can be read out.

On the other hand, in case a predetermined amount of current is supplied to flow vertically to the film plane for recording, conduction electrons first receive spin information of magnetization M held by one of the first ferromagnetic layer 1 and the ferromagnetic layer 5 where the electrons first enter. Thereafter, the electrons enter into the second ferromagnetic layer 2. In this case, if a large quantity of electrons enters into the ferromagnetic layer 2, magnetization direction of the second ferromagnetic layer 2 changes in accordance with the spin information those electrons have. That is, direction of magnetization M held by one of the first ferromagnetic layer 1 and the ferromagnetic layer 5 where the electrons first enter tends to be copied to the second ferromagnetic layer (recording layer) 2.

Electrons passing through the ferromagnetic layer 2 receive spin information of the first-passing layer of 1 and 5 in the form of reaction and tend to orient in the opposite direction. Because of these tendencies, magnetization direction can be controlled by adjusting the direction of the current.

Figure 14C:
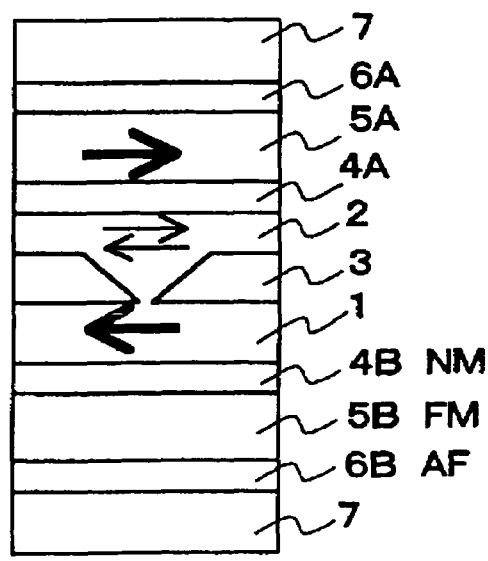
Figure 14D:
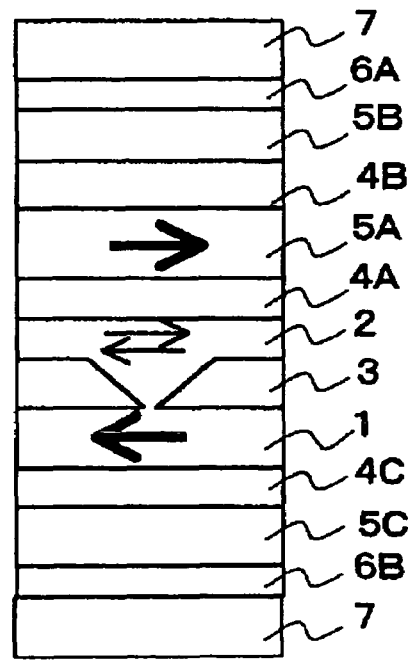
Figure 15A:
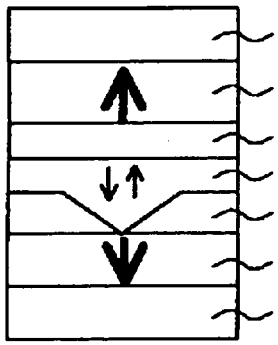
Figure 15B:
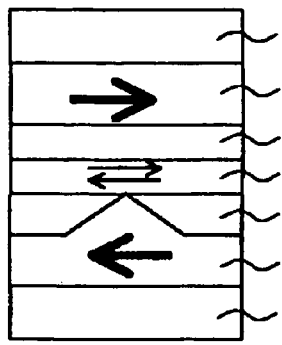
Figure 15C:
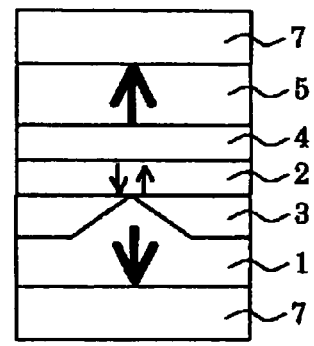

Although FIGS. 14A through 14D show models of parallel-to-plane magnetization, i.e., magnetization directions parallel to the film plane, models of perpendicular magnetization as shown in FIGS. 15A, 15C and 15J ensure the same effects. Also regarding the cross-sectional geometry of the nanocontact, it may be narrowed downward as shown in FIGS. 14 through 14D, upward as shown in FIGS. 15B through 15H, or may have any of other various configurations as shown in FIGS. 6A through 6C.

In the magnetoresistance effect elements shown in FIGS. 14A through 15H, direction of magnetization M (shown by the arrow) of the second ferromagnetic layer (recording layer) 2 changes with the flowing direction of a current above a critical value. This direction of magnetization of the ferromagnetic layer (recording layer) 2 is used to record a signal. The signal can be read from the resistance value appearing when a current lower than the critical current value for writing is supplied.

For this purpose, it is necessary to place the ferromagnetic layers 1 and 5 above and below the second ferromagnetic layer 2 serving as the recording layer and to pin their magnetization M in anti-parallel directions.

FIGS. 14B through 14D and FIGS. 15D through 15H show structures configured to pin their magnetization.

Figure 15D:
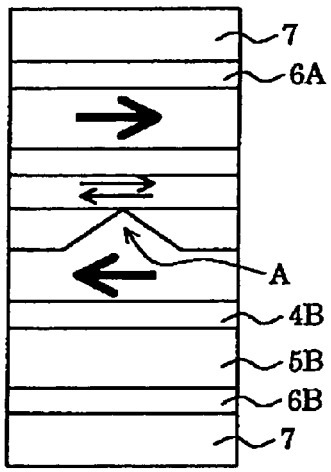
Figure 15E:
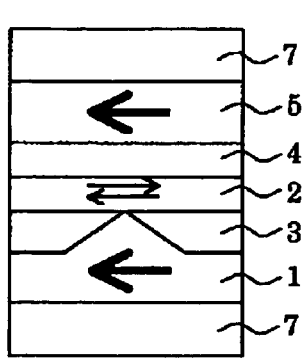
Figure 15F:
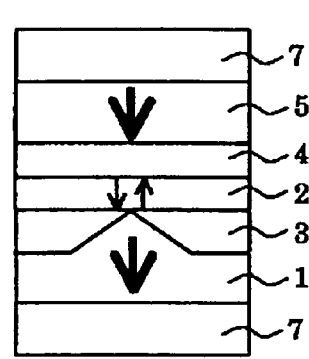

In FIG. 14C, the cell has the structure including a nonmagnetic intermediate layer 4A, ferromagnetic layer 5A, nonmagnetic intermediate layer 4B, ferromagnetic layer 5B, and anti-ferromagnetic layer 6A that are sequentially stacked in the described order on the second ferromagnetic layer 2. The cell further includes an anti-ferromagnetic layer 6B below the first ferromagnetic layer 1. In this manner, the first ferromagnetic layer 1 and the ferromagnetic layer 5 can be pinned in magnetization M. The micro through hole may have its wider opening oppositely arranged as shown in FIG. 15D. In all the cells shown in FIGS. 14A through 15H, there is no up-and-down limitation. Further, direction of magnetization is not limited to parallel-to-plane magnetization, but may be perpendicular-to-plane (perpendicular magnetization) as shown in FIG. 15F.

In the cell of FIG. 14C, the nonmagnetic intermediate layer 4A, ferromagnetic layer 5A and anti-ferromagnetic layer 6A are stacked in the described order on the second ferromagnetic layer 2. The cell further includes the nonmagnetic intermediate layer 4B, ferromagnetic layer 5B and anti-ferromagnetic layer 6B located under the first ferromagnetic layer 1 sequentially from the nearest thereto. Here again, the first ferromagnetic layer 1 and the ferromagnetic layer 5 can be pinned in magnetization, respectively.

In the cell of FIG. 14D, the nonmagnetic intermediate layer 4A, ferromagnetic layer 5A, nonmagnetic intermediate layer 4B, ferromagnetic layer 5B and anti-ferromagnetic layer 6A are stacked in the described order on the second ferromagnetic layer 2. The cell further includes a nonmagnetic intermediate layer 4C, ferromagnetic layer 5C and anti-ferromagnetic layer 6B located under the first ferromagnetic layer 1 sequentially from the nearest thereto. Here again, the first ferromagnetic layer 1 and the ferromagnetic layer 5 can be pinned in magnetization, respectively.

In magnetoresistance effect elements shown in FIGS. 14A through 14D and FIGS. 15A through 15D, magnetization directions of the ferromagnetic layers 1 and 5 are anti-parallel. Due to anti-parallel magnetization directions, spin transmission and an effect of reaction are added, and writing to the recording layer 2 is accomplished efficiently.

Figure 15G:
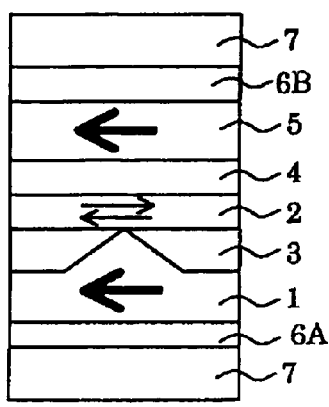
Figure 15H:
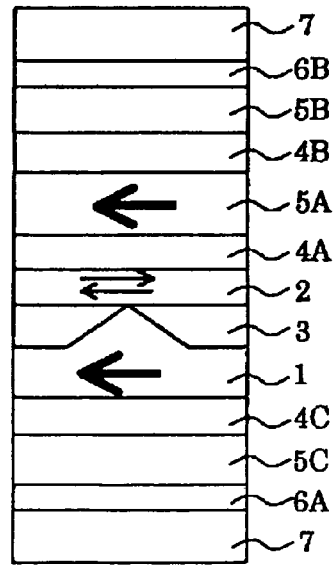

From the viewpoint of easier fabrication, models using parallel magnetization directions of the ferromagnetic layers 1 and 5 as shown in FIGS. 15F through 15H are preferable. Effectiveness of spin transmission operation and reaction vary with the area in contact with the recording layer 2. Therefore, at the cost of slight increase of the reversing current, directions of magnetization of the ferromagnetic layers 1 and 5 can be aligned in parallel. Thus, the number of layers stacked for pinning can be decreased, or the number of steps in the manufacturing process can be reduced.

FIGS. 16A through 16E are schematic cross-sectional views that show other specific examples of magnetoresistance effect elements usable in the magnetic memory device of FIG. 12. In all these specific examples shown here, one of the first and second ferromagnetic layers 1, 2 is magnetically pinned in a predetermined direction, and the other is variable in magnetization direction (shown by the arrow). Additionally, a pair of electrodes 7 are provided outside the first and second ferromagnetic layers (opposite sides remoter from the intermediate layer 3) so as to carry out recording or reproduction by supplying a current from a current supply means to these electrodes 7 by direct or indirect contact such that the current flows through interfaces between every adjacent stacked film.

For pinning the magnetization of the ferromagnetic layer, an anti-ferromagnetic layer may be formed on the outer surface of the magnetic layer, or nonmagnetic/ferromagnetic/anti-ferromagnetic layers may be stacked.

Reproduction and recording can be executed by bringing about spin transmission and reaction effect between the ferromagnetic layers 1 and 2 as explained above by detecting the magnetoresistive effect of the element itself for reproduction and supplying a current larger than the reproducing current for recording. The structures shown in FIGS. 16A through 16E are advantageous in that the structures are very simple, although the device property is somewhat difficult to adjust.

Also in the magnetoresistance effect elements shown in FIGS. 16A through 16E, cross-sectional geometry of the micro through hole is not limited to the illustrated conical shape, but may be modified to a circular, pyramidal, prismatic, spherical or other geometrical shape.

The micro through hole in the insulating layer 3 is preferred to be located between the electrodes 7, 7 which cover the ferromagnetic layers 1 and 2 partly or completely in order to supply the current. Therefore, in the case in which the electrodes 7, 7 cover these layers 1 and 2 partly as shown in FIG. 16E, the micro through hole is set up at an off-center position relative to a center of the element.

EXAMPLES

Herein below, embodiments of the invention will be explained in greater detail in conjunction with examples.

First Example

As the first example of the invention, there is a model of magnetoresistance effect element a magnetic nanocontact on nickel (Ni) covered by alumina.

First of all, for obtaining the multi-layered structure shown in FIG. 8A, aluminum (Al) was deposited by vapor deposition on a ferromagnetic layer 1 made of nickel, and its top surface was oxidized to form alumina as an insulating layer.

After that, a needle 110 coated with conductive diamond and used to form a micro through hole was driven close to the top surface of alumina as shown in FIG. 8B. Then, the voltage of 0.01V was applied across the nickel layer 1 and the needle 110, and while monitoring the flowing current, the needle 110 was driven into the alumina insulating layer 3. Movement of the needle 110 was controlled by making use of thermal expansion caused by electric heating of a distance-changing functional portion 130A attached to an upper portion of the arm 140.

FIGS. 17A and 17B are graph diagrams that show changes in distance between the top surface of the ferromagnetic layer 1 and the tip portion of the needle 110 and changes in current flowing between them with time, when the needle 110 is driven at a constant speed.

In the example shown here, distance was linearly changed with time, but the flowing current increase exponentially. The set current was adjusted to 10A, and when the actual current reached the set current, the curve of the arm 140 supporting the needle 110 was released. Additionally, nickel was deposited by vapor deposition as the ferromagnetic layer 2 to bury the through hole made by the needle 110.

Electrodes were provided in association with the ferromagnetic layers 1, 2 of the magnetoresistance effect element obtained, and its magnetoresistive effect was measured.

FIG. 18 is a graph diagram showing a relation between applied magnetic field and electrical resistance in the magnetoresistance effect element according to the embodiment of the invention. Although more or less hysteresis was observed, resistance substantially decreased when a magnetic field was applied. Resistance at the contact portion of the micro through hole A was approximately 3 kΩ when the magnetic field was zero, and MR ratio as large as 120% was obtained.

Second Example

As the second example of the invention, a reproducing element for magnetic recording was prepared by using the manufacturing method used in the first embodiment explained above.

That is, a thick cobalt (Co) film was formed on the substrate, and alumina was formed thereon. Then, after making the micro through hole A, 20 nm thick Permalloy was deposited by vapor deposition. Part of the Permalloy above the micro through hole A was patterned into an approximately 20×20 nm square, and part of the underlying cobalt layer as large as 100 nm was cut out. A conductive wire was provided thereto, and the magnetoresistance effect element was moved on the surface of the vertically magnetized medium. As a result, a change of resistance corresponding to the change of the medium signal was observed.

Third Example

As the third example of the invention, the magnetic memory device shown in FIG. 12 was prepared.

More specifically, the multi-layered film shown in FIG. 14D was formed on a conductive substrate by using a sputtering apparatus. In the same process, the micro through hole A was also formed.

That is, layers from the anti-ferromagnetic layer 6B to the first ferromagnetic layer 1 were deposited on the electrode layer 20, and a polymer was coated thereon as the insulating layer. Then the micro through hole A was formed, and the second ferromagnetic layer was deposited thereon.

Additionally, layers from the nonmagnetic intermediate layer to the anti-ferromagnetic layer 6A were formed as shown in FIG. 14D. Then a polymer having a phase separation structure was coated thereon, thereby to form a mask for micro fabrication. Its surface is next selectively etched by ion milling to form a patterned medium. Spaced cell patterns were buried with a polymer to smooth the surface.

By supplying a current to one of cells of the patterned medium thus obtained by using a probe as an electrode, a recording and reproducing test was carried out. In this case, the plus direction corresponds to the flowing direction of the current from the top to the bottom in FIG. 14D. Thus the resistance of the cell was measured with the current of 10 μa. At that time, resistance value was 3 kΩ. Additionally, writing was carried out by supplying the recording current of minus 500 μa, and as a result of measurement of the cell resistance here again with the current of 10 μm, resistance value was 7 kΩ.

Although a certain degree of hysteresis was observed, the result demonstrated that current-driven writing and current-driven reading were possible.

Fourth Example

As the fourth example of the invention, magnetoresistance effect elements including an additive element introduced at the through hole were prepared.

Figure 19B:
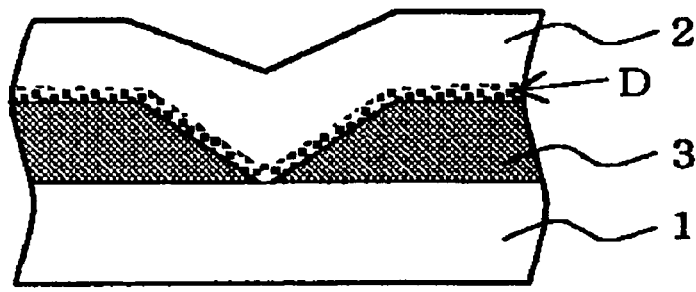

FIGS. 19A and 19B are schematic diagrams showing a cross-sectional structures of the substantial part of a magnetoresistance effect elements experimentally prepared in an embodiment of the invention. As shown in these figures, the layered region D including the additive element was formed on or below the insulating layer 3 in these MR elements.

The inventors have also formed MR elements where an additive element was introduced only at the through hole A as shown in FIG. 7A. The inventors have also formed MR elements where as additive element was not introduced.

In all the MR elements, the deposition process was performed by using an ion beam sputtering system and the etching process was performed by employing an electron beam (EB) reactive etching. The details of the EB reactive etching will be explained with reference to the eleventh example of the present invention.

The intended diameter of the through hole was set to be 10 nm for all samples. The structures of the samples I through V will be explained herebelow.

A sample I has a structure shown in FIG. 19A where three atomic layers of copper (Cu) were inserted as the layered region D. The ferromagnetic layer 1 has a multi-layered structure of PtMn 15 nm/CoFe 4 nm/Ru 1 nm/CoFe 4 nm. This ferromagnetic layer 1 was made to be the pinned layer. As the material of the insulating layer 3, $SiO_2$ was employed. After growing the $SiO_2$ layer having a thickness of 3 nm, the through hole A was formed By incorporating the copper layer as the additive element, the magnetic coupling between the ferromagnetic layers 1 and 2 can be effectively cut off while maintaining the crystallinity at the nanocontact portion. By cutting the magnetic coupling between the ferromagnetic layers 1 and 2, the magnetization of the free layer 2 can shift more freely.

In the conventional MR element, even in the case where an intermediate (spacer) layer of copper is provided, a magnetic coupling between the ferromagnetic layers provided at opposite sides thereof may be inevitable since an exchange interaction can occur therebetween at the thin portion of the copper intermediate layer.

In contrast to this, by employing the magnetic nanocontact according to the embodiment of the invention, the magnetic coupling between the ferromagnetic layers 1 and 2 is effectively cut off since the inter-layer exchange interaction therebetween becomes negligible.

In sample I, the ferromagnetic layer 2 was made of CoFe of 4 nm in thickness. A copper layer (not shown) was deposited on the ferromagnetic layer 2 as a protective film.

Next, a sample II has a structure shown in FIG. 19B, where an alloy layer of copper (Cu) and aluminum (Al) was deposited and oxidized in an oxygen atmosphere to form a Cu—Al—O layer as the layered region D. The ferromagnetic layers 1 and 2 were same as the sample I. The insulating layer 3 was made of $Al_2O_3$.

The Cu—Al—O layer is apt to include high resistive particles which have an aluminum-rich composition and conductive regions which have a copper-rich composition. Therefore, the effective through hole size can be reduced and the resultant magnetoresistance effect becomes even larger.

A sample III has a structure shown in FIG. 7A, where oxygen (O) was introduced by a natural oxidation as the additive element. The basic structure of the sample is same as the sample I except for the additive element and its introduction process. In the case of sample III, the effective through hole size can be reduced by introducing oxygen as the additive element in analogy with the aforementioned sample II.

A sample IV has a magnetic nanocontact made of permalloy only, where no additive element was introduced.

A sample V has a conventional CCP-MR structure including a multi-layered structure of PtMn 15 nm/CoFe 4 nm/Ru 1 nm/CoFe 4 nm/Cu 2 nm/CoFe 4 nm/Cu.

A magnetoresistance ratio of each sample was measured and listed in Table 1 shown below. The samples I through IV have magnetoresistance ratios much larger than the sample V having a conventional CCP-MR structure. The samples I and II have the largest magnetoresistance ratio.

TABLE 1

| | Sample I | Sample II | Sample III | Sample IV | Sample V |
|---|---|---|---|---|---|
| magnetoresistance ratio | 147% | 112% | 43% | 76% | 4% |

Fifth Example

As the fifth example of the invention, a so-called "tandem type" element with a serially stacked a plurality of magnetoresistance effect elements was prepared.

FIG. 20 is a schematic diagram showing a cross-sectional structure of the substantial part of a magnetoresistance effect element experimentally prepared in an embodiment of the invention.

As illustrated, ferromagnetic layers 1 and insulting layers 3 were alternately accumulated, and a micro through hole A was formed in each insulating layer 3 so as to connect upper and lower ferromagnetic layers 1 via a magnetic nanocontact of each insulating layer 3. That is, ferromagnetic layers 1 and 2 in the magnetoresistance effect element shown in FIG. 1A or 1B were commonly used by adjacent magnetoresistance effect elements.

Positions of the micro through holes A formed in individual insulating layers 3 need not be aligned linearly as shown in FIG. 20.

The serial structure according to this example is advantageous in that a larger change of magnetoresistance can be obtained.

In this kind of multi-layered serial structure, if the micro through holes A are not equal in opening width, the entire property is regulated by one of micro through holes A having the largest resistance. Therefore, this structure can compensate the possible defect that the micro through holes A tend to become too large.

Sixth Example

As the sixth example, a magnetoresistance effect element having a columnar micro through hole is explained.

FIG. 21 is a schematic diagram showing a cross-sectional structure of the substantial part of a magnetoresistance effect element prepared as this example.

First, an anti-ferromagnetic layer 6 and a magnetic layer 1 were sequentially formed on a conductive substrate S, and an alumina layer 3 having a columnar micro through hole A having the diameter of 5 nm was formed thereon. The micro through hole A was buried with nickel (Ni) using an electrochemical deposition method. Then, by forming the magnetic layer 2 thereon, a magnetoresistance effect element having the structure shown in FIG. 21 was obtained.

FIG. 22 is a graph diagram showing changes of magnetoresistance of a magnetoresistance effect element according to the instant example of the invention. Electric resistance under zero magnetic field was relatively small, namely not larger than 100 Ω, and a large decrease of resistance could be obtained under a magnetic field of 20 G or more.

Seventh Example

As the seventh example of the invention, a reproducing element for magnetic recording having the structure shown in FIG. 11A was prepared. A cross-sectional structure (on the opening surface) of the element viewed from the medium 200 appears as shown in FIGS. 23. Materials and thicknesses of respective layers of the magnetoresistance effect element except for a part of electrode layers EL and magnetic shield layers SH, are as follows.

Ta 5 nm/CoFe 1 nm/opening in the $SiO_2$ layer/CoFe 1 nm/Ru 1 nm/CoFe 1 nm/PtMn 30 nm/Ta 5 nm.

The opening was made by using FIB (focused ion beam) processing. On side surfaces of the magnetoresistance effect element, hard magnet layers HM were formed to control magnetization of the free layer 2. Part of the free layer 2 nearest to the hard magnet layers HM function as an insensitive region 2A for control of magnetization. Therefore, since the magnetoresistive effect of the insensitive region 2A is also included, the detection efficiency degrades. Additionally, since the signal magnetic field from the medium 200 becomes weaker with an increase of distance from the medium 200, response of the free layer 2 degrades, and the detection efficiency degrades again.

In contrast, in the structure employed as the instant example, it is possible to exclude the insensitive region 2A and detect the state sensed exclusively in the only portion near the medium 200. That is, this example minimizes the sensitivity loss, and can enhance the detection efficiency to 1.5 time or more of the detection efficiency of a simple structure of free layer/intermediate layer/pinned layer.

Eighth Example

As the eighth example, a 32×32 matrix was formed by arranging magnetoresistive cells having the structure shown in FIG. 15G on a substrate as shown in FIG. 12. Then, 32×32 such matrices were arranged to form a recording/reproducing medium of 1 Mbit (megabit) in total.

Using 32×32 probes, recording and reproduction were carried out with the recording/reproducing medium. That is, one probe was associated with each matrix. An aspect of the probing is shown in FIG. 13A. A cell for each probe PR was selected by means of an XY drive mechanism associated with the medium.

These probes PR were connected in an array via transistors TR as shown in FIG. 24. Then by selecting a bit line BL and a word line WL and thereby turning ON a transistor TR associated with a particular probe PR, the probe was selected. This structure was confirmed to enable selection of a number of bits.

Ninth Example

Figure 5D:
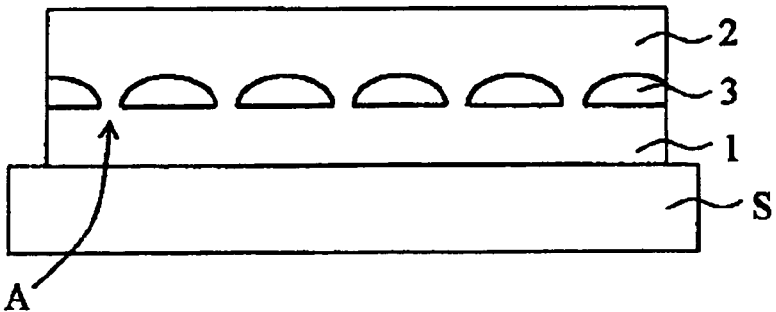

As the ninth example, a magnetoresistance effect element having the cross-sectional structure shown in FIG. 5D was prepared by using a "self-organizing process".

First, using an ultrahigh vacuum ion beam sputtering apparatus, a flat ferromagnetic layer 1 of CoFe was formed on a substrate. Thereafter, the substrate temperature was raised to 200° C., and a $SiO_2$ layer 3 was grown thereon. Depending on the condition, the $SiO_2$ layer grows in the form of islands.

FIGS. 25A through 25C are schematic diagrams showing plan-viewed configurations of a $SiO_2$ layer 3 (on, the ferromagnetic layer 1) that changes with growth time.

The $SiO_2$ layer 3 appears as minute islands as shown in FIG. 25A in its initial growth period and larger islands in the middle growth period, then grows to connect the islands and finally becomes a continuous film.

On each of these different aspects of the $SiO_2$ layer 3 during its growth, a CoFe ferromagnetic layer 2 was deposited, and the magnetoresistive effect was examined.

FIG. 26 is a graph diagram showing growth time of the $SiO_2$ layer on the abscissa and MR ratio on the ordinate. In the initial period of the growth, since the ferromagnetic layers 1 and 2 contact over a wide area, the MR effect is very small. However, as the growth of the $SiO_2$ layer 3 progresses to diminish the contact area between the ferromagnetic layer 1 and 2 to an appropriate degree, the MR ratio rapidly increases. When the growth of the $SiO_2$ layer 3 further progresses, since it covers the surface of the ferromagnetic layer 1, the MR ratio passes the peak and rapidly decreases. It is presumed that the TMR effect appears under the condition immediately after the $SiO_2$ layer 3 covers the surface of the ferromagnetic layer 1. However, since the insulating layer 3 becomes thicker with progress of the growth, the MR ratio rapidly decreases.

As explained above, according to the method of this example, a large MR value can be obtained by forming the micro through hole without making free use of microfabrication technologies.

Tenth Example

As the tenth example of the invention, cells having magnetization directions related as shown in FIG. 16A were fabricated by the same method as the eighth example, and the magnetic recording medium of FIG. 12 was formed.

After a PtMn layer (10 nm thick) was formed on a base layer 20 by using an ultrahigh vacuum sputtering apparatus, a Co layer (5 nm thick) 1 was grown. Islands of an alumina layer 3 were further formed, and a Co layer (2.5 nm) 2 was formed thereon. Additionally, a Ta layer (3 nm) was formed thereon. After this multi-layered film was annealed in a vacuum magnetic field, a cell array of regular alignment of cells each sized 70 nm×120 nm was formed by using an EB (electron beam) exposure apparatus.

Using this array, a probe PR was brought into contact with one of the cells, and a resistance change of the element appearing upon sweeping the current value was examined. As a result, resistance of the element increased under the flow of a current not smaller than plus 1.2 mA; when the current was supplied up to 2 mA and the direction of the current was reversed thereafter, the resistance value remained large up to near minus 1.4 mA; and when the current value was increased from that current value as a border further to the minus direction, resistance decreased. This kind of response of resistance change was similarly reproduced in some repeated experiments. The changing ratio of resistance by current sweep was 22% on average.

Heretofore, some models of magnetoresistance effect elements according to embodiments of the invention and some manufacturing methods thereof have been explained with reference to FIGS. 1A through 26.

Herein below, the manufacturing methods of the micro through hole formed in magnetoresistance effect elements according to the embodiments of the invention will be explained.

According to a first manufacturing embodiment of the invention, a manufacturing method of a magnetoresistance effect element comprises: forming an insulating layer on a first ferromagnetic layer; forming a hole reaching said first ferromagnetic layer by thrusting a needle from the top surface of said insulating layer; and depositing a ferromagnetic material to form a second ferromagnetic layer which buries said hole and overlying said insulating layer.

In the method, a current flowing between said first ferromagnetic layer and said needle may be monitored, and thrusting of said needle may be interrupted when said current reaches a predetermined value.

According to another manufacturing embodiment of the invention, a manufacturing method of a magnetoresistance effect element comprises: limiting electrical conduction between upper and lower magnetic layers sandwiching an insulating layer substantially to an irradiated region by a irradiation with a converged flux of charged particles.

According to yet another manufacturing embodiment of the invention, a method of fabricating a magnetoresistance effect element comprises: etching an insulating layer by supplying a reaction gas onto a surface of said insulating layer and by irradiating said insulating layer with a converged electron beam to compose a volatile gas; and burying the etched region with a magnetic layer which is one of components of said magnetoresistance effect element.

According to yet another manufacturing embodiment of the invention, a method of fabricating a magnetoresistance effect element comprises: etching an insulating layer surface with a converged ion beam; and burying the etched region with a magnetic layer which is one of components of said magnetoresistance effect element.

According to yet another manufacturing embodiment of the invention, a method of fabricating a magnetoresistance effect element includes: a first ferromagnetic layer; an insulating layer overlying said first ferromagnetic layer; and a second ferromagnetic layer overlying said insulating layer, said insulating layer having a hole formed therein, said first ferromagnetic layer and said second ferromagnetic layer being connected to each other via said hole, said method comprises: changing a crystal arrangement of at least one of said first and second ferromagnetic layers by irradiating with a electron beam.

Herein below, other specific examples related to the manufacturing methods according to the embodiments of the invention will be explained with reference to FIGS. 27 through 67.

Eleventh Example

As the eleventh example of the invention, a specific example of forming a micro through hole by etching using an electron beam will be explained.

FIG. 27 is a schematic diagram for explaining the method used in this example. This apparatus includes an EB source 310 located in a vacuum chamber 300 to supply an electron beam, a sample stage 320, a nozzle 340 for supplying a reaction gas to the sample, and a sample heater 330 for raising the temperature of the sample. The vacuum chamber 300 is evacuated through an exhaust port 350 to maintain a low-pressure atmosphere.

Boring of the micro through hole was carried out in the following manner.

A sample having the ferromagnetic layer and the insulating layer 3 is first fixed on the sample stage 320. By monitoring the scanned EB image, the boring position of the insulating layer 3 is determined. The intended position is concentrically irradiated with an electron beam, and the reaction gas was blown around it through the nozzle 340. Additionally, for the purpose of promoting the reaction, the temperature of the sample was adequately raised by using the sample heater 330. As a result, the supplied gas and EB act on the surface of the insulating layer 3, and make it vaporize as a volatile substance. Thus, the etching is promoted. Additionally, the rise of the sample temperature enhances the reaction speed and shortens the process time. Moreover, formation of a carbon fluoride layer is prevented on the magnetic layer 1, which is the end point reluctant in reaction, by EB irradiation.

FIG. 28 is a schematic diagram showing a process of fabricating a magnetoresistance effect element. That is, it shows the process of forming the micro through hole A in the $SiO_2$ layer 3 formed on the CoFe magnetic layer 1.

First, a PtMn anti-ferromagnetic layer (for example, 15 nm thick), not shown, is formed on a base film, not shown, (made of t nm thick tantalum, for example). After that, the CoFe layer 1 is formed thereon as the pinned layer of the MR element. Then a 3 nm thick $SiO_2$ layer 3 is formed thereon.

In the next step, an electron beam concentrated to a beam diameter not larger than 10 nm is irradiated onto a spot on the surface of the $SiO_2$ layer 3. For the purpose of preventing the insulator from charging up, the EB acceleration voltage was adjusted to 10 kV. Under this condition, $XeF_2$ is blown as the reaction gas. As a result, $SiO_2$ acts on the gas and vaporizes as a silicon fluoride. However, since the reaction gas makes no reaction product with the CoFe magnetic layer 1, reaction stops after etching only the $SiO_2$ layer 3.

To prevent influences of charge-up, it is recommended to decline the sample by approximately 30 degrees or promote emission of secondary electrons. The reaction gas to be supplied from the nozzle 340 is not limited to $XeF_2$, but $CHF_3$ or other Freon-family gases are also effective. As an additional or alternative countermeasure against charge-up, a metal film such as Nb (niobium) film may be formed on the $SiO_2$ layer 3.

FIG. 29 shows an example having formed a Nb film 400. Thickness of the Nb film 400 may be, for example, around 3 nm. In this case, an electron beam is irradiated using $CF_4$ as the reaction gas to form spot through holes 400A in the Nb film 400. Thereafter, the reaction gas is replaced by $XeF_2$, and the $SiO_2$ layer 3 is selectively etched by EB irradiation.

As such, the metal film 400 formed on the insulating layer 3 prevents the diameter of EB irradiation from being enlarged by charge-up. Additionally, the metal film 400 overlying the insulating layer 3 improves the crystallographic property of the magnetic film formed thereon, and thereby enhances the soft magnetism and the resistance change. That is, it contributes to improvement of the magnetic field sensitivity of the magnetoresistance effect element.

FIGS. 30A through 30C are cross-sectional views showing another process of forming a nanocontact.

It takes much time to form the micro through hole A by EB in each element one by one. The process time for making the micro through holes A by EB can be shortened by forming the metal film 400 alone as shown in FIG. 30A, and thereafter carrying out RIE (reactive ion etching) by $CFH_3$ gas over the entire wafer as shown in FIG. 30B, or selectively etching the $SiO_2$ layer 3 throughout the entire wafer by CDE (chemical dry etching) producing less physical damage.

It is also possible to copy the through hole 400A in the metal to the insulating film as shown in FIG. 30C by carrying out sputtering etching or ion milling over the entire wafer after making the through holes 400A in the metal film 400 as shown in FIG. 30A. This method is also effective to reduce the process time because the micro through holes A can be formed simultaneously throughout the entire wafer.

After the micro through holes A are formed in the $SiO_2$ layer 3, the magnetic layer 2 (for example, approximately 5 nm thick CoFe) to be used as the free layer is formed as shown in FIG. 31A, and an approximately 5 nm thick Ta film 5 is formed as a protective layer. Through these steps, the MR multi-layered film having point contacts between the pinned layer and the free layer can be obtained.

As shown in FIG. 31B, an approximately 2 nm thick Cr film or Cu film to be used as the nonmagnetic intermediate layer (spacer layer) in the MR element may be formed before the CoFe magnetic film 2 as the free layer is formed. This is effective for facilitating magnetic reversal of the contact portion of the free layer 2 under an external magnetic field and for rendering it responsive to a lower level signal magnetic field.

The same effect will also be obtained when the nonmagnetic intermediate layer 4 is formed on the pinned layer 1 as shown in FIG. 31C.

On the other hand, upper and lower magnetic layers may be reversed to use the lower as the free layer and the upper as the pinned layer.

FIG. 32A shows an example in which the upper and lower layers are inverted. In this example, after the micro through hole A is formed, the CoFe layer 1 as the pinned layer, anti-ferromagnetic layer 6 for magnetically pinning the CeFe film 1, and Ta protective film 9 are formed. Since the magnetic film 1 buried in the micro through hole A is inevitably liable to contain crystal defects, a model burying the hole with a pinned layer not required to have a soft-magnetic property is more advantageous from the viewpoint of sensitivity to the signal magnetic field. Even when the magnetic film 2 as the pinned layer is buried, the nonmagnetic intermediate layer may be first buried as shown in FIG. 32B. Here again, magnetic reversal of the free layer 1 responsive to the signal magnetic field takes place smoothly, and sensitivity to a low level signal magnetic field can be enhanced.

Even when a spacer layer is formed on the free layer 2 as shown in FIG. 32C, the same effect will be obtained.

To ensure good crystalline property of the buried magnetic layer 2 and thereby obtain a high MR, the micro through hole A preferably has a moderately tapered side surface and is preferably minimized in surface roughness. To make a moderate taper, it is recommended to process the insulating film 3 by etching, such as ion milling with an oblique angle of incidence as shown in FIG. 33 or RIBE (reactive ion beam etching) with an oblique angle of incidence. To minimize the surface roughness of the tapered surface, $SiO_2$, alumina or an amorphous oxide is preferably used as the material of the insulting layer 3.

As explained above, micro through holes can be formed at any position by irradiating with an electron beam and introducing a reactive gas. The principle of the technique of opening a through hole on a substrate by using an electron and a reactive gas is known, see J. W. Coburn, J. Appl. Phys., Vol. 50, No. 5, pp. 3189-3196 (1979).

The feature of this method is that the physical damage of the target is very small since electron bombardment is employed. Therefore by applying this technique to the nanocontact MR element, an etching of an insulating layer can be performed by using an electron beam converged into a very fine beam without introducing a physical damage into the underlying magnetic layer. Even in the case where the very small region is locally etched, a degradation of the beam convergence due to a charge up of the insulating layer can be prevented by coating it with a metallic film.

In the case of a nanocontact MR element, a good crystallinity at the nanocontact portion is required. Therefore, the electron beam etching technique with the reactive gas is especially preferred. Besides, the process time is quite short since the range to be etched is very limited. Further, after the etching process, the shape of the through hole can be easily observed and process feedback can be made by the result. These features of the electron beam process for the formation of a nanocontact MR element are advantages.

In some case, after the micro through hole is formed in the insulating layer it may be necessary to take the work in process out into the atmosphere without forming the overlying magnetic layer, layered region including the additive element or nonmagnetic intermediate (spacer) layer. In such a case, a surface of the underlying magnetic layer exposed at the bottom of the through hole may be undesirably oxidized by an atmosphere of a poor quality. In order to remove such an undesirably formed oxide layer, the following two methods can be used.

The first method is to remove the oxide layer by using a conventional sputter etching technique. In this case, however, damage may be introduced into the magnetic layer. Therefore, after performing sputter etching of the oxide layer by using an ion beam, an annealing process is preferably performed by using an electron beam or a laser beam in order to improve crystal quality. The sputtering process, the annealing process and the following deposition process of the overlying layer are preferably performed continuously without breaking the vacuum.

For the annealing process, conventional heating technique can be employed as well.

The second method is to remove the undesirably formed oxide layer by irradiating with atomic hydrogen. This process may also be preferably performed continuously with the following deposition process of the overlying layer without breaking the vacuum.

Atomic hydrogen can be generated by cracking a hydrogen gas. For example, hydrogen gas can be cracked (decomposed into atomic hydrogen) by introducing the hydrogen gas into a filament made of tungsten or tube made of tantalum which is located near the work (specimen) and heated (for example in a temperature range of 1400 through 2000 degrees in centigrade or even higher). The distance between the nozzle and the work may be about 10 cm or larger.

In this case, an annealing process to improve the crystallinity of the magnetic layer may also be preferably performed at the same time or after the reduction of the oxide layer is performed. A thermal radiation from the hydrogen cracking source, electron beam irradiation or laser beam irradiation may be used in the annealing technique.

The above-mentioned process of removing the oxide layer can be employed in any other embodiment of the invention.

Twelfth Example

As the twelfth example of the invention, a process for making the micro through hole by locally heating spots of the MR multi-layered film with EB will be explained FIGS. 34A through 34C are cross-sectional views showing the manufacturing process of a magnetoresistance effect element taken as this example.

Firsts as shown in FIG. 34A, a PtMn anti-ferromagnetic layer 6 (14 nm thick), CoFe magnetic layer 1 as the pinned layer (2 nm thick), $SiO_2$ insulating layer 3 (2 nm thick), CoFe layer as the free layer (2 nm thick) and Ta layer as the protective layer 9 (5 nm thick) are formed sequentially from the bottom to the top.

Next, as shown in FIG. 34B, an electron beam concentrated to a spot diameter not larger than 10 nm is irradiated from above the Ta protective layer 9.

As a result, as shown in FIG. 34C, temperature rapidly rises in the region irradiated with the electron beam, and invites enlargement of the grain size, which causes segregation of Si atoms and O atoms forming the $SiO_2$ layer 3 along the interface or incorporation of a part thereof into the CoFe layers 1, 2. As a result, the insulating layer 3 locally disappears from portions irradiated with electron beams. Thus the upper and lower magnetic layers 1, 2 can be connected to each other by point contacts.

The structure shown in FIG. 35A is also employable, in which a nonmagnetic spacer layer 4A of Cr, for example, and a nonmagnetic spacer layer 4B of chromium oxide, which is an oxidized surface portion of the nonmagnetic spacer layer 4A, are inserted between the upper and lower magnetic layers 1, 2.

Here again, in the same manner, by local EB irradiation from above the Ta protective layer 9, as shown in FIG. 35B, local removal of the spacer layers 4A, 4B and connection of the upper and lower magnetic layers 1, 2 can be accomplished as shown in FIG. 35C. In this case, once the electric conduction is attained between the upper and lower magnetic layers 1, 2 via the micro through hole formed in the nonmagnetic spacer layers 4A, 4B, both advantages are accomplished, namely, an increase of MR by point contact and an increase of sensitivity by the free layer 2 being sensitive even to a low level signal magnetic field.

One of advantages of irradiation of an electron beam from above the Ta protective layer 9 is to omit the process of making the micro through hole during deposition of the MR film, which contributes to creating cleaner interfaces between stacked layers, and another advantage is to form point contacts by only one-shot EB irradiation, which contributes to shortening the process time.

This EB irradiation process is still effective even in the model shown in FIGS. 36A through 36C in which an oxide layer 1A (Co—Fe—O) by oxidization of the pinned magnetic layer 1 lies on the lower pinned magnetic layer 1, and in the model shown in FIGS. 37A through 37C in which an oxide layer 2A (Co—Fe—O) is formed under the upper free magnetic layer 2.

In the case that electron beams are irradiated with a spot as shown in FIG. 38A, it sometimes results in forming a point contact PC at the very position irradiated as shown in FIG. 38C, or it sometimes results in forming a plurality of point contacts PC around the irradiated spot as shown in FIG. 38B. In any of these cases, the point contacts can be used as nanocontacts of magnetoresistance effect elements.

In the case that the magnetoresistance effect element is used in a magnetic head, the electron beam is preferably irradiated proximately to the medium traveling plane.

FIG. 39 is a schematic diagram illustrating that EB irradiation position is set nearer to the medium traveling plane than the device center C by reading alignment marks AM after the MR multi-layered film is formed.

FIG. 40 is a schematic diagram that illustrates configuration of a device. The magnetoresistive film MR is sandwiched by upper and lower electrodes EL, and by vertical bias films HM from right and left sides. As shown here, the point contact PC formed by EB irradiation is out of a center C of the device toward the medium traveling plane ABS. In this manner, it is possible to locate the magnetic detector portion of the MR element closer to the medium traveling plane ABS and thereby supply the sense current concentrically to the portion where a large signal magnetic field is obtained from the recording medium.

Also, when etching is carried out by using EB as explained in conjunction with the eleventh example, a position nearer to the medium traveling plane ABS is preferably selected to form the micro through hole.

In the instant example, in the region irradiated by EB, the crystal grain size is increased, and crystalline defects are decreased. As a result, the device resistance is decreased, and an enhancement of the MR change was observed. However, improvement of the soft magnetism could not be confirmed clearly. The reason probably lies in that the electrical nature of the element depends on the crystallographic property exclusively of the conductive region; however, in regard to the soft-magnetic nature, since the free layer 2 entirely gets into exchange coupling to move in magnetization as a through hole, the effect of the local decrease of defects does not appear clearly.

This demonstrates that local annealing by EB irradiation is a method capable of controlling the electrical nature and the magnetic nature of the element independently as compared with other methods heating the entire element in an oven, for example.

For example, FeCo of a bcc crystal structure exhibiting large crystal magnetic anisotropy is expected to provide large MR, but its soft magnetism deteriorates as the crystal size increases. Taking it into consideration, as shown in FIG. 41A, bcc-FeCo substantially entirely made up of minute crystal is formed, and EB is irradiated exclusively to its conductive region. Then, as shown in FIG. 411B, although the crystal size slightly increases in the EB-irradiated portion, crystalline defects decrease in the sense current conductive region. Thus, the element satisfies both a large MR and soft magnetism. This method is effective also when stacking a NiFe (Permalloy) alloy film to assist the soft magnetism.

Annealing by EB irradiation can be used to promote selective growth only in a specific crystalline orientation.

FIG. 42 is a schematic diagram illustrating an example of the MR element having particular growth axes (for example, [111], [100] and [110]). These growth axes can be confirmed as difference in contrast, for example, in a SI (secondary ion) image obtained by irradiation with ion beams. In case the MR element is made up of a plurality of crystal grains different in surface orientation, noise may be produced during operation of the magnetoresistance effect element. This phenomenon becomes more and more noticeable as the element is downsized to be composed of a few number of crystal grains. Additionally, if the point contact is formed near a grain boundary, influences of the current magnetic field additionally affect the operation reliability.

Therefore, in the case of point irradiation of EB, the position for irradiation is preferably selected, to avoid such grain boundaries. Thus, by avoiding grain boundaries and by scanning with EB under special control, crystal grains of a specific orientation can be grown.

For example, as shown in FIG. 43A, if the EB irradiation spot is gradually expanded in a portion of [111]-oriented crystal grains, then the [111]-oriented portion can be enlarged. Then, it is desirable that the entire region of the point contact PC is uniform in orientation as shown in FIG. 43B.

In this example, improvement of the crystallographic property by EB heating may be carried out in an occasion during deposition of layers of the MR film instead of an occasion after deposition of all these layers.

FIG. 44A shows a model in which a contact through hole HC is formed in a multi-layered structure including a free magnetic layer 1, CrAs layer 410 for the purpose of increasing the resistance change, $SiO_2$ layer 3, and Nb conductive layer 40 in the order from the nearest to the substrate (not shown). EB is irradiated into the contact through hole CH to heat the CrAs layer. This contributes to improving the crystallographic property and orientation of the part of the CrAs layer 410R and obtaining a structure exhibiting a high electron polarizing property.

After that, as shown in FIG. 44B, the magnetic layer as the pinned layer, anti-ferromagnetic layer 6 and protective layer 9 are formed. EB irradiation inserted in the midst of the stacking process can be used to heat only a specific layer.

On the other hand, as shown in FIG. 45A, local EB irradiation may be carried after all the layers of the MR film (sequentially from the bottom, CoFe free layer 1, CrAs layer 410, Cr spacer layer 4A, Cr oxide layer 4B, CoFe pinned layer 2, PtMn anti-ferromagnetic layer 6 and Ta protective layer) are formed. In this case, both the formation of the nanocontact and improvement of the crystallographic property of the irradiated part of the CrAs layer 410R can be achieved.

That is, the atomic arrangement of CrAs layer 410 is reconstructed in accordance with the atomic arrangement of underlying and overlying layers. Thus, by irradiating with EB locally onto the nanocontact region, the selective annealing thereof may be effectively performed without affecting the remaining portion.

Additionally, crystalline defects, distortion or other damage introduced into the underlying magnetic layer in the boring process of the insulating layer 3 can be removed by EB irradiation.

FIG. 46A shows a structure having damage DM introduced in a top surface portion of the underlying magnetic layer 1 due to the boring process by RIE. If EB is irradiated into the through hole as shown in FIG. 46B, the damage DM can be removed by local annealing (FIG. 46C).

As an alternative process, even when the upper magnetic layer 2 is formed to bury the hole and the buried portion is thereafter annealed by EB, the same effect is obtained, and simultaneously, crystalline defects of the magnetic material buried in the through hole can be reduced as well. As a result, a MR element having a high MR change can be obtained.

As explained above, local heating by irradiation of EB is advantageous for the formation of nanocontact MR element because the required electrical characteristics of the magnetic nanocontact and the required through hole magnetic characteristics of the free layer can be both realized.

The local heating may be performed by using a laser irradiation instead of the electron beam irradiation. In the case of laser irradiation, if the surface layer is transparent to the laser beam, it becomes easy to focus the beam onto the underlying portion.

For example, an insulating layer is formed after forming the free layer (or pinned layer), then the insulating layer is irradiated with a laser beam to make a "pillar" which connects the underlying and overlying magnetic layers. Then, a pinned layer (or free layer) is formed on the insulating layer. Thus a nanocontact MR element is formed.

Thirteenth Example

As the thirteenth example of the invention, a method of forming nanocontacts by FIB (focused ion beam) will be explained. In case of FIB, because of a large mass of colliding particles (ions), irradiation only is basically sufficient for etching.

FIGS. 47A and 47B are cross-sectional views illustrating a method of making micro through holes in the $SiO_2$ layer 3 formed on the CoFe magnetic layer 1.

First, a PtMn anti-ferromagnetic layer (15 nm thick), not shown, is formed on a base layer (5 nm thick Ta), not shown. Thereafter, the CoFe layer 1 is formed thereon as the pinned layer of the MR element, and a 3 nm thick $SiO_2$ layer 3 on the CoFe layer 1.

After that, as shown in FIG. 47A, FIB concentrated to a beam diameter not larger than 10 nm is irradiated onto a spot of the surface of the $SiO_2$ layer 3. If the dose of FIB is adequately controlled, the micro through hole A will be formed in the $SiO_2$ layer 3 as shown in FIG. 47B. Ga ions typically used as the FIB source are liable to undesirably etch the CoFe layer 1 as well, and need strict control of the dose thereof. If the etching selectivity of the $SiO_2$ layer 3 and the CoFe layer 1 is sufficiently large, the CoFe magnetic layer can be prevented from over-etching.

Selectivity can be raised by, for example, carrying out FIB processing while blowing a Freon-family gas as the reaction assist gas AG onto the region to be processed, as shown in FIG. 48A. It will result in preventing over-etching of the CoFe magnetic layer 1 and successfully forming the micro through hole A as shown in FIG. 48B. In addition to Freon-family gases such as $CHF_3$, iodine gas is also usable.

Even when FIB is used to process the $SiO_2$ layer 3 as shown in FIG. 49A, FIB processing of the $SiO_2$ layer may be interrupted at a half depth of the $SiO_2$ layer 3 as shown in FIG. 49B, and the remainder may be etched by using another method.

As this etching method, RIE or CDE having a very slow etching rate for the magnetic layer 1 is preferably used to prevent undesirable problems such as over-etching of the CoFe magnetic layer 1 and damage causing deterioration of the crystalline property (FIG. 49C). That is, by interrupting FIB halfway and finally etching the magnetic layer 1 by RIE or CDE giving less damage thereto, etching with still less damage can be achieved.

In this case, the initial thickness of the $SiO_2$ layer 3 should be determined slightly larger than the thickness etched by RIE or CDE.

A Ta film, for example, may be formed on the top surface of the $SiO_2$ layer 3 as shown in FIGS. 50A through 50C to minimize over-etching of the $SiO_2$ layer 3 by RIE or CDE. More specifically, as shown in FIG. 50A, a 3 nm thick Ta film 9 is formed on the $SiO_2$ layer 3, and its boring processing is carried out by FIB.

When the through hole reaches the top surface of the $SiO_2$ layer 3 as shown in FIG. 50B, the process is switched to RIE or CDE as shown in FIG. 50C.

By forming on the $SiO_2$ layer 3 a mask layer 9 of a material for which large etching selectivity is obtained by RIE or CDE, it is possible to minimize a decrease of the film thickness by RIE or CDE with Freon gas such as $CHF_3$ and to minimize unevenness of the thickness of the $SiO_2$ layer 3 caused by excessive etching time or uneven progress of etching along the surface.

In order to taper the wide wall of the micro through hole such that a magnetic layer 2 minimized in defect can be buried, RIBE with oblique angle of incidence is also preferable.

If a metal mask layer 9 is used, undesirable enlargement of the beam size by charge-up can be prevented similarly to the case using EB. Additionally, the metal mask layer 9 functions as a buffer layer of the magnetic layer 2 formed thereon, and contributes to improving the crystalline property of the magnetic layer 2 and thereby enhancing the output and sensitivity.

The process can be similarly carried out solely by FIB.

First as shown in FIG. 51A, after forming a multi-layered structure stacking the CoFe magnetic layer 1, $SiO_2$ oxide layer 3 and Ta mask layer 9 from the bottom, FIB is irradiated.

Once the through hole is formed in the Ta mask layer 9 as shown in FIG. 51B, the $SiO_2$ layer 3 is excavated by FIB again, as shown in FIG. 51C. At that time, assist gas AG, such as $CHF_3$ is introduced to increase the etching rate of the $SiO_2$ layer 3 and thereby increase the selectivity of the etching rate of the $SiO_2$ layer 3 relative to the CoFe magnetic layer 1.

To simplify the process, the assist gas AG may be blown starting with the first etching of the Ta film (FIG. 51A). However, in the case that the material used as the mask layer 9 acts on the assist gas AG, etching may undesirably progress even at the skirts of the FIB beam where etching does not progress usually, and it may result in excessively enlarging the through hole. Therefore, it is desirable to select an assist gas AG that acts on the insulating layer 3 but does not act on the mask layer 9 and the magnetic layer 1.

Furthermore, a spacer layer 4 (for example of Cu) may be inserted as shown in FIG. 52 to be used as an etching stopper.

In the above-mentioned explanation, gallium (Ga) is used as the ion source, however, any other appropriate element can be used in the invention. For example, if the gallium may possibly remain on the processed surface, argon (Ar) can be used as the ion source.

Fourteenth Example

As the fourteenth example, a process capable of forming micro through holes simultaneously all over the wafer will be explained. Simultaneously forming micro through holes throughout the entire wafer is more advantageous for shortening the process time than forming them one by one.

FIGS. 53A through 54D are diagrams showing the process taken as the instant example.

Figure 53A:
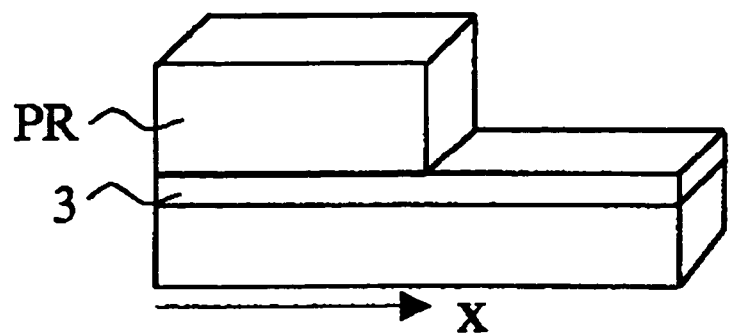

First referring to FIG. 53A, a 0.1.mu.m thick photo resist PR is coated on an alumina insulating layer 3 (6 nm thick) formed on the magnetic layer (not shown), and it is patterned to the position X for the through hole.

Figure 53B:
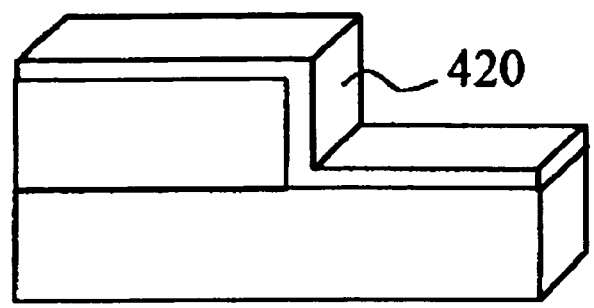
Figure 53C:
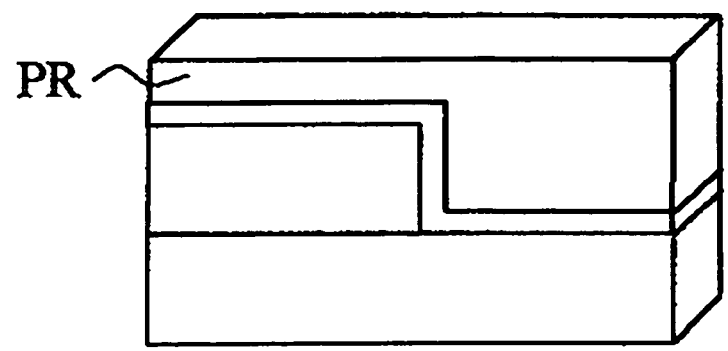
Figure 53D:
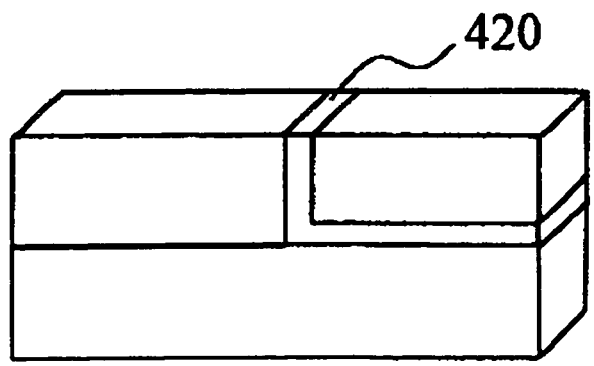

As shown in FIG. 53B, a 7 nm thick $SiO_2$ film 420 is formed thereon. The $SiO_2$ film 420 coated the sidewall of the photo resist PR by the thickness of 5 nm. Further, as shown in FIG. 53C, a 0.1 .mu.m thick photo resist PR is coated. Then the surface is shaved to a thickness around 30 nm by ion milling or RIE etch-back to expose the $SiO_2$ 420 on the sidewall of photo resist PR on the top surface as shown in FIG. 53D such that a 5 nm thick line of the $SiO_2$ film 420 appear on the top surface.

Figure 54A:
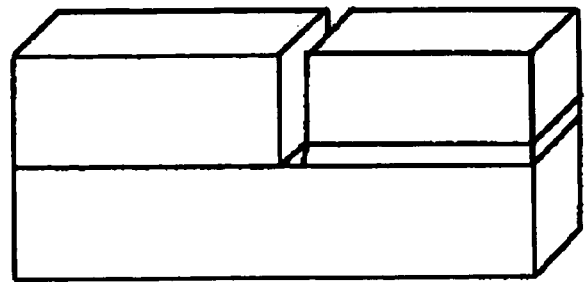
Figure 54B:
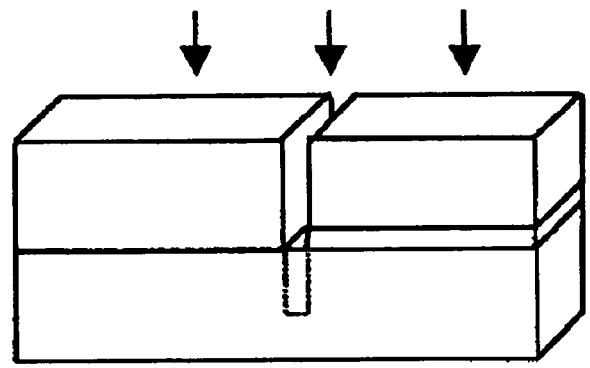
Figure 54C:
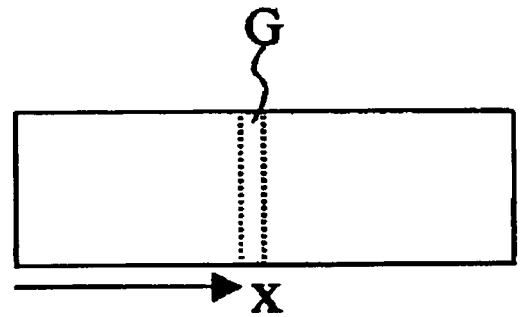
Figure 54D:
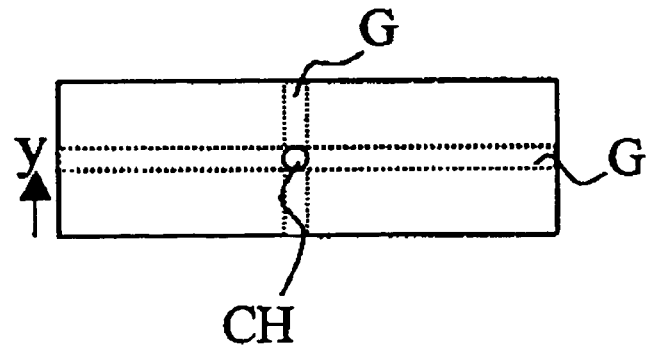

This 5 nm thick line of $SiO_2$ layer 420 is next selectively etched by RIE using $CHF_3$ gas as shown in FIG. 54A. Additionally, RIE using $CHF_3$—$CF_4$ mixed gas is conducted to remove a half depth (approximately 3 nm) of the alumina insulating layer 3.

Then the pair of photo resist layers PR remaining on the top surface are removed by RIE using $O_2$ gas, and the underlying $SiO_2$ film 420 is also removed by RIE using $CHF_3$ gas. Since the etching rate of RIE using any of these gases for the alumina insulating layer 3 is one fourth in maximum, removal of the alumina insulating layer 3 by the etching is quite a little, if any.

Through the process explained above, 5 nm wide, 3 nm deep grooves G are formed by repeating the process shown in FIGS. 53A through 54B while rotating the patterning direction by 90 degrees. Then, as shown in FIG. 54D, a 5×5 nm square through hole CH is formed at the crossing point of these orthogonal grooves G.

This process explained above greatly reduces the time required for boring. When RIE is employed, the sidewall of the through hole CH is shaped to be as steep as 80 degrees or more. When CDE is employed, the sidewall of the through hole CH gently inclines the form of a wine cup. If the magnetic film buried thereon is the free layer, a gently inclined sidewall ensures better soft-magnetism of the magnetic material buried in the through hole.

Fifteenth Example

As the fifteenth example of the invention, a method of boring a through hole using a needling technique by AFM (atomic force microprobe).

FIG. 55 is a schematic diagram for explaining a process using reducing reaction in this example.

A sample was prepared by forming an alumina insulating layer 3 (5 nm thick) on a magnetic layer 1. The needle of AFM is coated with a metal film, and an electric field is applied between the needle ND and the sample in a reducing atmosphere by blowing $H_2$-mixed forming gas to prevent generation of new oxides. As a result, a current suddenly begins to flow at a certain magnitude of the electric field, and due to a reducing reaction, the region stabbed with the needle ND becomes a conductive region (Al). Since the needle ND contacts, the electric flux line is dense at the contact portion, and the reducing reaction progresses from that portion.

A spacer layer 4 may be interposed between the alumina insulating layer 3 and the magnetic layer 1. In case a metal oxide is used as the material of the insulating layer 3, such an oxide may be formed by first forming a film of aluminum (Al) or other metal and thereafter oxidizing it.

The insulating layer 3 used in this example is preferably a metal oxide. However, in the case where $SiO_2$ is used, it is reduced with electricity from the needle ND to form Si or Si compound, and thereafter, as shown in FIG. 56, it is removed by RIE to complete the contact through hole CH.

Such processing may be carried out after the magnetic layer 2 is stacked on the insulating layer 3. That is, as shown in FIG. 57, if an electric field is locally applied from the needle ND to a sample of a sandwich structure of the magnetic layer 1, insulating layer 3 and magnetic layer 2, the insulating layer 3 is locally reduced. Thus a local conductive region can be formed.

In an embodiment of the invention, an oxidation reaction is also usable.

FIGS. 58A through 58C are schematic diagrams for explaining a process using oxidation.

On the magnetic layer 1, a layer 3A of silicon (Si), for example, is formed beforehand. When the needle ND is brought into contact therewith and an electric field in the opposite direction is applied in an oxidizing atmosphere, anodic oxidation locally progresses. As a result, as shown in FIG. 58A, a minute $SiO_2$ region is formed.

After that, this $SiO_2$ region is selectively removed by etching, such as RIE. This etching is preferably conducted under a condition with large etching selectivity relative to silicon (Si) as the matrix.

After that, the silicon layer 3A is oxidized into $SiO_2$. Thus the insulating layer having the micro through hole is obtained.

The process using AFM technique is advantageous to confirm the position for the opening on the sample beforehand and facilitate its adjustment, if necessary. Especially when the MR element according to an embodiment of the invention is formed, because of its locally conductive configuration, the conductive region is desired to be determined to avoid defects, foreign matter and boundaries. In such cases, by previously knowing the film surface morphology by AFM scanning, the boring position can be adjusted. Furthermore, when the needle ND made of a magnetic material is used, this process has a great advantage in also enabling confirmation of the magnetic state of the sample surface by MFM (magnetic force microscope) technique.

Sixteenth Example

As the sixteenth example, the functions of the spacer layer 4 made of a nonmagnetic material will be explained.

FIG. 59A shows a structure including a Cu layer (2 nm thick), for example, first formed as a spacer layer 4 on the $SiO_2$ insulating layer 3 overlying the CoFe layer 1 and defining the contact through hole CH, and a CoFe magnetic layer 2 (4 nm thick) thereafter formed thereon. Since this structure does not bring the magnetic layers 1 and 2 into direct contact, it can prevent degradation of the soft magnetism caused by exchange coupling of the free layer (for example, magnetic layer 2) with the pinned layer (for example, magnetic layer 1).

However, the magnetic material buried in the contact through hole CH contains a number of defects, and makes it difficult to quickly rotate magnetization of the pinned layer and the free layer. To lessen the number of defects, the nonmagnetic layer 4 is first formed and the upper magnetic layer 2 is next, as shown in FIG. 59A. This process permits the side surface of the contact through hole CH to be covered with the metal buffer layer and the crystallinity of the magnetic material buried in the contact through hole CH is improved. As a result, the magnetic material in the through hole CH can magnetically rotate together with the magnetic layer around it and contributes to generating MR changes sensitive to the signal magnetic field.

Also when the magnetic layer appearing at the bottom of the through hole CH is shaved by sputtering etching in the process of boring the through hole CH or before the process of burying a film, the same buffering effect is ensured by forming the spacer layer 4 on the lower magnetic layer 1 as shown in FIG. 59B. After the through hole is opened, the upper spacer layer 4 and the upper magnetic layer 2 can be stacked as shown in FIG. 59C.

If the insulating layer 3 is etched by RIE using a Freon-family gas, a carbon film CF may be deposited on the bottom of the through hole CH (i.e. on the top surface of the lower magnetic layer 1) as shown in FIG. 60A under certain etching conditions. This carbon film CF also functions as a spacer layer 4, and the same buffering effect is obtained in the stacked structure as shown in FIG. 60B.

The through hole inside surface of the contact through hole CH is not necessarily covered by the spacer layer 4. For example, the copper spacer layer 4 may have pin holes or may have a mesh-like structure in the contact through hole CH. The lack of the spacer layer 4 limits the magnetic contact area.

Seventeenth Example

As the seventeenth example, a process for burying the contact through hole with a magnetic material by plating will be explained.

If plating is used to bury the contact through hole with a magnetic layer, growth of the magnetic layer starts from the bottom of the through hole. Therefore defects can be decreased significantly.

For example, as shown in FIG. 61A, a $SiO_2$ insulating layer 3 is formed on the lower magnetic layer 1, and the contact through hole CH is formed thereafter. Subsequently, an electrode is connected to the magnetic layer 1, and the structure is immersed in a plating bath PL. If the structure is immersed in a NiFe plating bath PL, growth starts from the top surface of CoFe as the magnetic layer 1 exposed on the bottom of the contact through hole CH. In this case, a Cu spacer layer 4 (not shown) may be stacked beforehand on the top surface of the CoFe magnetic layer 1.

The NiFe layer 2 having grown from the bottom of the contact through hole spreads out spherically just exiting the through hole CH, and starts rapidly enlarging its surface area. Therefore, under a constant plating current, the growth speed decelerates. As such, when plating is used for an extremely minute contact through hole, the timing of plating for burying the through hole can be controlled by appropriate adjustment of the plating time. As such, the magnetic film formed in the contact through hole by plating has less defects, and expresses a large MR.

Then, the antiferromagnetic layer 6 is formed and magnetization of the ferromagnetic layer 2 is fixed in one direction by the antiferromagnetic layer 6. According to the embodiment, it becomes possible to control the magnetic domain of the ferromagnetic layer 2 by stacking the anti-ferromagnetic layer after burying the contact through hole CH by a plating technique. As a result, a MR element with a low noise can be realized and one problem of the aforementioned prior art (M. Munoz (Applied Physics Letters vol. 79, No. 18, pp 2946-2948(2001)) can be solved.

Eighteenth Example

As the eighteenth example of the invention, a method of fabricating a MR element having a nanocontact will be explained, in which the electrical flow direction is parallel to the film plane.

FIG. 62 is a schematic diagram that shows the configuration of the MR element taken as this example. That is, halfway of the electric current from the first electrode EL1 to the second electrode EL2, the pinned layer 1, current-confining (A-B) region PC and free layer 2 are located. In this example, the signal magnetic field SM enters in the free layer 2 from the part of the second electrode EL2.

FIGS. 63A through 63D are diagrams illustrating a process of fabricating such a MR element.

Figure 63A:
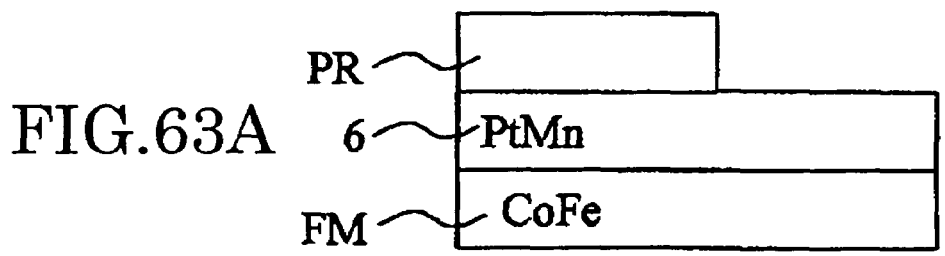

First, as shown in FIG. 63A, a CoFe magnetic layer (5 nm thick) FM is formed, and a PtMn anti-ferromagnetic layer 6 (15 nm thick) is formed thereon. Further, photo resist PR is formed patterned thereon such that its edge (end) resides on the position for confining the current.

Figure 63B:
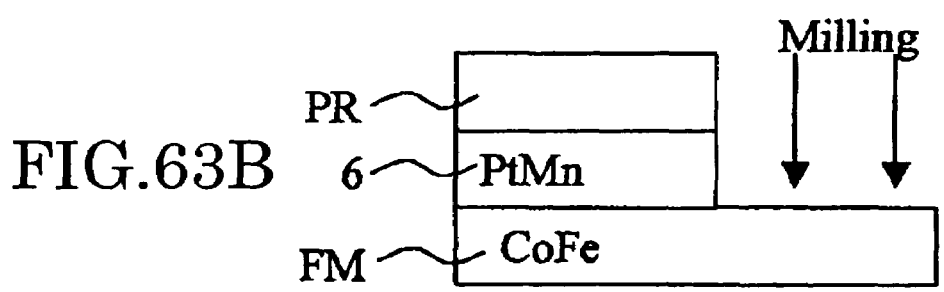

Next, as shown in FIG. 63B, part of the PtMn layer 6 overlying the CoFe layer FM to be used as the free layer is removed by ion milling.

Figure 63C:
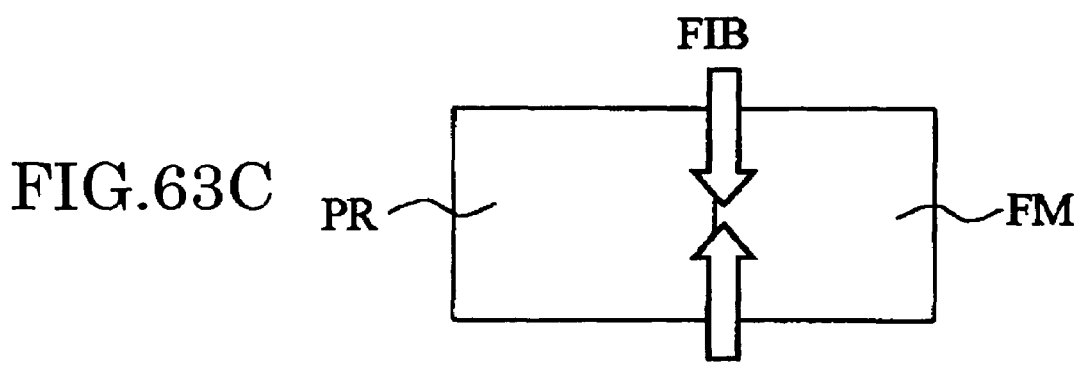
Figure 63D:
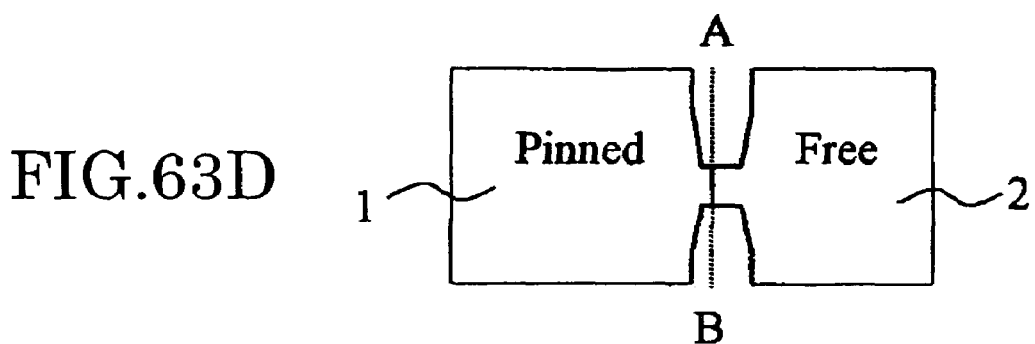

Next, as shown in FIG. 63C, trimming is carried out by beam scanning by FIB along the edge of the photo resist PR to form the current-throttling portion PC, As a result of the processing, the configuration as shown in FIG. 63D is obtained. Thereafter, the first and second electrodes EL1, EL" are formed.

However, on the sectional surface of the free layer 2 taken along the A-B line of FIG. 63D, the upper perimeter of the free layer 2 is undesirably rounded as shown in FIG. 64 due to influences of the FIB beam profile, and this makes it difficult to control the resistance value. However, this "rounding" of the magnetic layer FM can be prevented by using a protective film PF and carrying out the FIB processing from beyond the protective film PF. The protective film PF is preferably a high-resistance film, like an insulating film, to divide the current with the magnetic film.

FIG. 66 shows an aspect of an element processed from the state of FIG. 63B by coating a photo resist to form a protective layer PR on the free layer. In this example, the processing for making the current throttling structure by FIB is conducted from this state. It results in protecting surfaces of the pinned layer 1 and the free layer 2 when they are processed by FIB etching, and therefore minimizes fluctuation of resistance by "rounding".

It is also possible to make out the current-throttling narrower than the processing width by making use of the implantation of gallium (Ga).

FIG. 67 is a schematic diagram that shows an aspect of an element in which Ga has been introduced into an end portion of the FIB-processing portion. In the Ga-introduced region IZ, crystals of the CeFe layers 1, 2 are broken, and their resistance values rise. Thus the FIB processing results in making a junction effectively narrowed by several to ten and several nm than the physical processing width from opposite sides. Thus, by implantation of FIB source particles, such as Ga, a substantially narrower contact than the physical processing width can be made.

MR characteristics can be even improved by irradiating the current-throttling with an EB in order to anneal the crystal defect thereof.

While the present invention has been disclosed in terms of various embodiments in order to facilitate a better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A magnetic memory comprising:
    magnetoresistance effect element including:
    a first ferromagnetic reference layer being pinned in magnetization in a first direction;
    an insulating layer overlying the first ferromagnetic reference layer;
    a ferromagnetic recording layer overlying the insulating layer, the ferromagnetic recording layer being free in direction of magnetization, and at least one of a reading and a writing of magnetic information to the ferromagnetic recording layer being executable by flowing a current in a direction of its layer thickness;
    a nonmagnetic intermediate layer overlying the ferromagnetic recording layer; and
    a second ferromagnetic reference layer overlying the nonmagnetic intermediate layer and being pinned in magnetization in a second direction substantially opposite from the first direction,
    the insulating layer having a portion defining a through hole penetrating its thickness direction, the first ferromagnetic reference layer and the ferromagnetic recording layer being electrically coupled to each other via the through hole, and the through hole having an opening width no larger than 20 nm.

2. The magnetic memory according to claim 1, further comprising a pair of electrodes for supplying the current, the electrodes cover a major plane of the first ferromagnetic reference layer and the second ferromagnetic reference layer, and the through hole being provided between the electrodes.

3. The magnetic memory according to claim 1, wherein the direction of the magnetization of the ferromagnetic recording layer is substantially parallel or antiparallel to the first direction when the current is not flowing therethrough.

4. The magnetic memory according to claim 1, comprising a plurality of memory cells, the memory cells being two-dimensionally arranged, each of the memory cells being separated from each other by an insulating region, each of the memory cells having the magnetoresistance effect element.

5. The magnetic memory according to claim 4, further comprising a conductive probe, a relative positional relation between the memory cells and the probe being variable, the probe being configured to provide the current to each of the memory cells, an absolute value of a writing current provided to each of the memory cells being larger than an absolute value of a reading current provided to each of the memory cells.

6. The magnetic memory according to claim 1, further comprising a fixed wiring which is configured to provide the current to each of the memory cells, an absolute value of a writing current provided to each of the memory cells being larger than an absolute value of a reading current provided to each of the memory cells.

7. A magnetic memory comprising:
    magnetoresistance effect element including:
    a first ferromagnetic reference layer being pinned in magnetization in a first direction;
    an insulating layer overlying the first ferromagnetic reference layer;
    a ferromagnetic recording layer overlying the insulating layer, the ferromagnetic recording layer being free in direction of magnetization, and at least one of a reading and a writing of magnetic information to the ferromagnetic recording layer being executable by flowing a current in a direction of its layer thickness;
    a nonmagnetic intermediate layer overlying the ferromagnetic recording layer; and
    a second ferromagnetic reference layer overlying the nonmagnetic intermediate layer and being pinned in magnetization in the first direction,
    the insulating layer having a portion defining a through hole penetrating its thickness direction, the first ferromagnetic reference layer and the ferromagnetic recording layer being electrically coupled to each other via the through hole, and the through hole having an opening width not larger than 20 nm.

8. The magnetic memory according to claim 7, further comprising a pair of electrodes which is configured to supply the current, the electrodes cover a major plane of the first ferromagnetic reference layer and the second ferromagnetic reference layer, and the through hole being provided between the electrodes.

9. The magnetic memory according to claim 7, wherein the direction of the magnetization of the ferromagnetic recording layer is substantially parallel or antiparallel to the first direction when the current is not flowing therethrough.

10. The magnetic memory according to claim 7, comprising a plurality of memory cells, the memory cells being two-dimensionally arranged, each of the memory cells being separated from each other by an insulating region, each of the memory cells having the magnetoresistance effect element as set forth in claim 7.

11. The magnetic memory according to claim 10, further comprising a conductive probe, a relative positional relation between the memory cells and the probe being variable, the probe being configured to provide the current to each of the memory cells, an absolute value of a writing current provided to each of the memory cells being larger than an absolute value of a reading current provided to each of the memory cells.

12. The magnetic memory according to claim 10, further comprising a fixed wiring which is configured to provide the current to each of the memory cells, an absolute value of a writing current provided to each of the memory cells being larger than an absolute value of a reading current provided to each of the memory cells.

* * * * *